US007355885B2

(12) United States Patent
Fukuzumi

(10) Patent No.: US 7,355,885 B2
(45) Date of Patent: Apr. 8, 2008

(54) SEMICONDUCTOR MEMORY DEVICE WITH MAGNETORESISTANCE ELEMENTS AND METHOD OF WRITING DATE INTO THE SAME

(75) Inventor: Yoshiaki Fukuzumi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/430,891

(22) Filed: May 10, 2006

(65) Prior Publication Data
US 2006/0203540 A1    Sep. 14, 2006

Related U.S. Application Data

(63) Continuation of application No. 10/805,375, filed on Mar. 22, 2004, now abandoned.

(30) Foreign Application Priority Data
Aug. 14, 2003   (JP) .............................. 2003-207570

(51) Int. Cl.
*G11C 11/00*    (2006.01)
(52) U.S. Cl. ........................ 365/158; 365/173; 257/241
(58) Field of Classification Search ............ 365/158 O, 365/171, 173 X, 158, 173; 257/241 X, 241
See application file for complete search history.

(56) References Cited

U.S. PATENT DOCUMENTS 6,515,341 B2 *   2/2003   Engel et al. ................. 257/421
6,829,157 B2 *  12/2004   Kim et al. ................... 365/157

(Continued)

FOREIGN PATENT DOCUMENTS

GB      2 343 308 A    5/2000
JP      2001-156357    6/2001

(Continued)

OTHER PUBLICATIONS

Roy Scheuerlein, et al., "A 10ns Read and Write Non-Volatile Memory Array Using a Magnetic Tunnel Junction and FET Switch in Each Cell", ISSCC 2000, Session 7, TD: Emerging Memory & Device Technologies, Pater TA 7.2, pp. 128-129.

(Continued)

*Primary Examiner*—VanThu Nguyen
(74) *Attorney, Agent, or Firm*—Oblon, Spivak, McClelland, Maier & Neustadt, P.C.

(57) ABSTRACT

A semiconductor memory device includes memory cells, first wirings, a first current driver circuit, and a second current driver circuit. The memory cell includes a magneto-resistive element having a first ferromagnetic film, an insulating film formed on the first ferromagnetic film, and a second ferromagnetic film formed on the insulating film. The first wiring is provided in close proximity to and insulated from the magneto-resistive element. The first current driver circuit supplies a first current to the first wiring in a write operation to produce a magnetic field around the magneto-resistive elements. The second current driver circuit supplies a second current between the first and second ferromagnetic films via the insulating film in a write and a read operation.

3 Claims, 42 Drawing Sheets

U.S. PATENT DOCUMENTS

| | | |
|---|---|---|
| 6,980,468 B1 | 12/2005 | Ounadjela |
| 2002/0089874 A1 | 7/2002 | Nickel et al. |
| 2002/0105827 A1 | 8/2002 | Redon et al. |

FOREIGN PATENT DOCUMENTS

| | | |
|---|---|---|
| JP | 2002-8368 | 1/2002 |
| JP | 2003-60173 | 2/2003 |
| KR | 2001-0100953 | 11/2001 |

OTHER PUBLICATIONS

Masashige Sato, et at., "Spin-Valve-Like Properties of Perromagnetic Tunnel Junctions", Jpn. J. Appl. Phys., vol. 36, Part 2, No. 2B, Feb. 15, 1997, pp. L200-L201.

R.S. Beech, et al. "Curie Point Written Magnetoresistive Memory" Journal of Applied Physics, vol. 87, No. 9, May 1, 2000, pp. 6403-6405.

* cited by examiner

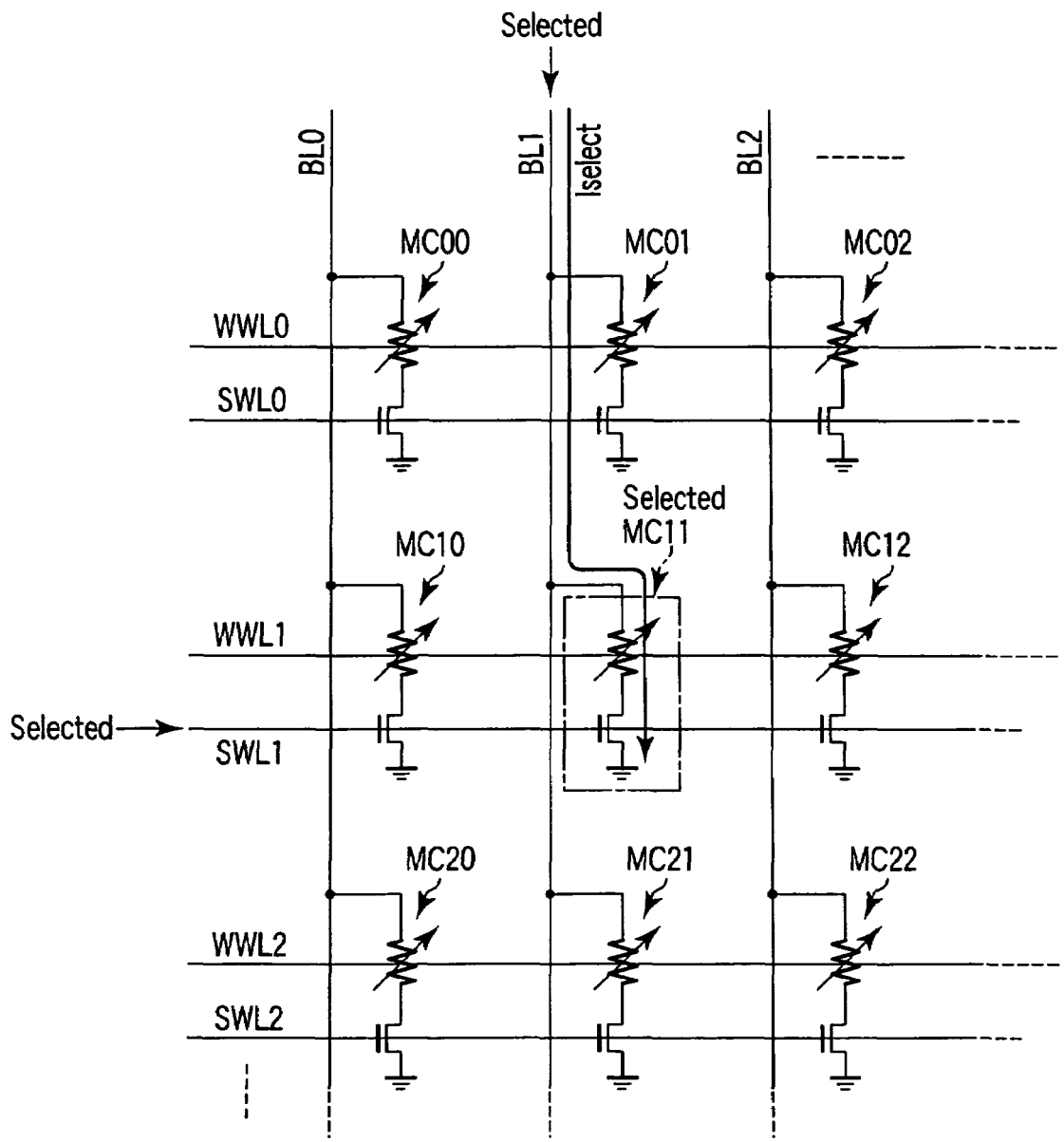
F I G. 5

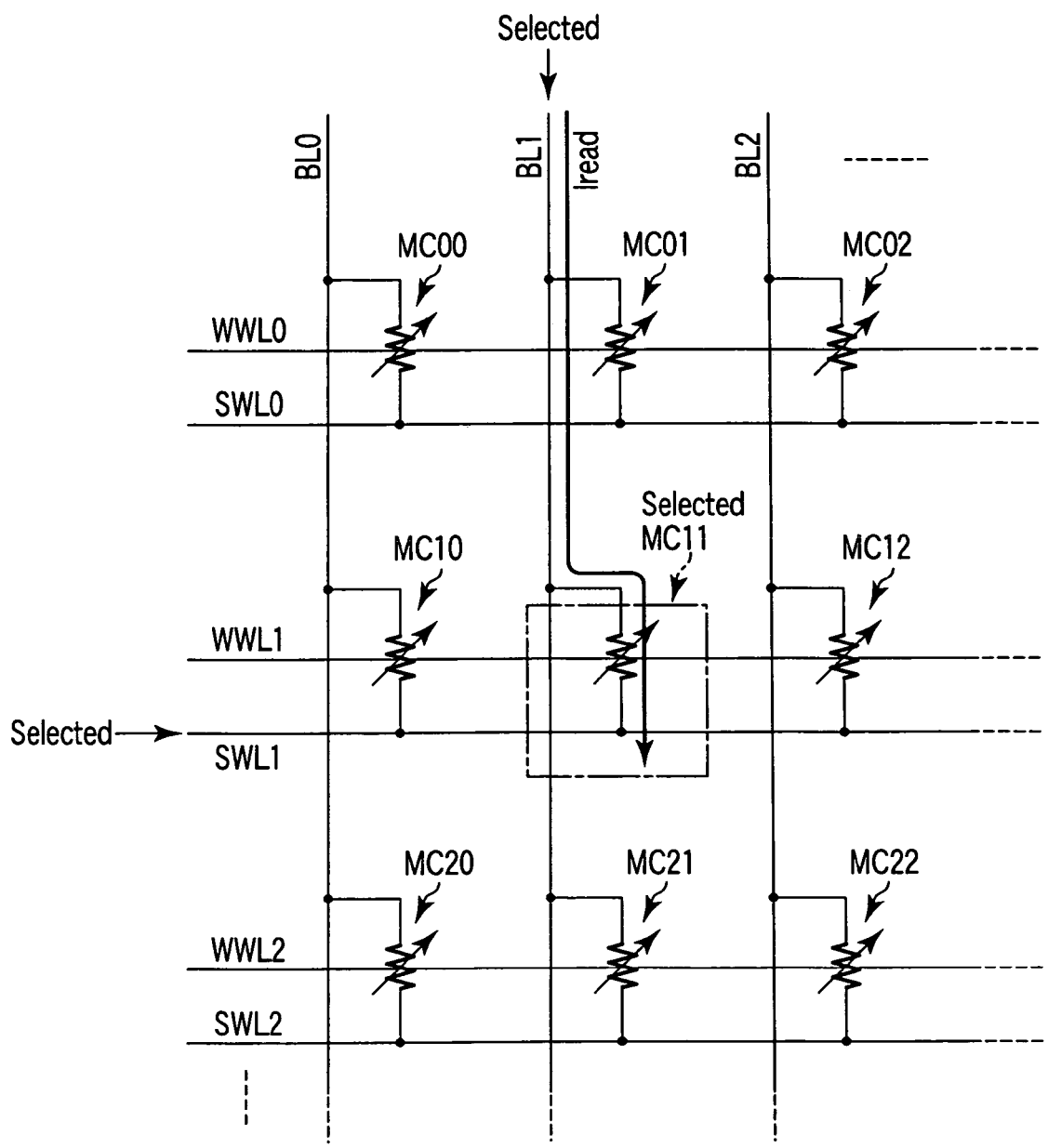
F I G. 23

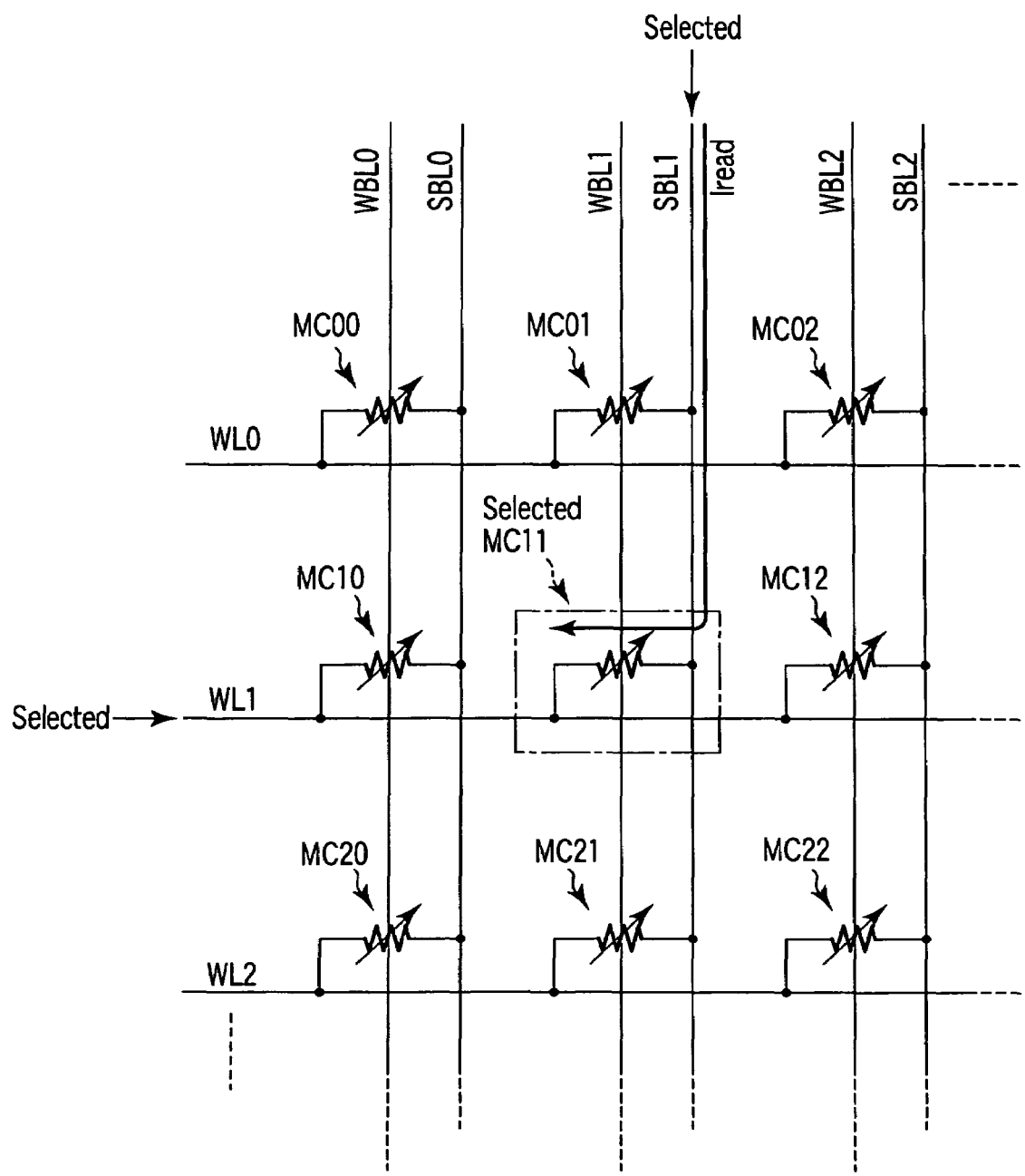
F I G. 30

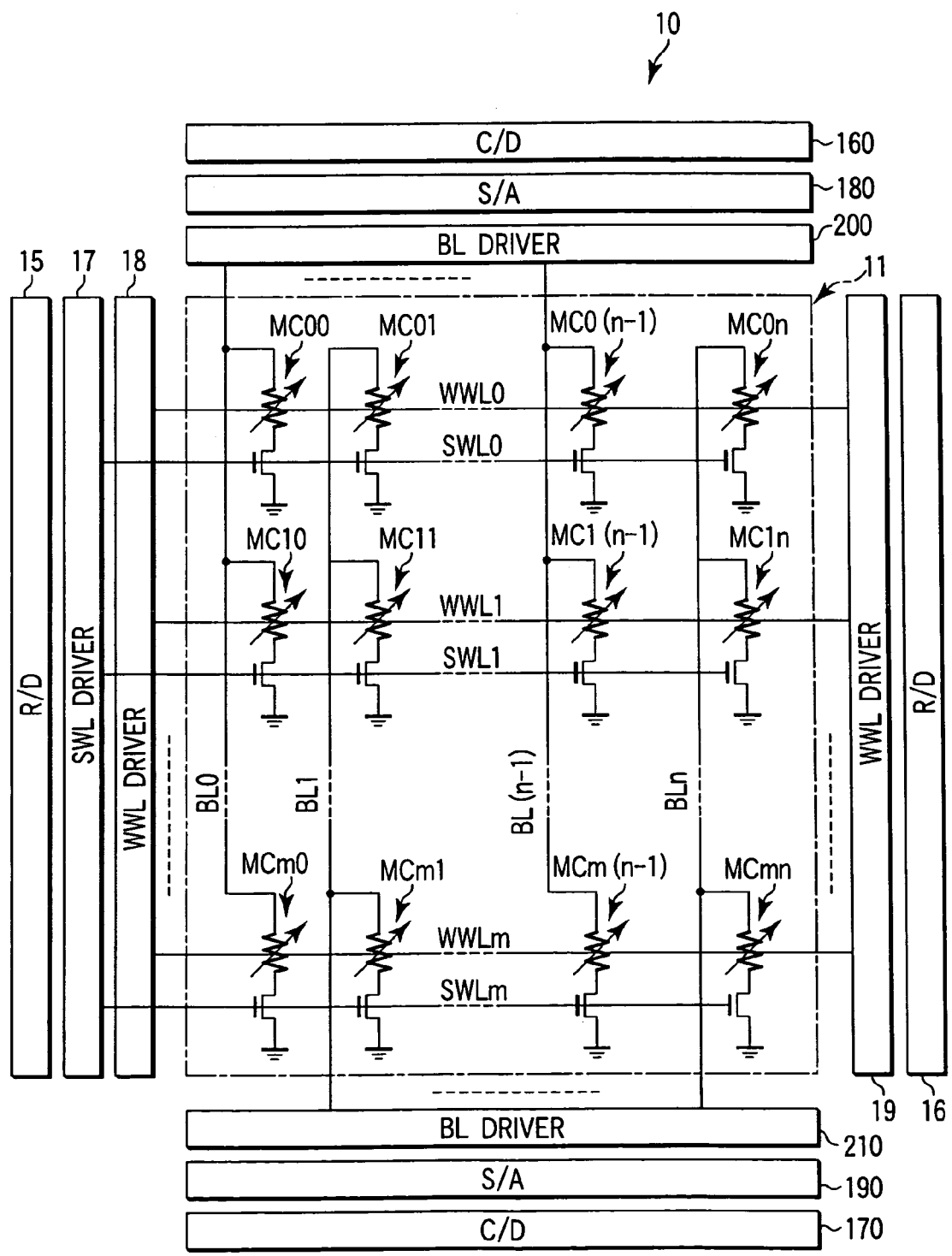
F I G. 47

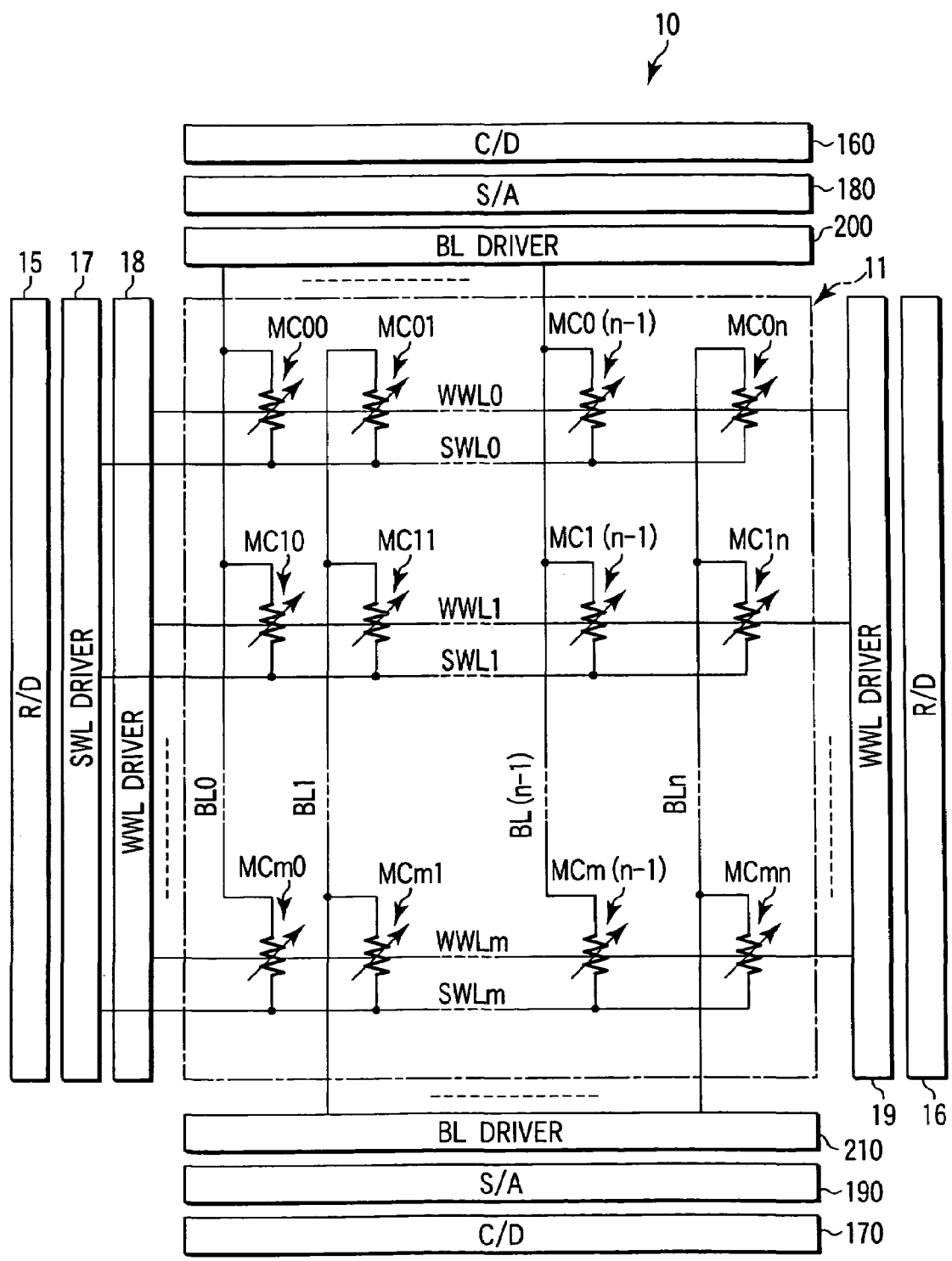
F I G. 48

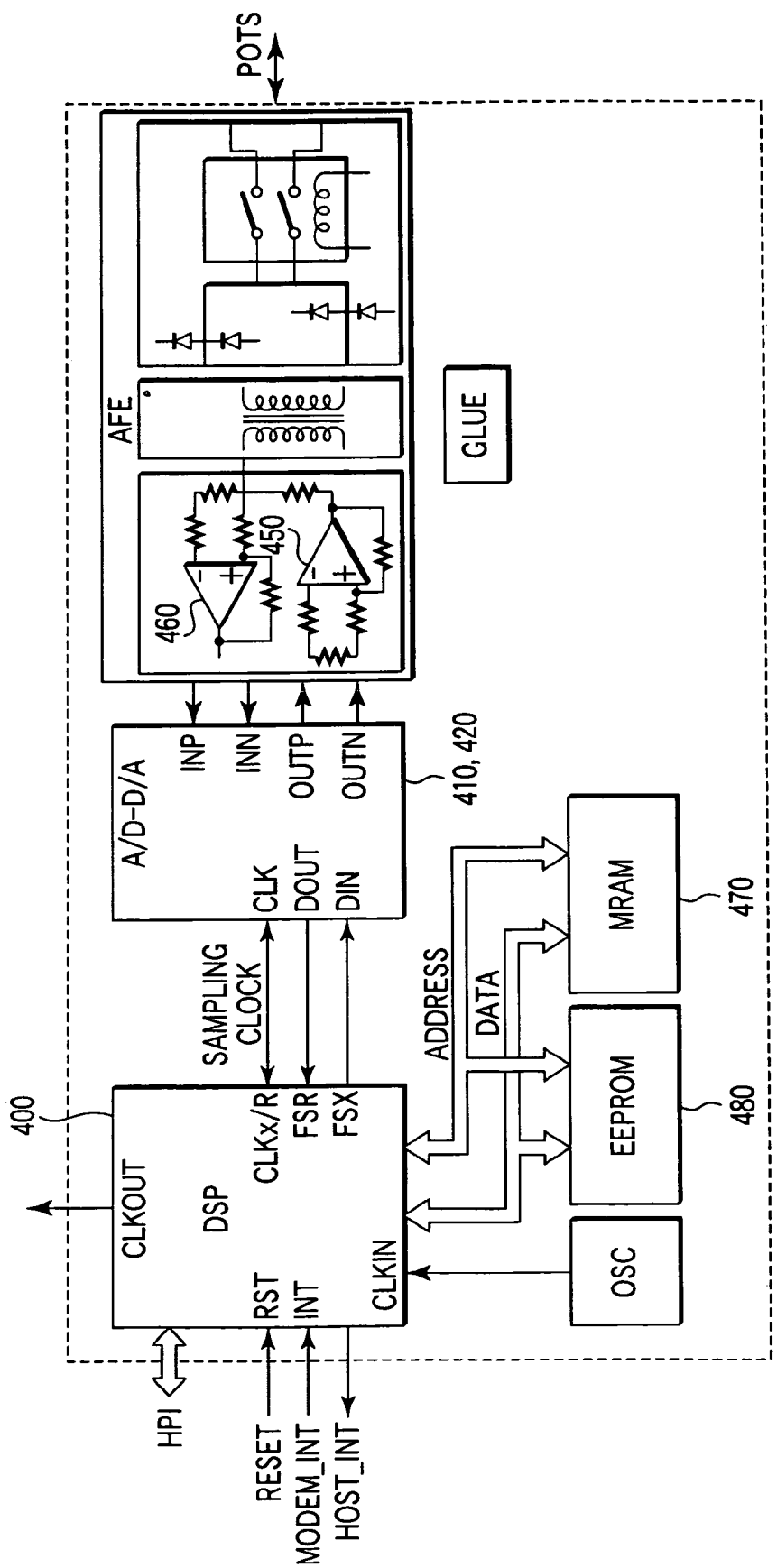
F I G. 53

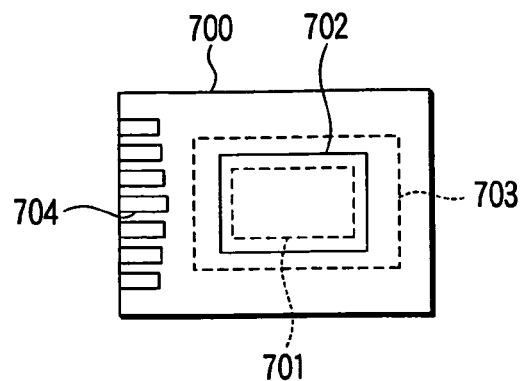
F I G. 55
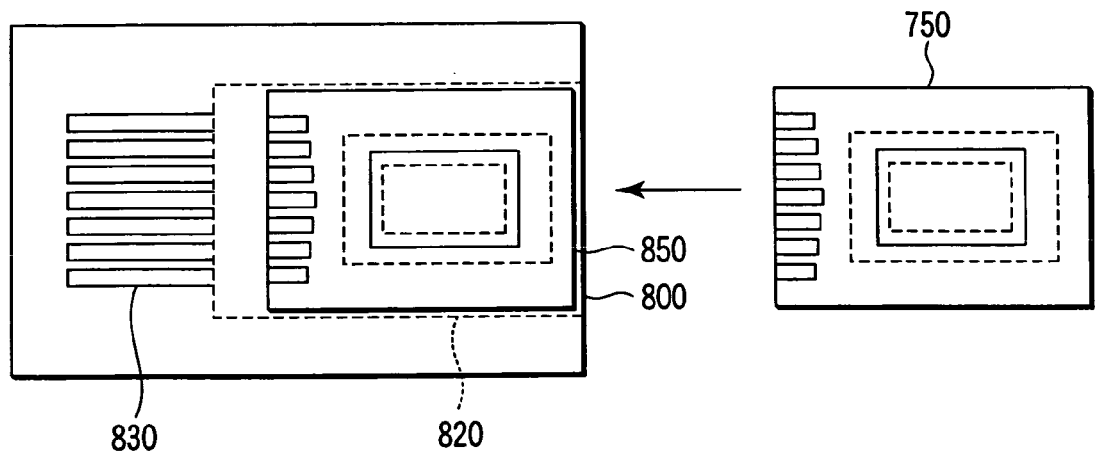
F I G. 56
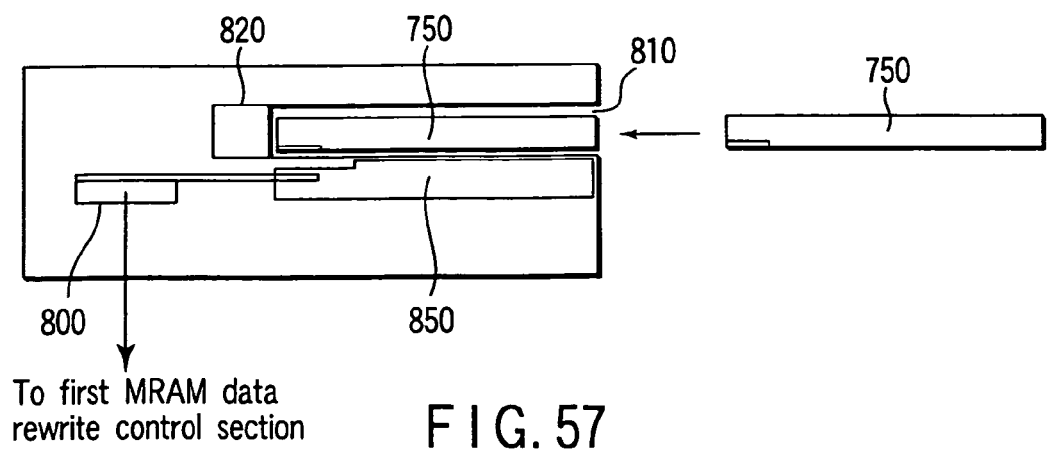
F I G. 57

SEMICONDUCTOR MEMORY DEVICE WITH MAGNETORESISTANCE ELEMENTS AND METHOD OF WRITING DATE INTO THE SAME

CROSS-REFERENCE TO RELATED APPLICATIONS

This application is a continuation of application Ser. No. 10/805,375, filed Mar. 22, 2004, and claims the benefit of priority from the prior Japanese Patent Application No. 2003-207570, filed Aug. 14, 2003, the entire contents of which are incorporated herein by reference.

BACKGROUND OF THE INVENTION

1. Field of the Invention

This invention relates to a semiconductor memory device and a method of writing data into the semi-conductor memory device. More particularly, this invention relates to a write operation in a magnetic random-access memory (MRAM).

2. Description of the Related Art

MRAM is the generic name for solid-state memories which use the magnetization direction of a ferro-magnetic material as an information recording carrier and can rewrite, hold, and read recorded information at any time.

MRAM memory cells generally have a structure where a plurality of ferromagnetic materials are stacked one on top of another. Information is recorded by causing whether the relative arrangement of magnetizations of a plurality of ferromagnetic materials forming a memory cell is parallel or anti-parallel to correspond to binary information "1" or "0." Recorded information is written by reversing the magnetization direction of the ferromagnetic material in each memory cell by a current magnetic field.

MRAM, which is completely nonvolatile, can be rewritten more than $10^{15}$ times. In addition, it enables nondestructive reading and therefore requires no refresh operation. Accordingly, the read cycle can be shortened. Moreover, it is more resistant to radiation than charge accumulation memory cells. As described above, MRAM has more advantages in function than conventional semiconductor memories using dielectrics. It is expected that the integration per unit area of MRAM and the write and read times are roughly the same as those of DRAM (Dynamic Random Access Memory). Thus, it is expected that MRAM will be applied to an external recording unit for portable devices, LSI embedded packages, or the main memory of a personal computer, taking full advantage of nonvolatility.

In the MRAM now on the way to practical use, a magnetic tunnel junction (hereinafter, abbreviated as MTJ) is used for memory cells. MTJ has been disclosed in, for example, "IEEE International Solid-State Circuits Conference 2000 Digest Paper," TA7.2. MTJ is made up of a three-layer film, composed mainly of a ferromagnetic layer/an insulating layer/a ferromagnetic layer. Current tunnels through the insulating films. The resistance value of the junction varies in proportion to the cosine of a relative angle of the magnetization of both ferromagnetic metal layers. Then, the resistance value of the junction takes the maximal value when the directions of magnetizations of both ferromagnetic layers are anti-parallel. This is a tunnel magneto-resistive effect. One type of MTJ structure is to hold data, making use of the difference in retentivity between the two ferromagnetic materials. Another known type of MTJ is a spin valve structure type which is such that antiferromagnetic material is provided next to one ferromagnetic material to fix the magnetization direction to improve the magnetic field sensitivity or reduce the write current. The spin valve structure has been disclosed in, for example, "Japanese Journal of Applied Physics," Vol. 36, 1997, p. 200.

In the conventional MRAM, an MTJ element is provided at the intersection of two wires crossing at right angles. Then, a current of about 1 mA is caused to flow in the two wires. With the resultant one of the magnetic fields generated by the wires, the data is written into the MTJ element.

Another known method is to write data into a GMR element by causing current to flow in two wires crossing at right angles, while raising the temperature of the free layer in the GMR element using FeMn as a material for a free layer. This method has been disclosed in, for example, "Journal of Applied Physics," Vol. 87, 2000, p. 6403. In this method, current of about 5 mA is caused to flow in a sense line, which raises the temperature of the free layer to the Neel temperature or higher. Then, FeMn, an antiferromagnetic material, is transformed so as to have ferromagnetic-state. In this state, current of about 200 mA is caused to flow in a word line. As a result, the magnetic fields produced by the sense line and word line reverse the direction of spin of the free layer, thereby writing the data into the GMR element.

As described above, tremendous research effort has been directed toward using MRAM as one of the new generation of memory devices. The conventional MRAM, however, has the problem of getting larger in chip size.

BRIEF SUMMARY OF THE INVENTION

A semiconductor memory device according to an aspect of the present invention comprises:

memory cells each of which includes a magneto-resistive element having a first ferromagnetic film, an insulating film formed on the first ferromagnetic film, and a second ferromagnetic film formed on the insulating film;

first wirings each of which is provided in close proximity to and insulated from the magneto-resistive element;

a first current driver circuit which supplies a first current to the first wiring in a write operation to produce a magnetic field around the magneto-resistive elements; and a second current driver circuit which supplies a second current between the first and second ferromagnetic films via the insulating film in a write and a read operation.

A method of writing data into a semiconductor memory device including memory cells arranged in matrix, the memory cell having a magneto-resistive element which includes a first ferromagnetic film, an insulating film formed on the first ferromagnetic film, and a second ferromagnetic film formed on the insulating film, the method comprises:

causing a first current to flow, via the insulating film, between the first and second ferromagnetic films of the magneto-resistive element included in a first selected memory cell;

applying a magnetic field to the magneto-resistive element by causing a second current to flow in a wiring provided in the vicinity of the magneto-resistive element, with the first current flowing in the magneto-resistive element of the first selected memory cell;

stopping the supply of the first current; and stopping the supply of the second current after the supply of the first current is stopped.

BRIEF DESCRIPTION OF THE SEVERAL VIEWS OF THE DRAWING

FIG. 5 is a circuit diagram of a memory cell array in a write operation in the MRAM according to the first embodiment;

FIG. 23 is a circuit diagram of the memory cell array in a read operation in the MRAM according to the third embodiment;

FIG. 30 is a circuit diagram of the memory cell array in a read operation in the MRAM according to the fourth embodiment;

FIG. 47 is a block diagram of an MRAM according to a tenth embodiment of the present invention;

FIG. 48 is a block diagram of an MRAM according to a first modification of the tenth embodiment;

FIG. 53 is a block diagram of a modem provided with an MRAM according to the first to eleventh embodiments;

FIG. 55 is a block diagram of a card provided with an MRAM according to the first to eleventh embodiments;

FIG. 56 is a top view of a transfer unit for transferring the data in a card provided with an MRAM according to the first to eleventh embodiments;

FIG. 57 is a sectional view of a transfer unit for transferring the data in a card provided with an MRAM according to the first to eleventh embodiments;

DETAILED DESCRIPTION OF THE INVENTION

Figure 1:
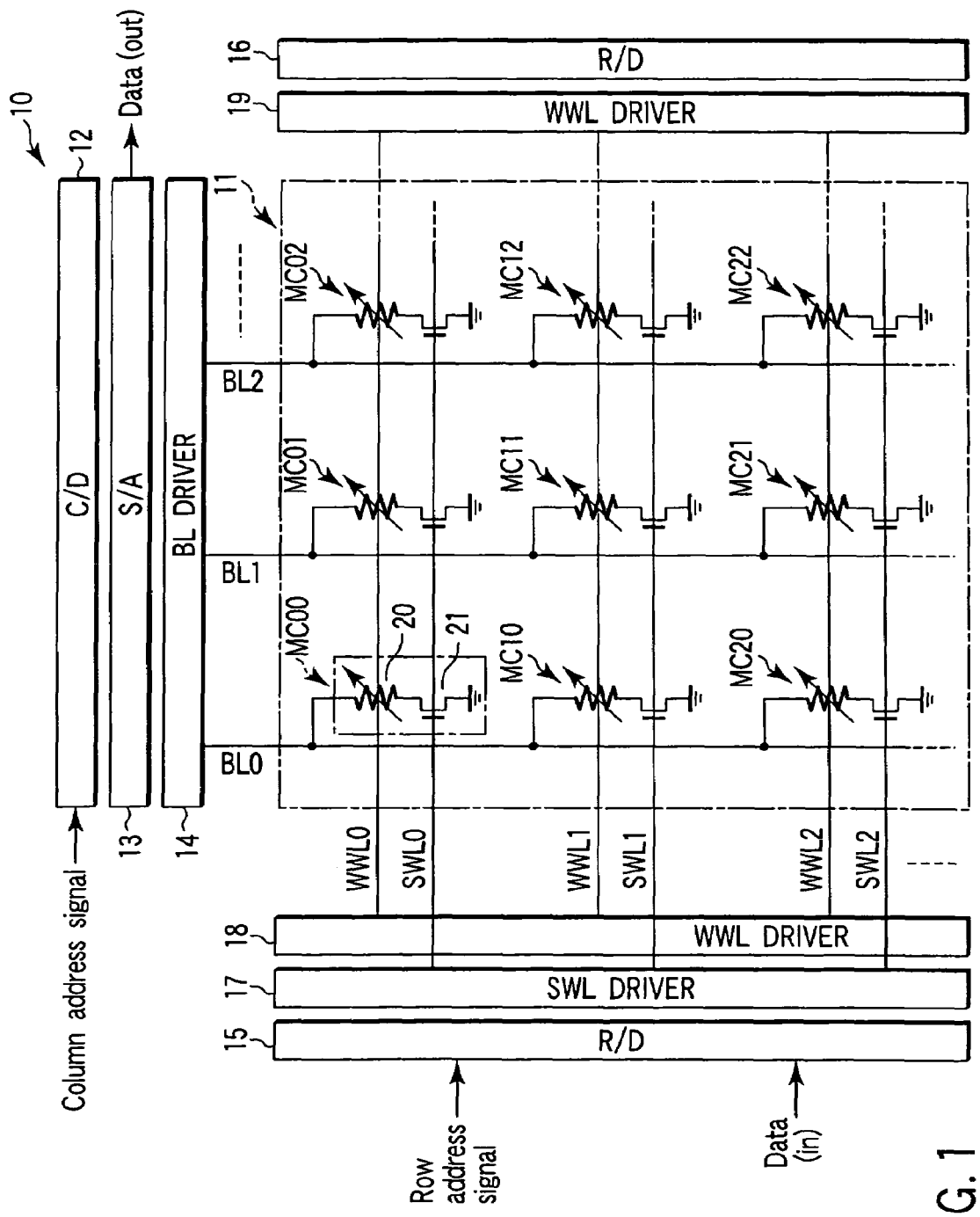
FIG. 1 is a block diagram of an MRAM according to a first embodiment of the present invention.

A semiconductor memory device according to a first embodiment of the present invention will be explained by reference to FIG. 1. FIG. 1 is a block diagram of an MRAM according to the first embodiment.

As shown in FIG. 1, an MRAM 10 comprises a memory cell array 11, a column decoder 12, a sense amplifier 13, a bit line driver 14, row decoders 15, 16, a select word line driver 17, and write word line drivers 18, 19.

The memory cell array 11 has a plurality of ((m+1)×(n+1)) memory cells MCs arranged in a matrix (m and n are natural numbers). In FIG. 1, only (3×3) memory cells MCs are shown. Each of the memory cells MCs includes a magneto-resistive element 20 and a switching transistor 21. The magneto-resistive element 20 is, for example, an MTJ element. One end of the magneto-resistive element 20 is connected to any one of bit lines BL0 to BLn. The other end of the magneto-resistive element 20 is connected to one end of the current path of the switching transistor 21. The gate of the switching transistor 21 is connected to any one of select word lines SWL0 to SWLm. The other end of the current path is connected to the ground potential. Any one of write word lines WWL0 to WWLm is provided in close proximity to the magneto-resistive element 20. The gates of the switching transistors 21 of the memory cells arranged in a same row are connected in common to any one of the select word lines SWL0 to SWLm. In the vicinity of the magneto-resistive elements 20 of the memory cells arranged in a same row, any one of the write word lines WWL0 to WWLm is laid. One end of the magneto-resistive element 20 of each of the memory cells arranged in a same column is connected in common to any one of the bit lines BL0 to BLn. The write word lines WWL0 to WWLm and the bit line BL0 to BLn are arranged so as to cross at right angles.

The column decoder 12 decodes a column address signal, thereby producing a column address decode signal.

The bit line driver 14 selects any of the bit lines BL0 to BLn on the basis of the column address decode signal in a write operation and in a read operation. Then, it supplies current to the selected bit line.

The row decoders 15, 16 decode a row address signal, thereby producing a row address decode signal.

The select word line driver 17, which includes a voltage source, selects any one of the select word lines SWL0 to SWLm on the basis of the row address decode signal in a write operation and in a read operation. Then, it supplies a voltage to the selected select word line.

The write word line drivers 18, 19 select any one of the write word lines WWL0 to WWLm on the basis of the row address decode signal in a write operation. Then, one of the write word line drivers 18, 19 functions as a current source and supplies current to the selected write word line. At this time, the other functions as a current sink. Either the write word line drivers 18 or 19 supplies current, which enables control of the data to be written into a memory cell.

The sense amplifier 13 amplifies the data read from the memory cell selected by the row decoders 15, 16 and column decoder 12.

Figure 2:
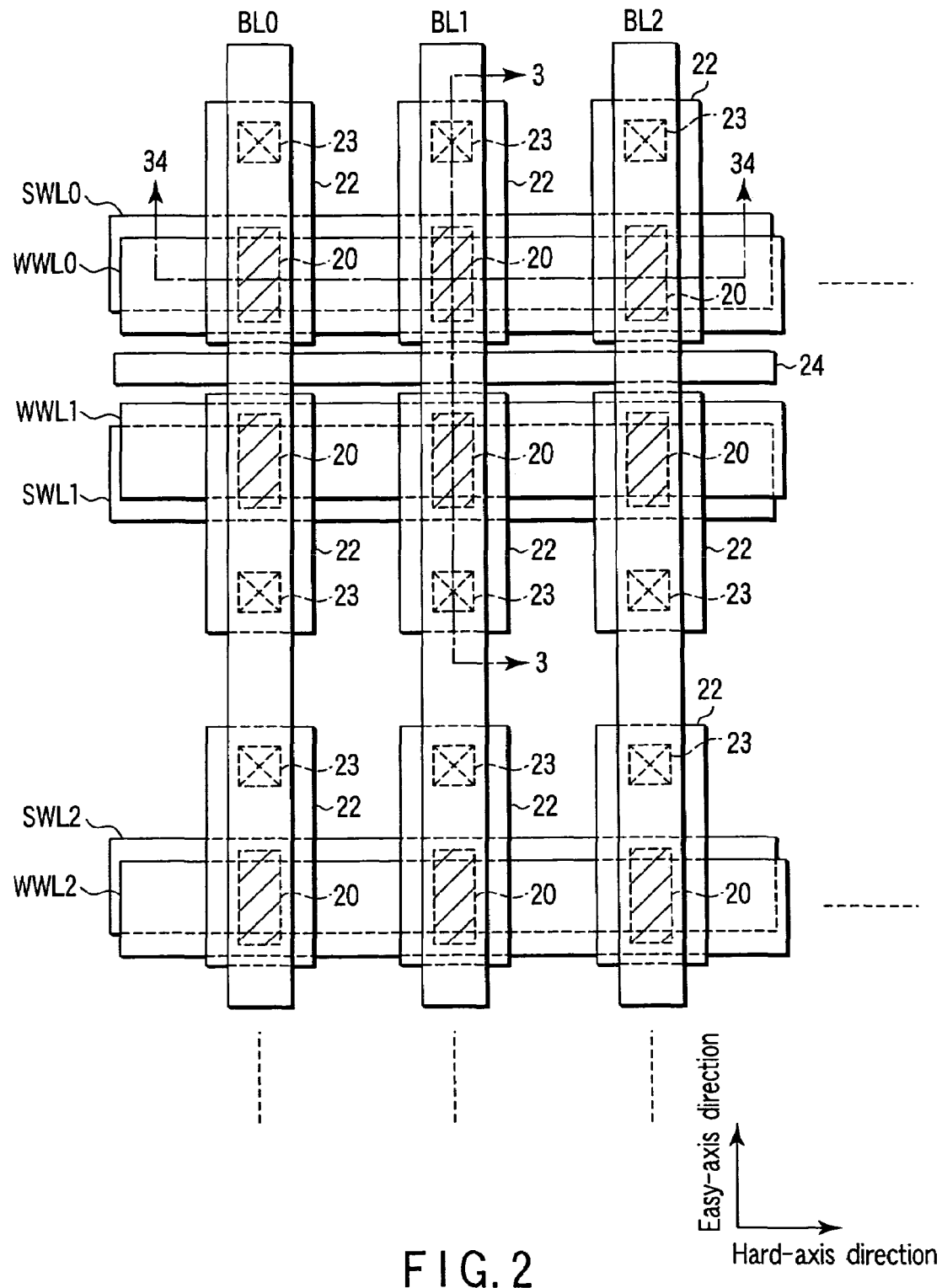
FIG. 2 is a plan view of the MRAM according to the first embodiment.

Next, a plane pattern of the memory cell array 11 will be explained by reference to FIG. 2. FIG. 2 is a plan view of the memory cell array 11. For the sake of simplification, the switching transistors are not shown in FIG. 2. The directions shown in FIG. 2 are defined as a hard-axis direction and an easy-axis direction.

As shown in FIG. 2, (1+n) bit lines BL0 to BLn are formed in the hard-axis direction into stripe-shaped lines extending in the easy-axis direction (in FIG. 2, only bit lines BL0 to BL2 are shown). In the easy-axis direction perpendicular to the hard-axis direction, (1+m) write word lines WWL0 to WWLm are formed into stripe-shaped lines in the hard-axis direction (in FIG. 2, only word lines WWL0 to WWL2 are shown). Then, magneto-resistive elements 20 are provided at the intersections of the bit lines BL0 to BLn and the write word lines WWL0 to WWLm. Each of the bit lines BL0 to BLn is connected to one end of the corresponding magneto-resistive element 20. On the other hand, the write word lines WWL0 to WWLm are provided in close proximity to the magneto-resistive elements 20, while being isolated electrically from the latter. Right under the write word lines WWL0 to WWLm, the select word lines SWL0 to SWLm are formed along the easy-axis into stripe-shaped lines in the hard-axis direction. The select word lines SWL0 to SWLm function as the gate electrodes of the switching transistors 21. The other end of the magneto-resistive element 20 is connected electrically to the drain of the corresponding switching transistor 21 via a withdrawing wiring layer 22 and a contact plug 23. Then, between the adjacent select word lines SWL0 to SWLm, each source line 24 is provided along the hard-axis so as to connect the sources of the switching transistors 21 in a same column in common.

The magneto-resistive element 20 is shaped almost like a rectangle which has its longitudinal direction along the easy-axis and its lateral direction along the hard-axis. Then, the other end of the magneto-resistive element 20 is connected to the corresponding switching transistor 21. Although the magneto-resistive element 20 is rectangular in FIG. 2, it may have an elliptical shape which has its major axis along the easy-axis and its minor axis along the hard-axis.

Figure 3:
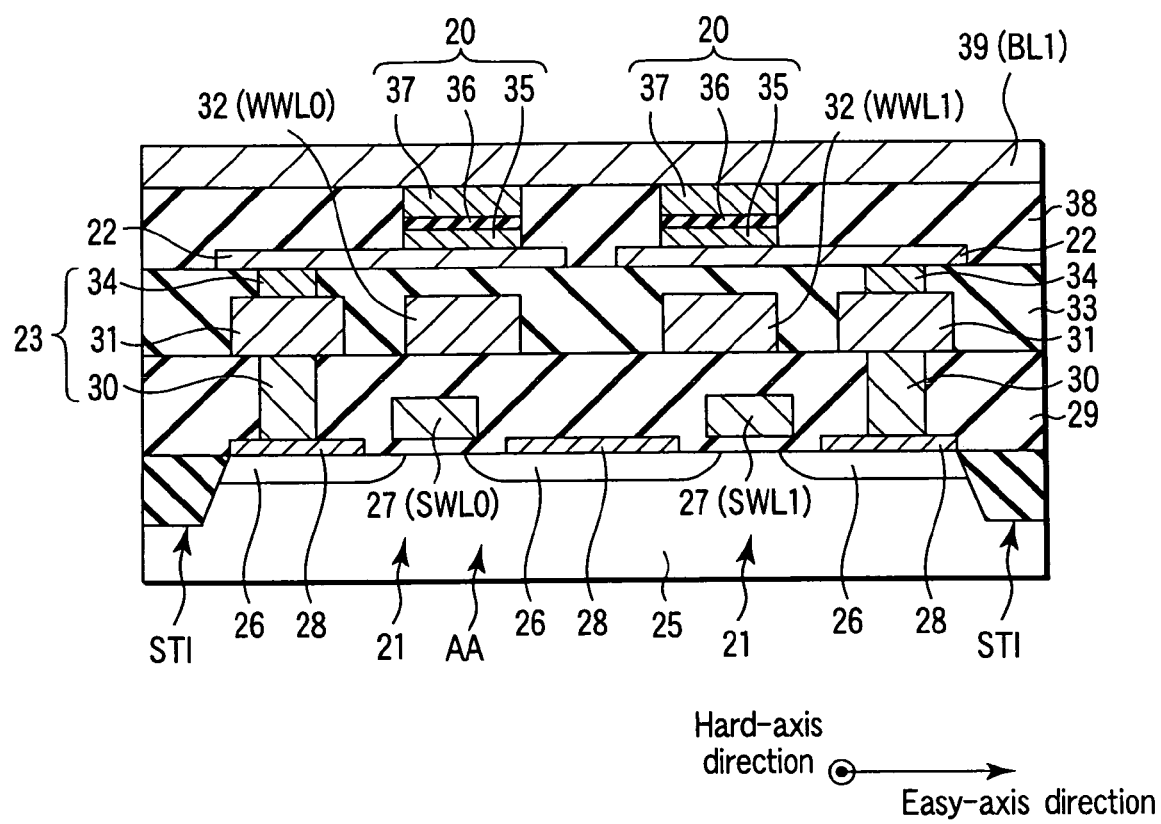
FIG. 3 is a sectional view taken along line 3-3 of FIG. 2.

Next, a sectional structure of the memory cell array 11 will be explained by reference to FIG. 3. FIG. 3 is a sectional view taken along line 3-3 of FIG. 2.

As show in FIG. 3, element isolating regions STIs are formed in a semiconductor substrate 25. Switching transistors 21 are formed in element regions AA enclosed by the element isolating regions STIs. Each of the switching transistors 21 includes impurity diffused layers 26 formed at the surface of the semiconductor substrate 25, a gate insulating film (not shown), and a gate electrode 27. As described above, the gate electrode 27, which functions as any one of the select word lines SWL0 to SWLm, is formed into a stripe-shaped line in the hard-axis direction (perpendicular to the drawing sheet).

A silicide film 28 is formed on the impurity diffused layers 26. An interlayer insulating film 29 is formed on the semiconductor substrate 25. The silicide film 28 on the source region 26, which functions as a source line, is formed into a stripe-shaped line in the hard-axis direction (perpendicular to the drawing sheet). The switching transistors 29 are covered with the interlayer insulating film 29. In the interlayer insulating film 29, contact plugs 30 are formed. Each of the contact plugs 20 is connected to one (drain region) of the impurity diffused layers 26 of the corresponding switching transistor 21.

Metal wiring layers 31 connected to the contact plugs 30 and metal wiring layers 32 electrically isolated from the metal wiring layers 31 are formed on the interlayer insulating film 29. Each of the metal wiring layers 32 functions as any one of the write word lines WWL0 to WWLm. The metal wiring layers 32 are formed into stripe-shaped lines in the hard-axis direction. In addition, each of the metal wiring layers 32 is formed so as to overlap almost with the gate electrode 27 of the corresponding switching transistor 21. Furthermore, an interlayer insulating film 33 is formed on the interlayer insulating film 29. The interlayer insulating film 33 covers the metal wiring layers 31, 32. Contact plugs 34 are formed in the interlayer insulting film 33. The contact plugs 34 are connected to the metal wiring layers 31.

Metal wiring layers 22 connected to the contact plugs 34 are formed on the interlayer insulating film 33. The metal wiring layer 22 functions as withdrawing wiring layer 22 for the magneto-resistive element 20. The magneto-resistive elements 20 are formed on the withdrawing wiring layer 22. The magneto-resistive elements 20 are formed so as to overlap with the metal wiring layers 32, with the corresponding interlayer insulating film 33 and withdrawing wiring layer 22 between the element 20 and the layer 32. The magneto-resistive elements 20 are, for example, MTJ elements. An MTJ element is such that an insulating film is sandwiched between magnetic films. Specifically, a ferromagnetic layer 35 is formed on the withdrawing wiring layer 22. An insulating film (tunnel barrier films) 36 is formed on the ferromagnetic layers 35. A ferromagnetic layer 37 is formed on the insulating film 36. An MTJ element is formed, including the ferromagnetic layers 35, 37 and insulating film 36. The direction of spin in one of the ferromagnetic layers 35, 37 (or pinning layer 35) is set beforehand so as to point in a specific direction. In this state, the direction of spin in the other of the ferromagnetic layers 35, 37 (or free layer 37) is made parallel or nonparallel to the spin in one of the ferromagnetic layers 35, 37, thereby producing two states, which enables "0" data or "1" data to be written. Furthermore, an interlayer insulating film 38 is formed on the interlayer insulating film 33. The interlayer insulating film 38 covers the withdrawing wiring layer 22 and the peripheries of the magneto-resistive elements 20. A metal wiring layer 39 is formed on the interlayer insulating film 38, so as to connect with the ferromagnetic layers 37. The metal wiring layer 39, functions as one of the bit lines BL0 to BLn, is formed into a stripe-shaped line in the easy-axis direction (or in the right-to-left direction on the drawing sheet).

Figure 4:
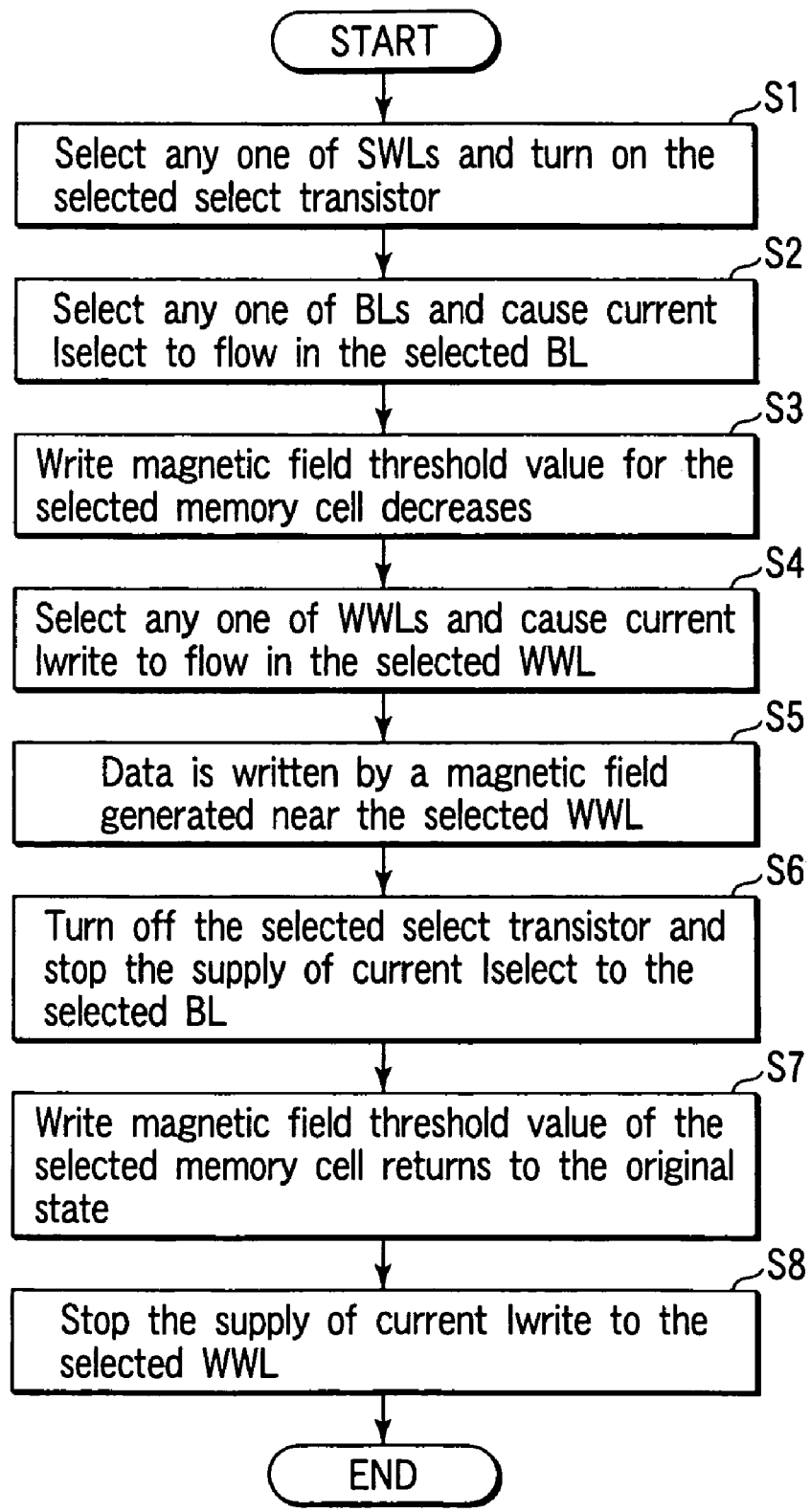
FIG. 4 is a flowchart for a method of writing data into the MRAM according to the first embodiment.

Next, the operation of the MRAM configured as described above will be explained by reference to FIGS. 1 and 4. A write operation will be explained using a case where data is written into memory cell MC11 provided at the intersection of bit line BL1 and select word line-SWL1 (write word line WWL1). FIG. 4 is a flowchart for a write operation in the MRAM of the first embodiment.

First, the select word line driver 17 selects select word line SWL1 on the basis of a row address decode signal. Then, the select word line driver 17 supplies a voltage to select word line SWL1. This brings the switching transistors 21 of the memory cells MC10, MC11, MC12, . . . , MC1$n$ into the on state (step S1).

Next, the bit line driver 14 selects bit line BL1 on the basis of a column address decode signal. Then, the bit line driver 14 supplies a current Iselect of about 10 μA to bit line BL1 (step S2). This is shown in FIG. 5. FIG. 5 is a circuit diagram of a part of the memory cell array 11.

As shown in FIG. 5, with select word line SWL1 being selected, current Iselect is supplied to bit line BL1. One end of each of the bit lines BL0 to BLn is connected to the bit line driver 14. The other ends of the bit lines BL0 to BLn are connected to the magneto-resistive elements 20 of the memory cells MCm0 to MCmn or brought into the floating state. Thus, current Iselect passes through the magneto-resistive element 20 of memory cell MC11 and the current path of the switching transistor 21 and flows into the ground potential.

Then, in the magneto-resistive element 20 of memory cell MC11, since current flows between the ferromagnetic layers via the insulating film, which generates Joule heat. As a result, the magneto-resistive element 20 goes into a high temperature state, leading to a decrease in the write magnetic field (current) threshold value (step S3).

Figure 6:
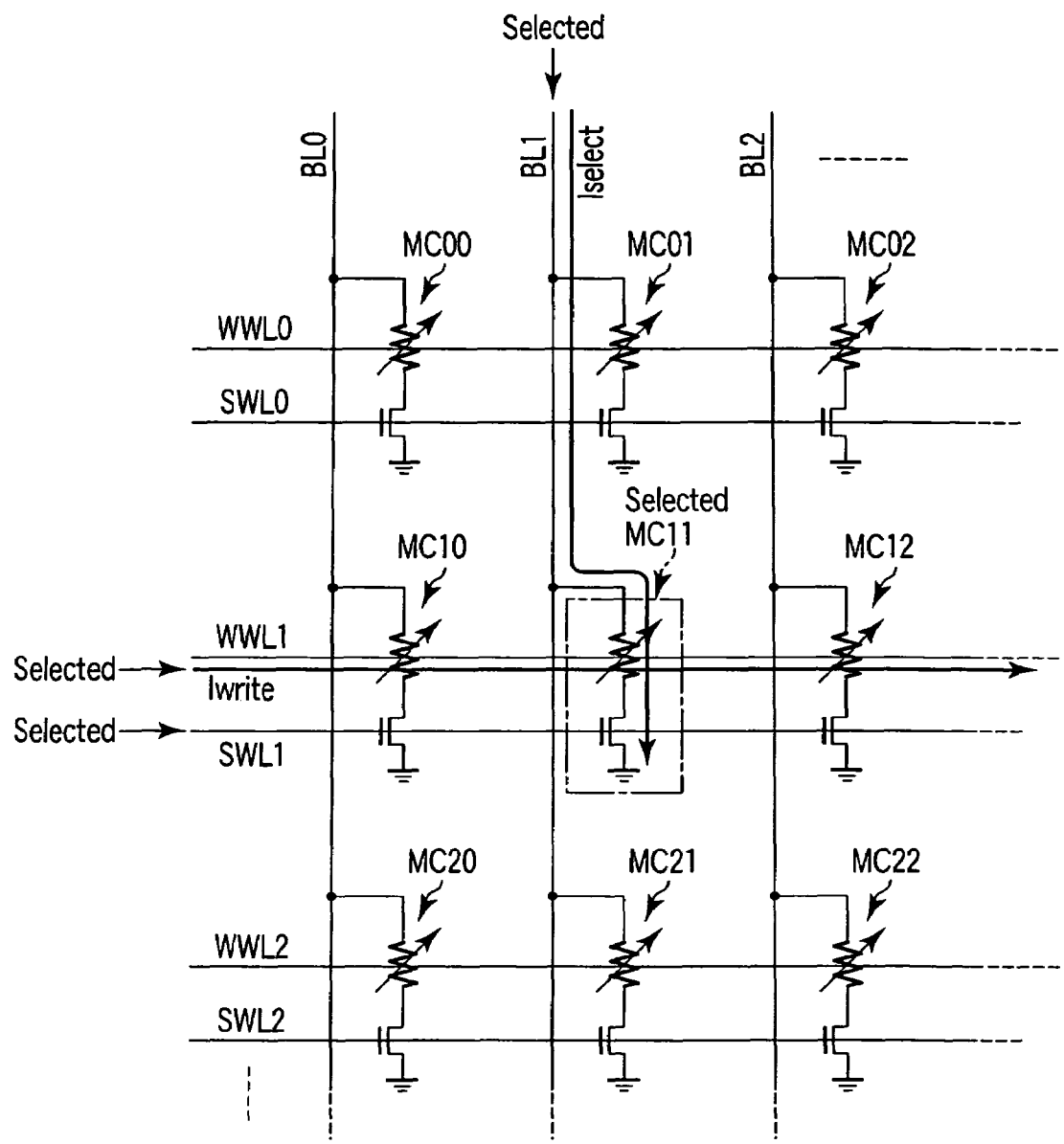
FIG. 6 is a circuit diagram of the memory cell array in a write operation in the MRAM according to the first embodiment.

Next, the write word line drivers 18, 19 select write word line WWL1 on the basis of a row address decode signal. Then, the write word line driver 18 supplies a current Iwrite of about 500 μA to write word line WWL1 (step S4). Current Iwrite passes through write word line WWL1 and flows into the word line driver 19. At this time, the write word line driver 18 functions as a current source and the write word line driver 19 functions as a current sink. This is shown in FIG. 6. FIG. 6 is a circuit diagram of a part of the memory cell array 11.

As shown in FIG. 6, with current Iselect flowing in the magneto-resistive element 20 of memory cell MC11, current Iwrite is caused to flow in write word line WWL1. Then, a magnetic field is generated around write word line WWL1. Because of the influence of the magnetic field, data is written into the magneto-resistive element 20 of memory cell MC11 (step S5). The first embodiment has been explained using the case where current Iwrite is caused to flow from the write word line driver 18 to the write word line driver 19. Of course, current Iwrite may be caused to flow from the write word line driver 19 to the write word line driver 18. That is, the direction of current Iwrite depends on data to be written.

Thereafter, select word line SWL1 is made unselected and the switching transistor 21 of memory cell MC11 is turned off. Then, bit line BL1 is made unselected and the supply of current Iselect is stopped (step S6).

Stopping the supply of current Iselect cools the magneto-resistive element 20 of memory cell MC11 from the high temperature state. After the magneto-resistive element 20 is cooled from the high temperature, the write magnetic field threshold value of the magneto-resistive element 20 returns to the original value (step S7). The heat in the magneto-resistive element 20 is dissipated mainly through bit line BL1.

Then, write word line WWL1 is made unselected and the supply of current Iwrite is stopped (step S8).

As described above, the data is written.

Figure 7:
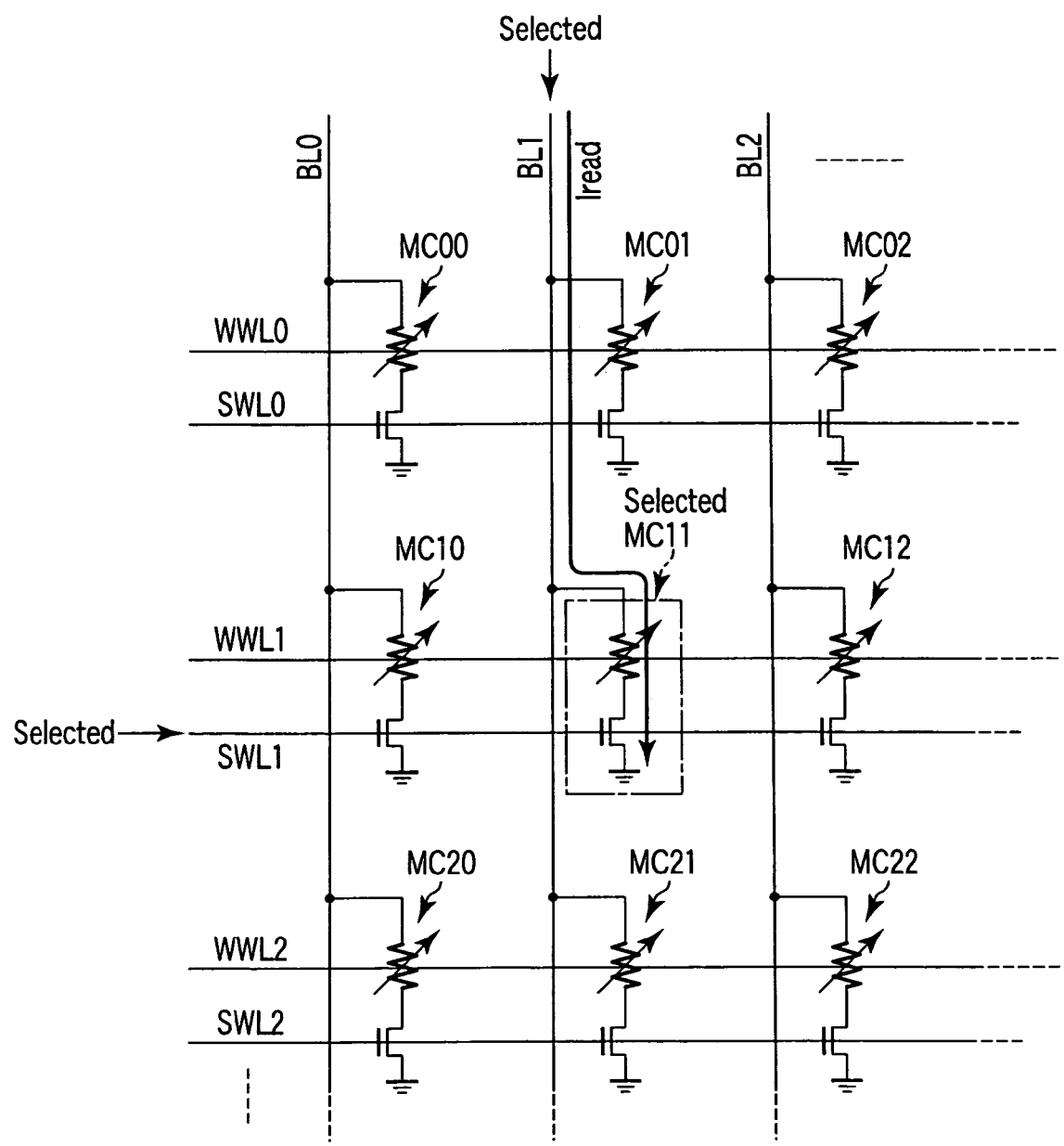
FIG. 7 is a circuit diagram of the memory cell array in a read operation in the MRAM according to the first embodiment.

Next, a read operation will be explained using a case where the data is read from memory cell MC11. Since a method of reading the data is almost the same as a conventional one, it will be explained briefly. FIG. 7 is a circuit diagram of a part of the memory cell array 11 in reading the data.

As shown in FIG. 7, the select word line driver 17 selects select word line SWL1, which brings the switching transistors 21 of the memory cells MC10, MC11, MC12, . . . , MC1n into the on state. The bit line driver 14 selects bit line BL1, which allows current Iread to be supplied to bit line BL1. Then, the sense amplifier 13 amplifies a change in the potential on bit line BL1 and outputs the amplified potential as a read-out voltage.

The MRAM of the first embodiment produces the effects described below.

(1) The chip size is reduced. This will be explained in detail below.

Figure 8:
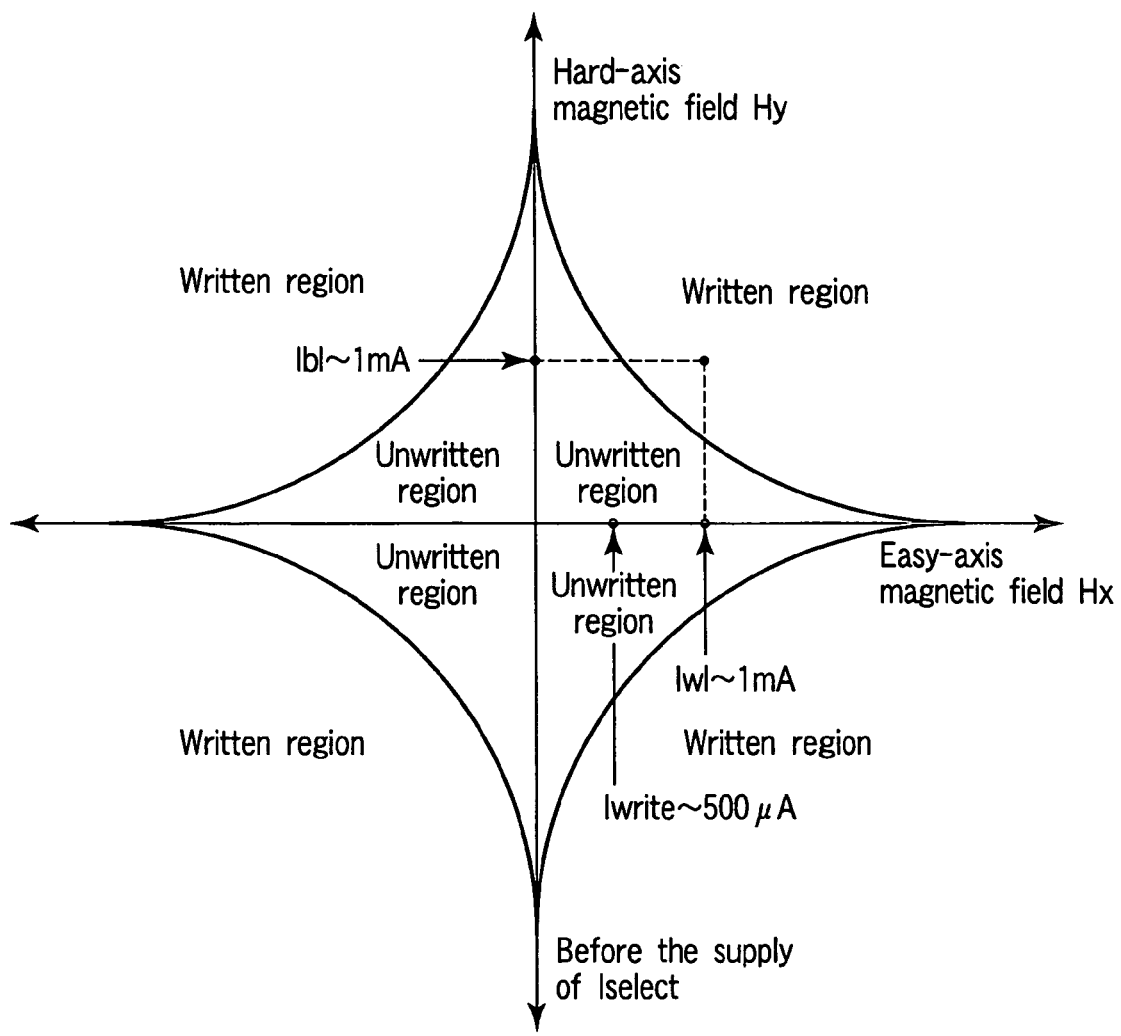
FIG. 8 is a graph showing an asteroid curve of a magneto-resistive element provided in the MRAM according to the first embodiment.

This effect is obtained by decreasing the write threshold value for the magneto-resistive element 20. In the case of a conventional MRAM, the data is written by the resultant magnetic field generated by current supplied to two wiring lines crossing at right angles. FIG. 8 is a graph (of an asteroid curve) showing the threshold values of a magneto-resistive element. The abscissa axis indicates the easy-axis magnetic field Hx and the ordinate axis indicates the hard-axis magnetic field Hy. A generated magnetic field depends on current. Thus, the easy-axis magnetic field Hx and the hard-axis magnetic field Hy may be replaced with current caused to flow in bit lines and word lines in a conventional MRAM. A write threshold value Hs can be derived from the following Stoner-Wolfarth equation:

$$Hx^{(2/3)}+Hy^{(2/3)}=Hs^{(2/3)}$$

Then, when $Hx^{(2/3)}+Hy^{(2/3)}>Hs^{(2/3)}$ is satisfied, the direction of spin in the magneto-resistive element changes, which writes the data into the element. That is, the individual regions in FIG. 8 become written reigns and unwritten regions.

As shown in FIG. 8, in the prior art, a current Ibl of about 1 mA is caused to flow in a bit line and a current Iwl of about 1 mA is caused to flow in a word line. Then, the data is written by the resultant magnetic field produced by the two currents Ibl, Iwl. Consequently, writing the data requires a current of about 1 mA×2=about 2 mA.

In contrast, with the method of the first embodiment, while a tunnel current of about 100 µA is flowing in the magneto-resistive element 20, a current Iwrite of about 500 µA is caused to flow in a write word line, thereby writing the data. That is, the total amount of current necessary to write the data is about 600 µA, less than ⅓ of that required in a conventional method. Therefore, the size of the driver circuit can be reduced. This will be explained in detail below.

Figure 9:
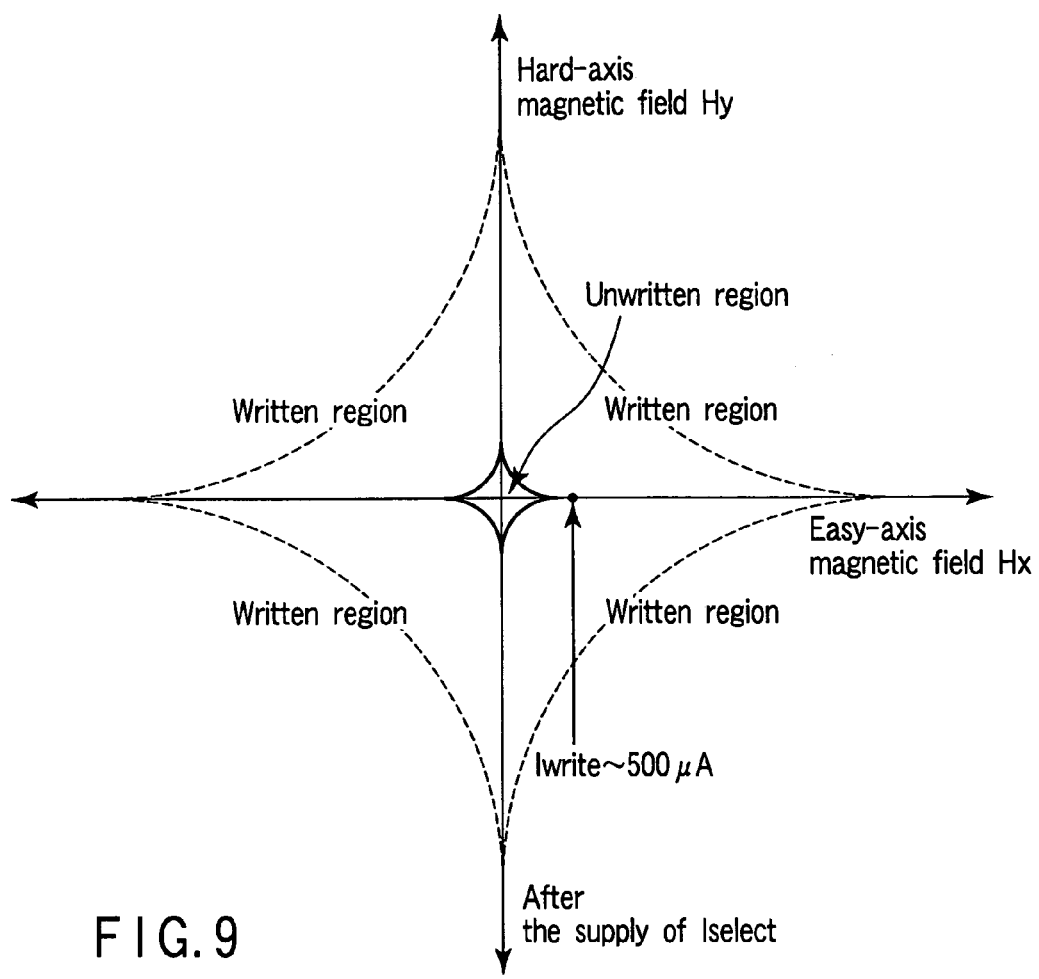
FIG. 9 is a graph showing an asteroid curve of the magneto-resistive element provided in the MRAM according to the first embodiment.

A magneto-resistive element through which tunnel current Iselect is caused to flow generates Joule heat and goes into a high temperature state. More specifically, it is assumed that the desirable resistance value of a magneto-resistive element is about 10 KΩ and a tunnel current Iselect of 100 µA is caused to flow. On this assumption, about 0.1 mW of Joule heat can be generated. Then, as a result of the heat generation, an asteroid curve of the magneto-resistive element shrinks as shown in FIG. 9. That is, the write magnetic field threshold value decreases. FIG. 9 shows an asteroid curve after tunnel current Iselect is supplied. The dotted lines in the figure are an asteroid curve before tunnel current is supplied. As a result, as seen from the comparison of FIG. 8 and FIG. 9, the easy-axis magnetic field Hx generated with a current Iwrite of 500 µA is equal to or less than the write threshold value before tunnel current Iselect is supplied, whereas it is larger than the write threshold value after tunnel current Iselect is supplied. This is because the asteroid curve shrinks because of heat generation. As a result, writing can be done by only the easy-axis magnetic field Hx. Furthermore, the value of the easy-axis magnetic field Hx is smaller than that in the prior art.

Since the amount of current needed for writing is decreased, the sizes of the transistors forming the bit line driver 14 and the word line drivers 18, 19 can be reduced. More specifically, since the necessary amount of current decreases to about ⅓ of the original amount, the gate width of the transistor also decreases to ⅓ of the original width. Furthermore, writing can be done only by the easy-axis magnetic field Hx, which makes it unnecessary to generate the hard-axis magnetic field Hy. As a result, the other ends of the bit lines may be in a floating state. That is, a bit line current sink indispensable to the conventional MRAM becomes unnecessary. Therefore, the driver circuits can be made smaller and therefore the area occupied by the driver circuits in the semiconductor memory device can be reduced remarkably. As a result, an inexpensive MRAM with a smaller chip size can be provided.

(2) Writing reliability is improved. This will be explained in detail below.

In the MRAM of the first embodiment, tunnel current Iselect is supplied only to the magneto-resistive element of the selected memory cell. That is, the write magnetic field threshold value of the magneto-resistive element of only the selected memory cell decreases. The write threshold values of the other magneto-resistive elements (unselected memory cells) do not change. Specifically, in FIG. 1, for example, when data is written into memory cell MC11, only the magneto-resistive element of memory cell MC11 has an asteroid curve shown in FIG. 9. The magneto-resistive elements of all of the other memory cells have an asteroid curve shown in FIG. 8. Then, in a write operation, since current Iwrite is supplied to write word line WWL1, the easy-axis magnetic field Hx generated by write word line WWL1 is also applied to the memory cells in the same row as memory cell MC11. Since the magnetic field generated by current Iwrite caused to flow to write the data into memory cell MC11 whose asteroid curve has shrunk is sufficiently smaller than the write magnetic field threshold values of the memory cells excluding the selected memory cell MC11, there is almost no possibility that erroneous writing will be done. That is, the selectivity of a memory cell in a write operation is improved remarkably and therefore an operation margin for erroneous writing is improved remarkably.

(3) The operating reliability at low temperature is improved.

The write threshold value of a magneto-resistive element is characterized by decreasing as the temperature rises and increasing as the temperature drops. Therefore, at low temperature, the write current is insufficient, which can lead to poor writing. To overcome this problem, when a system provided with an MRAM was used at low temperature in the prior art, it was necessary to design a driver circuit so as to satisfy the write current value necessary at low temperature. In this case, another problem was an increase in the chip area.

With an MRAM of the first embodiment, however, the problem is solved. Specifically, with the data writing method of the first embodiment, the magneto-resistive element of the selected memory cell is brought into a high temperature state by tunnel current. Therefore, even at low temperature, an erroneous operation is less liable to take place, which enables a highly reliable write operation. As a result, measures against temperature are not necessary in the system, which enables the system to be simplified.

(4) Making the permittivity of the interlayer film lower can be made compatible with making the temperature of the magneto-resistive element higher.

To make the operation speed faster, low-permittivity materials are being used as interlayer insulating films used in recent system LSIs. There have been strong demands that an interlayer insulating film covering an upper wiring layer should have lower permittivity. With an MRAM of the first embodiment, the magneto-resistive element is brought instantly into a high temperature state in a write operation. Therefore, it is desirable that materials resistant to high temperature should be used as an interlayer insulating film on the periphery of the magneto-resistive element. However, low-permittivity materials are not necessarily stable thermally. For instance, many low-permittivity materials permit degassing at high temperature or have their structure changed.

With the configuration of the first embodiment, the write word lines 32 are formed using the wiring layers right above the gate electrodes 27 as shown in FIG. 3. The magneto-resistive elements 20 are formed using the wiring layers right above the write word lines 32. That is, the magneto-resistive elements 20 are formed in places as low as possible. Therefore, thermally stable materials are not needed as the upper interlayer insulating films, which enables the use of low-permittivity materials. Since the lower interlayer insulating films are not much required to have low permittivity, thermally stable materials can be used, even if their permittivity is relatively high. As a result, the prevention of the deterioration of the reliability of the interlayer insulating films at high temperature can be made compatible with the higher-speed operation of LSIs.

(5) The magneto-resistive elements can be heated to high temperature efficiently.

In the MRAM of the first embodiment, the adjacent switching transistors 21 share a source region 26. The surface of the source region 26 is turned into silicide. Each of the silicide films 28 connects the source regions of the switching transistors 21, 21, . . . in a same row in common. The silicide films 28 are, for example, cobalt silicide. In this case, its sheet resistance is about 10Ω. For instance, in the case of a 256 k-bit memory cell array, if the source region is connected to a power supply (or e.g., GND) with a silicide film 28, its resistance is about 1 KΩ. This value is ⅒ of 10 KΩ, the tunnel resistance value of a magneto-resistive element. Thus, the value is sufficiently lower than the tunnel resistance value. Therefore, since most of the heat generated by current Iwrite develops at the magneto-resistive elements, the magneto-resistive elements can be heated to high temperature effectively.

Figure 10:
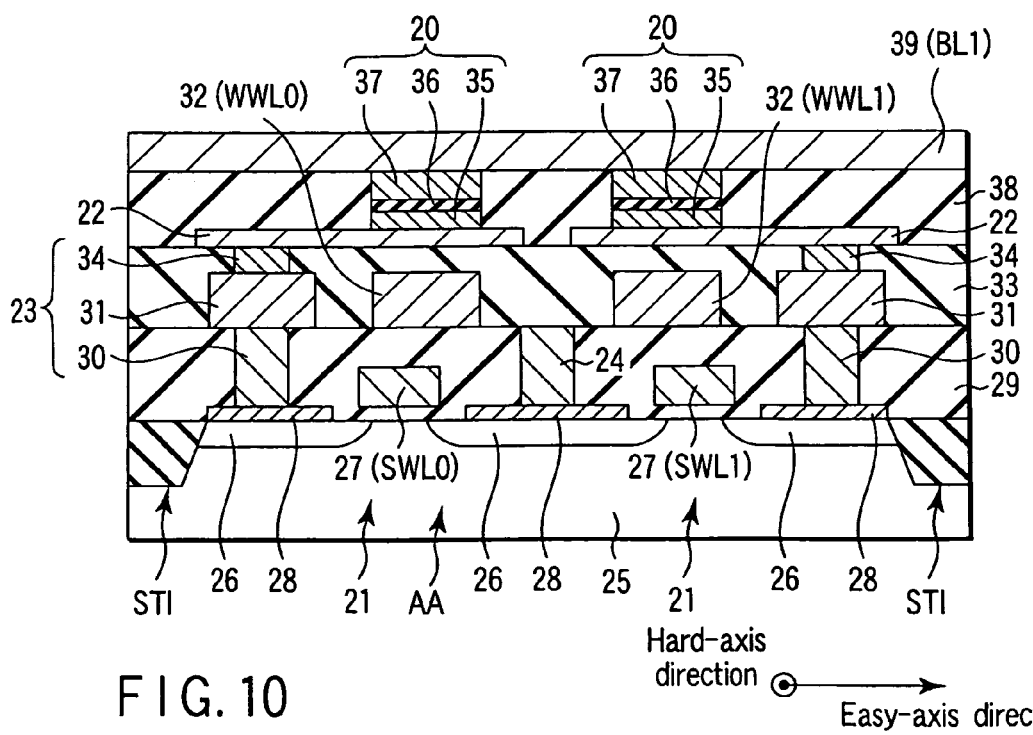
FIG. 10 is a sectional view of an MRAM according to a second embodiment of the present invention, which is taken along line 3-3 of FIG. 2.

Next, a semiconductor memory device according to a second embodiment of the present invention will be explained. The semiconductor memory device of the second embodiment is such that the source lines are made of contact plugs in place of the silicide films.28 in the first embodiment. FIG. 10 is a sectional view of an MRAM according to the second embodiment, which is taken along line 3-3 of FIG. 2.

As shown in FIG. 10, a contact plug 24 is formed on a silicide film 28 on a source region 26 shared by adjacent switching transistors 21, 21. The contact plug 24, which functions as a source line, is formed into a stripe-shaped line in the hard-axis direction (perpendicular to the drawing sheet). Then, the contact plug 24 connects the source regions of the memory cells in a same row in common. Since the remaining configuration is the same as that of FIG. 3 explained in the first embodiment, its explanation will be omitted. In addition, since the plane structure is such that the source lines 24 are formed out of the contact plugs 24 in the structure of FIG. 2 explained in the first embodiment, it explanation will be omitted.

Figure 11:
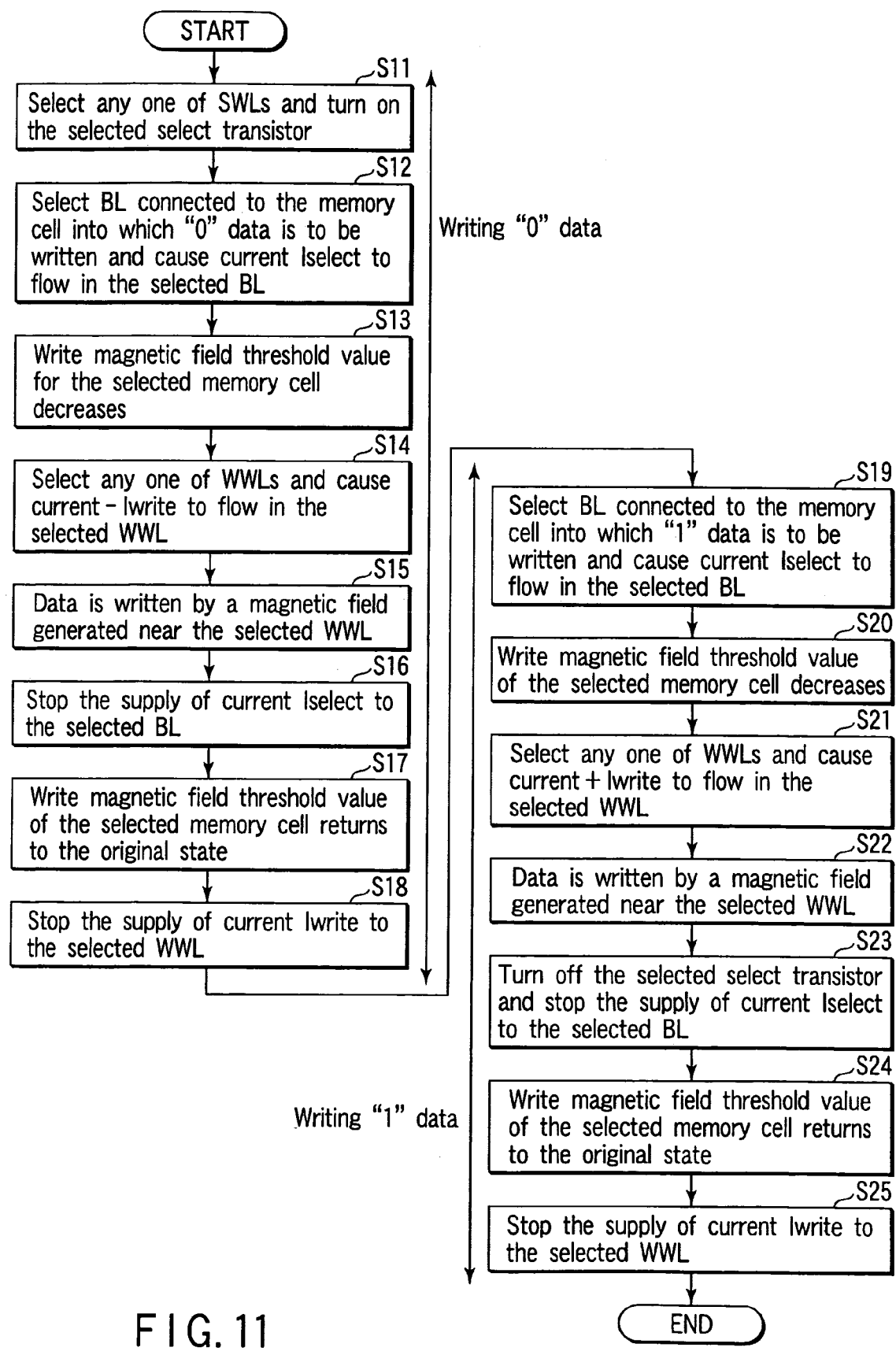
FIG. 11 is a flowchart for a method of writing data into the MRAM according to the second embodiment.

Next, the operation of the MRAM according to the second embodiment will be explained by reference to FIGS. 1 and 11. In the MRAM of the second embodiment, a plurality of memory cells are written into or read from at the same time. A write operation will be explained using as a case where data is written into the memory cells connected to select word line SWL1 (write word line WWL1). FIG. 11 is a flowchart for a write operation in the MRAM of the second embodiment.

First, "0" data is written. Specifically, the select word line driver 17 selects select word line SWL1 on the basis of a row address decode signal. Then, the select word line driver 17 supplies a voltage to select word line SWL1. As a result, the switching transistors 21 of the memory cells MC10, MC11, MC12, . . . , MC1n are brought into the on state (step S11).

Figure 12:
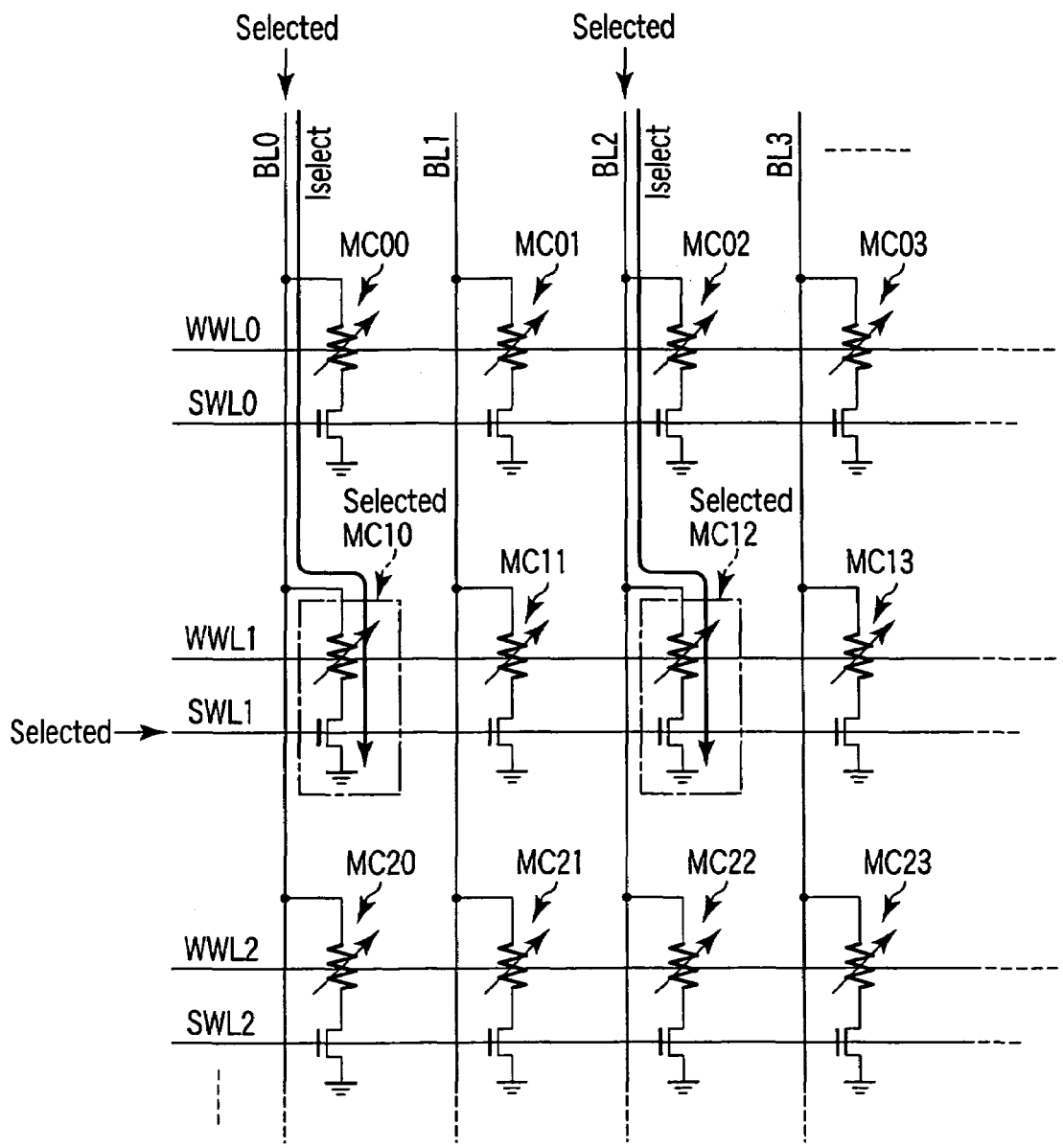
FIG. 12 is a circuit diagram of a memory cell array in a write operation in the MRAM according to the second embodiment.

Next, on the basis of a column address decode signal, the bit line driver 14 selects the bit line connected to the memory cell into which "0" data is to be written. Here, suppose "0" data is written into memory cells MC10 and MC12. Then, the bit line driver 14 selects bit lines BL0, BL2. Then, the bit line driver 14 supplies a current Iselect of about 100 µA to bit lines BL0, BL2 (step S12). This is shown in FIG. 12. FIG. 12 is a circuit diagram of a part of the memory cell array 11.

As shown in FIG. 12, with select word line SWL1 being selected, current Iselect is supplied to bit lines BL0, BL2. Current Iselect passes through the magneto-resistive elements 20 of the memory cells MC11 and MC12 and the current path of the switching transistor 21 and flows into the ground potential.

Then, since current flows between the ferromagnetic layers via the insulating film in the magneto-resistive elements 20 of memory cells MC10 and MC12, Joule heat is generated. As a result, the magneto-resistive elements 20 go into a high temperature state, leading to a decrease in the write magnetic field (current) threshold value (step S13). Specifically, the asteroid curves of memory cells MC10 and MC12 change from the asteroid curve shown in FIG. 8 to that shown in FIG. 9. The asteroid curves of the other memory cells remain unchanged as shown in FIG. 8.

Figure 13:
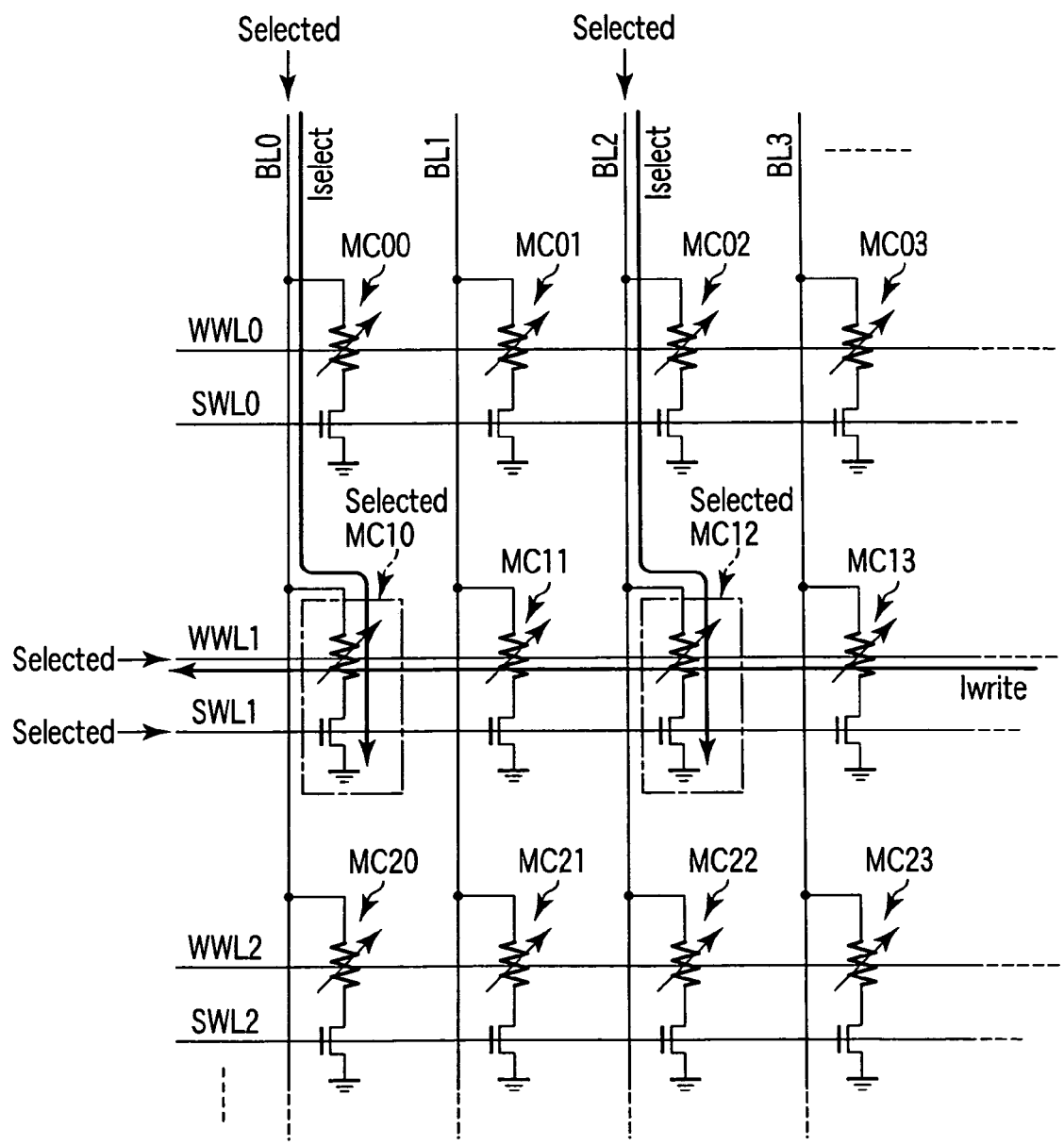
FIG. 13 is a circuit diagram of the memory cell array in a write operation in the MRAM according to the second embodiment.

Next, the write word line drivers 18, 19 select write word line WWL1 on the basis of a row address decode signal. Then, current –Iwrite is supplied to word line WWL1. That is, the write word line driver 19 supplies a current Iwrite of about 500 µA to write word line WWL1 (step S14). Current Iwrite passes through write word line WWL1 and flows into the write word line driver 18. This shown in FIG. 13. FIG. 13 is a circuit diagram of a part of the memory cell array 11.

As shown in FIG. 13, with current Iselect flowing in the magneto-resistive elements 20 of memory cells MC10 and MC12, current –Iwrite is supplied to write word line WWL1. Then, a magnetic field is generated around write word line WWL1. Because of the influence of the magnetic field, "0" data is written into the magneto-resistive elements 20 of memory cells MC10 and MC12 (step S15).

Next, bit lines BL0, BL2 are made unselected and the supply of current Iselect is stopped (step S16). Stopping the supply of current Iselect cools the magneto-resistive elements 20 of memory cells MC10 and MC12 from a high temperature state. After the magneto-resistive elements 20 are cooled from the high temperature state, the write magnetic field threshold value of the magneto-resistive elements 20 returns to the original value (step S17). The asteroid curve returns from the shape shown in FIG. 9 to that in FIG. 8. Then, write word line WWL1 is made unselected and the supply of current –Iwrite is stopped (step S19).

In this way, "0" data has been written.

Figure 14:
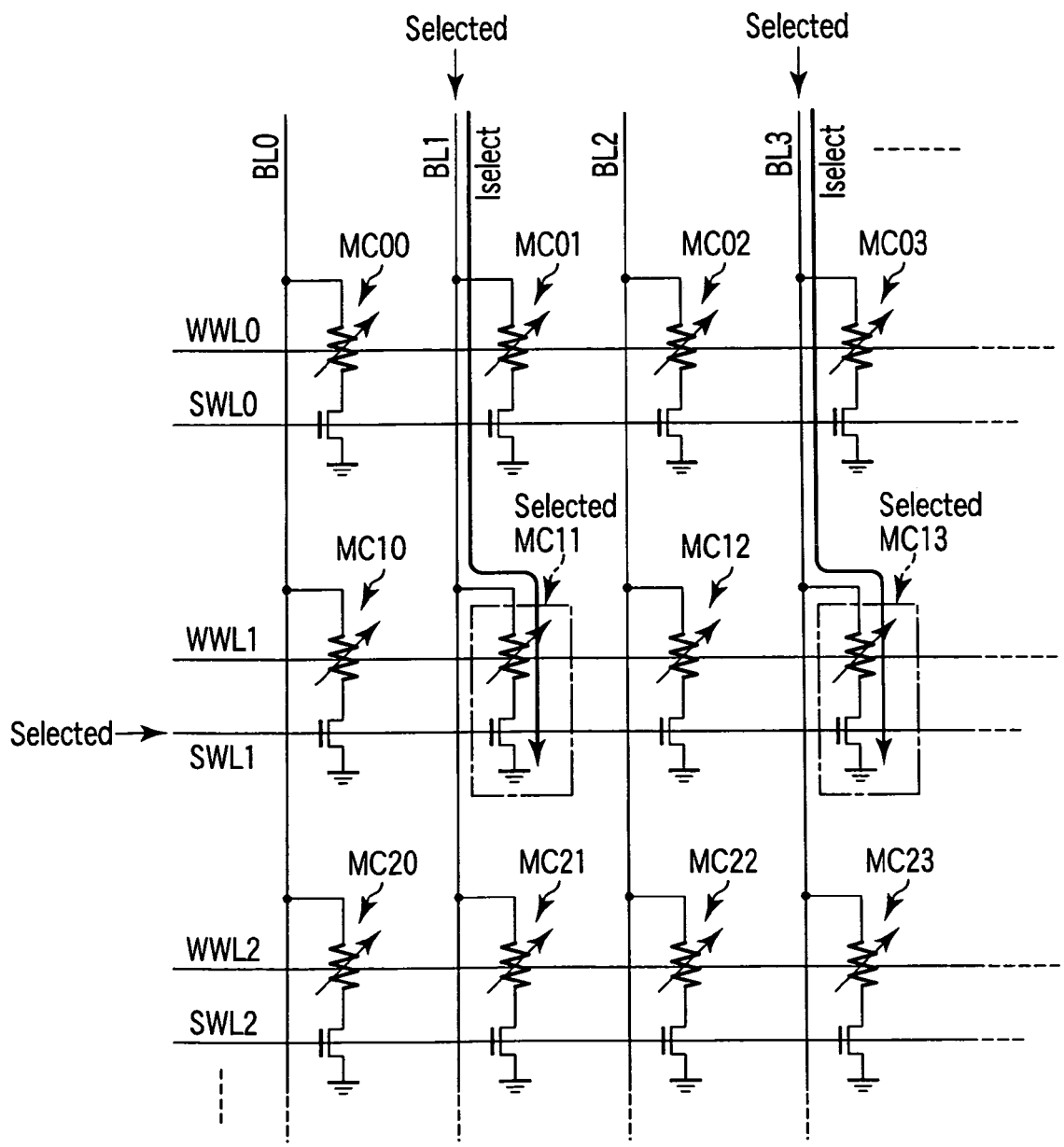
FIG. 14 is a circuit diagram of the memory cell array in a write operation in the MRAM according to the second embodiment.

Next, "1" data is written. Specifically, on the basis of a column address decode signal, the bit line driver 14 selects the bit line connected to the memory cell into which "1" data is to be written. Here, suppose "1" data is written into memory cells MC11 and MC13. Then, the bit line driver 14 selects bit lines BL1, BL3. Then, the bit line driver 14 supplies a current Iselect of about 100 µA to bit liens BL1, BL3 (step S19). This is shown in FIG. 14. FIG. 14 is a circuit diagram of a part of the memory cell array 11.

As shown in FIG. 14, with select word line SWL1 being selected, current Iselect is supplied to bit lines BL1, BL3. Current Iselect passes through the magneto-resistive elements 20 of the memory cells MC11 and MC13 and the current path of the switching transistor 21 and flows into the ground potential.

Then, Jule heat is generated at the magneto-resistive elements 20 of memory cells MC11 and MC13. As a result, the magneto-resistive elements 20 go into a high temperature state, leading to a decrease in the write magnetic field (current) threshold value (step S20). Specifically, the asteroid curves of memory cells MC11 and MC13 change from the asteroid curve shown in FIG. 8 to that shown in FIG. 9. The asteroid curves of the other memory cells remain unchanged as shown in FIG. 8.

Figure 15:
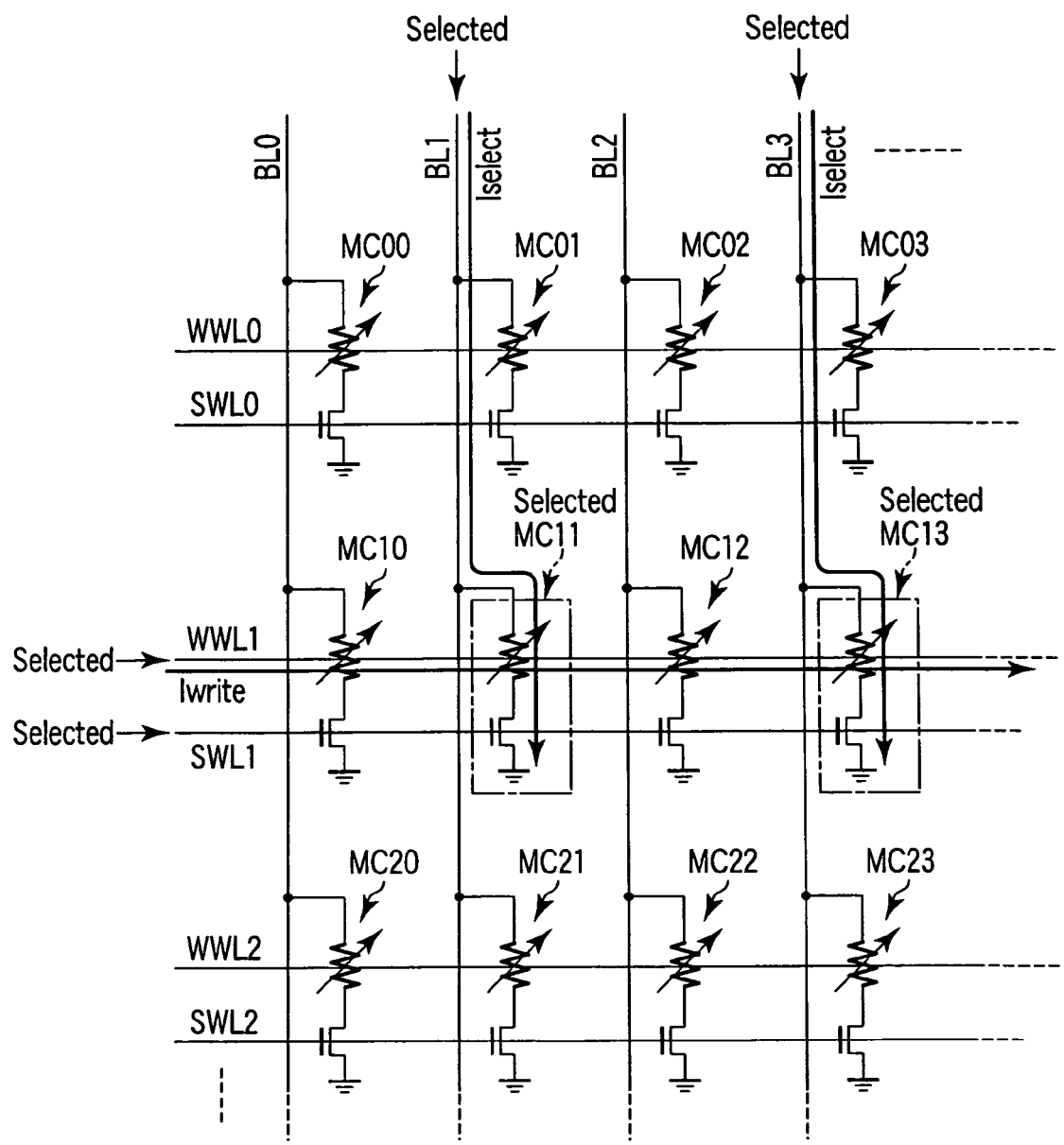
FIG. 15 is a circuit diagram of the memory cell array in a write operation in the MRAM according to the second embodiment.

Next, the write word line drivers 18, 19 select write word line WWL1 on the basis of a row address decode signal. Then, current +Iwrite is supplied to write word line WWL1. That is, the write word line driver 18 supplies a current Iwrite of about 500 µA to write word line WWL1 (step S21). Current Iwrite passes through write word line WWL1 and flows into the write word line driver 19. This is shown in FIG. 15. FIG. 15 is a circuit diagram of a part of the memory cell array 11.

As shown in FIG. 15, with current Iselect flowing in the magneto-resistive elements 20 of memory cells MC11 and MC13, current +Iwrite is supplied to write word line WWL1. Then, a magnetic field is generated around write word line WWL1. Because of the influence of the magnetic field, "1" data is written into the magneto-resistive elements 20 of memory cells MC11 and MC13 (step S22).

Thereafter, select word line SWL1 is made unselected and the switching transistors 21 of the memory cells MC10, MC11, MC12, MC13, . . . , MC1n are tuned off. Then, bit lines BL1, BL3 are made unselected and the supply of current Iselect is stopped (step S23).

Stopping the supply of current Iselect cools the magneto-resistive elements 20 of memory cells MC11 and MC13 from a high temperature state. After the magneto-resistive elements 20 are cooled from the high temperature state, the write magnetic filed threshold value of the magneto-resistive elements 20 returns to the original value (step S24). That is, the asteroid curve returns from the shape shown in FIG. 9 to that in FIG. 8.

Then, write word line WWL1 is made unselected and the supply of current +Iwrite is stopped (step S25).

In this way, "1" data has been written.

Figure 16:
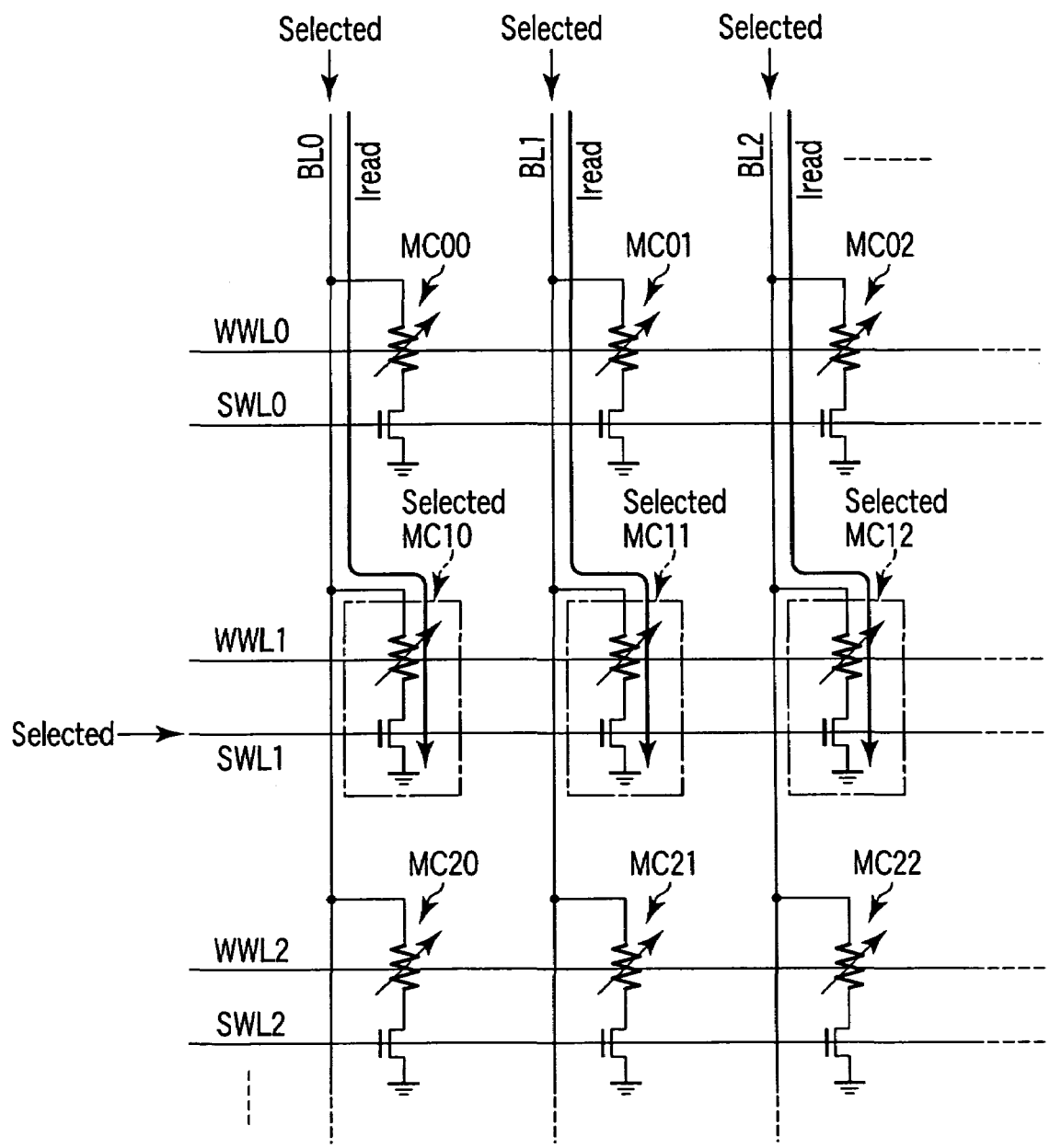
FIG. 16 is a circuit diagram of the memory cell array in a read operation in the MRAM according to the second embodiment.

Next, a read operation will be explained by reference to FIG. 16. FIG. 16 is a circuit diagram of a part of the memory cell array 11 in reading the data. Explanation will be given using a case where the data is read from the memory cells MC10, MC11, MC12 at the same time.

As shown in FIG. 16, the select word line driver 17 selects select word line SWL1, which brings the switching transistors 21 of the memory cells MC10, MC11, MC12, . . . , MC1n into the on state. The bit line driver 14 selects bit lines BL0, BL1, BL2, which allows current Iread to be supplied to bit lines BL0, BL1, BL2. Then, the sense amplifier amplifies a change in the potential on bit lines BL0, BL1, BL2 and outputs the amplified potential as a read-out voltage.

The MRAM of the second embodiment produces not only the effects explained in times (1) to (4) in the first embodiment but also the following effects in items (6) and (7) explained below.

(6) A high-speed MRAM can be realized.

With the data writing method according to the second embodiment, after a write select word line is selected, current is caused to flow in the write word line, with tunnel current flowing in the bit line connected to the memory cell into which "0" data is to be written, thereby writing "0" data. Then, with tunnel current flowing in the bit line connected to the memory cell into which "1" data is to be written, opposite current is caused to flow in the write word line, thereby writing "1" data. By the series of processes, the data has been written into all of the memory cells connected to the same write select word line.

Moreover, in a read operation, the data held in plurality (all) of the memory cells connected to the same select word line can be read simultaneously by causing current to flow in a plurality of (all) bit lines.

Accordingly, a plurality of data items can be processed at a time, which enables a high-speed operation. Moreover, when image data or the like is handled, it is desirable that a plurality of data items should be treated as one unit in a write or a read operation. Therefore, the second embodiment is particularly effective in processing such data.

(7) The magneto-resistive elements can be heated to high temperature efficiently. Although this effect is the same as that explained in item (5) in the first embodiment, it is obtained by forming the source lines out of the contact plugs 24.

In the first embodiment, the source lines are made of a silicide film. In this case, the resistance produced when the source region is connected to the power supply is about 1 KΩ as described above, about 1/10 of the resistance of the magneto-resistive element. The value is-sufficient in writing the data into only one memory. However, when the data is written into a plurality of memory cells as in the second embodiment, the value can be insufficient. For example, when the data is written into 32 memory cells at the same time, the combined resistance of the 32 magneto-resistive elements connected in parallel is about 0.3 KΩ. This value is lower than a resistance of 1 KΩ developing when the source region is connected to the power supply. As a result, it is difficult to heat the magneto-resistive element to high temperature efficiently.

However, with the second embodiment, the source lines are formed out of the contact plugs 24 formed on the silicide films 28. For example, if tungsten is used as a material for the contact plugs 24 and the size of the plugs 24 is 0.1 μm in width and 0.3 μm in height, their sheet resistance is about 0.5Ω. Therefore, the resistance developing when the source is connected to the power supply is 0.1 KΩ or less. Since the value is sufficiently lower than the combined resistance of a plurality of magneto-resistive elements, the magneto-resistive elements can be heated to high temperature efficiently. Accordingly, the occurrence of poor writing can be suppressed.

Moreover, when the magneto-resistive elements can be heated to high temperature without forming the source lines out of the contact plugs 24, the source lines may, of course, be formed out of the silicide films 28. Conversely, in the first embodiment, the source lines may be formed out of the contact plugs 24. While in the second embodiment, "1" data is written after "0" data is written, it goes without saying that "1" data may be written and thereafter "0" data may be written.

Figure 17:
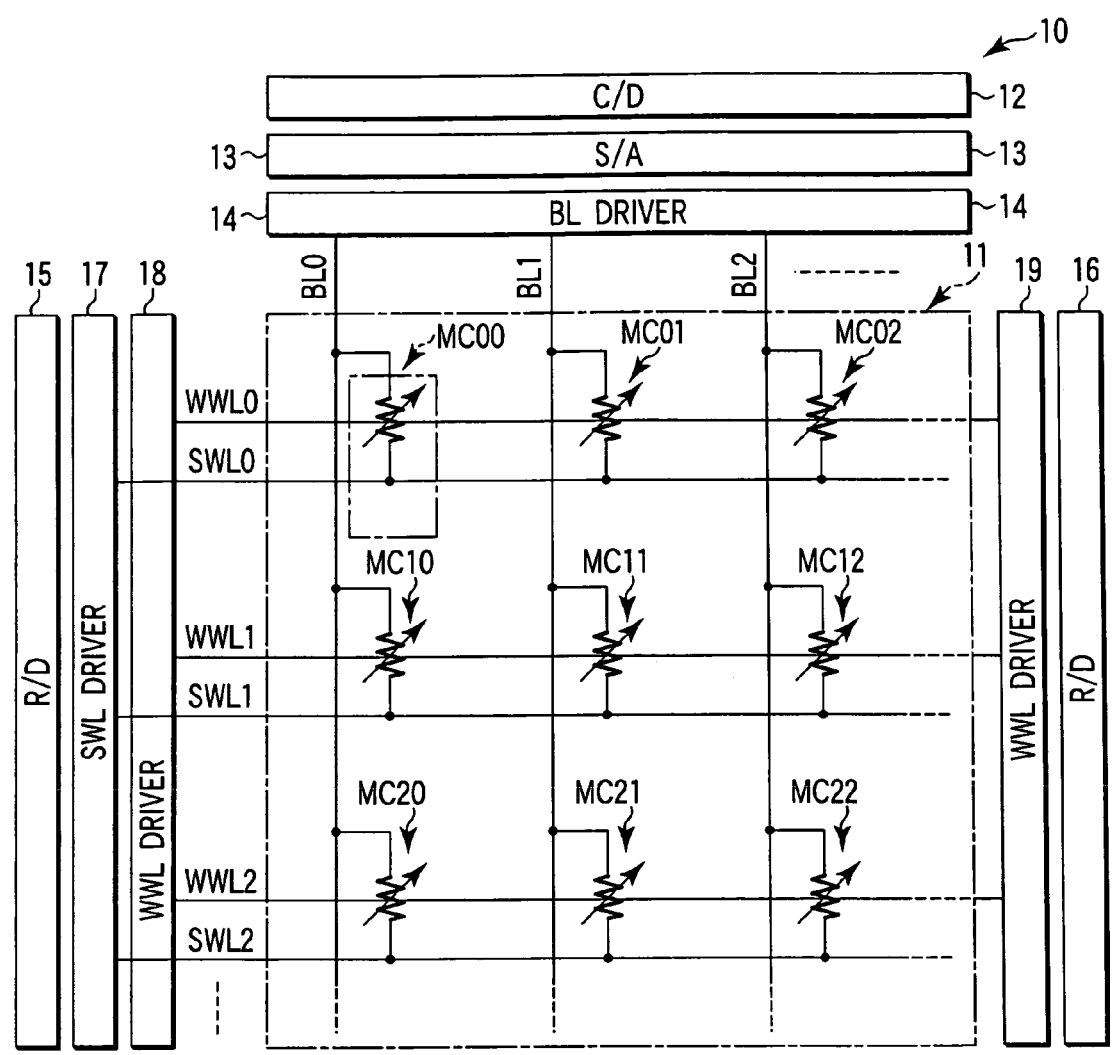
FIG. 17 is a block diagram of an MRAM according to a third embodiment of the present invention.

A semiconductor memory device according to a third embodiment of the present invention will be explained by reference to FIG. 17. FIG. 17 is a block diagram of an MRAM according to the third embodiment. The third, embodiment is such that the first embodiment is applied to an MRAM with cross-point memory cells. Since the configuration of the third embodiment excluding the memory cell array is the same as that of the first embodiment, its explanation will be omitted.

As shown in FIG. 17, a memory cell array 11 has a plurality of ((m+1)×(n+1)) memory cells MCs arranged in a matrix (m and n are natural numbers). In FIG. 17, only (3×3) memory cells MCs are shown. Each of the memory cells MCs includes a magneto-resistive element 20, such as an MTJ element. One end of the magneto-resistive element 20 is connected to any one of bit lines BL0 to BLn. The other end of the magneto-resistive element 20 is connected to any one of select word lines SWL0 to SWLm. Any one of write word lines WWL0 to WWLm is provided in close proximity to the magneto-resistive element 20. The other ends of the magneto-resistive elements 20 provided in a same row are connected to any one of the select word lines SWL0 to SWLm in common. In the vicinity of the magneto-resistive elements 20 arranged in a same row, any one of the write word lines WWL0 to WWLm is laid. One end of each of the magneto-resistive elements 20 arranged in a same column is connected in common to any one of the bit lines BL0 to BLn. The write word lines WWL0 to WWLm and the bit line BL0 to BLn are arranged so as to cross at right angles.

Figure 18:
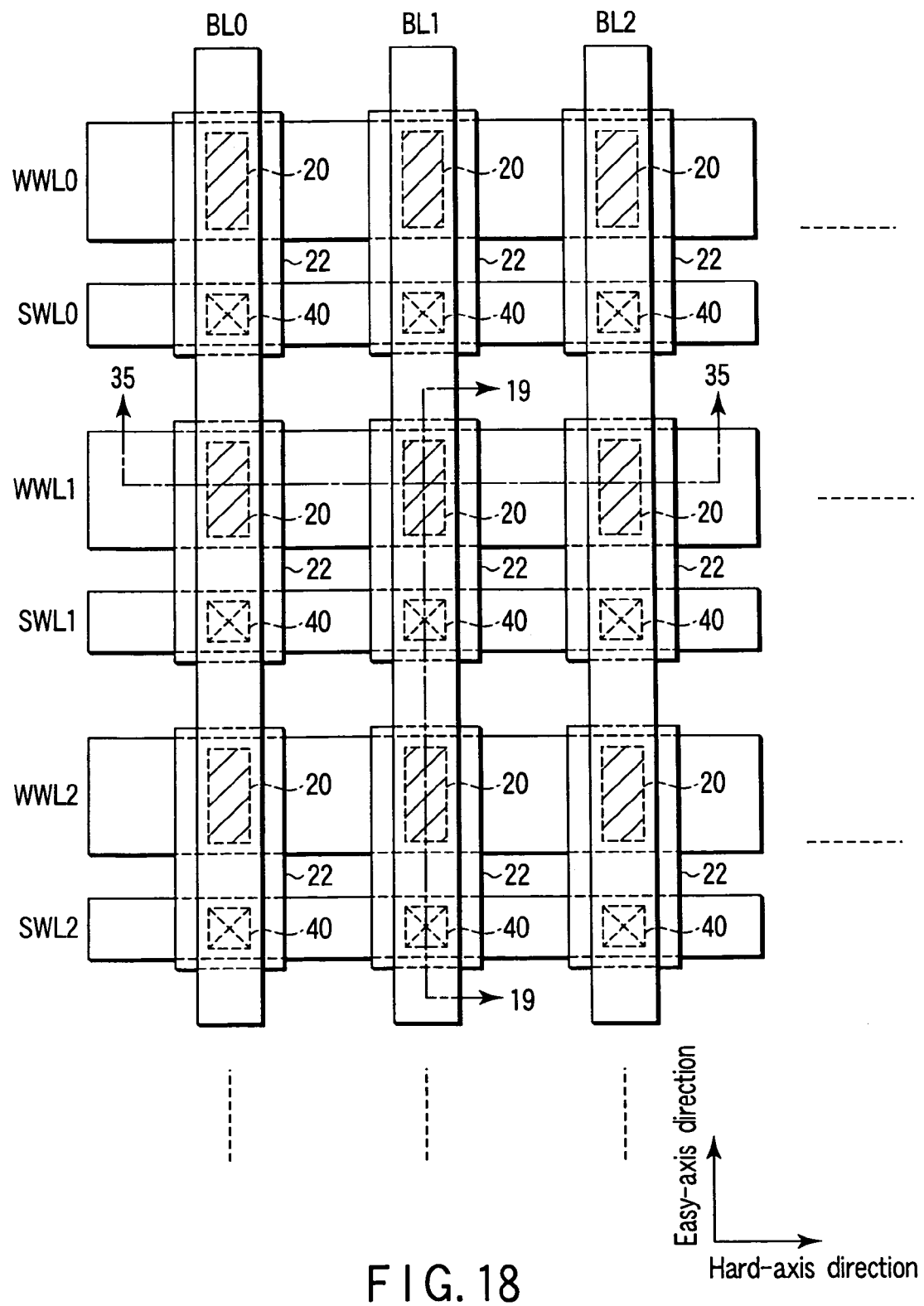
FIG. 18 is a plan view of the MRAM according to the third embodiment.

Next, a plane pattern of the memory cell array 11 will be explained by reference to FIG. 18. FIG. 18 is a plan view of the memory cell array 11. The configuration of the third embodiment is such that the switching transistors are eliminated and the locations of the select word lines are changed in the first embodiment. The directions shown in FIG. 18 are defined as a hard-axis direction and an easy-axis direction.

As shown in FIG. 18, (1+n) bit lines BL0 to BLn are formed in the hard-axis direction into stripe-shaped lines extending in the easy-axis direction (in FIG. 18, only bit lines BL0 to BL2 are shown). In addition, (1+m) write word lines WWL0 to WWLm are formed in the easy-axis direction into stripe-shaped lines extending in the hard-axis direction (in FIG. 18, only word lines WWL0 to WWL2 are shown). Then, magneto-resistive elements 20 are provided at the intersections of the bit lines BL0 to BLn and the write word lines WWL0 to WWLm. Each of the bit lines BL0 to BLn is connected to one end of the corresponding magneto-resistive element 20. On the other hand, the write word lines WWL0 to WWLm are provided in close proximity to the magneto-resistive elements 20, while being isolated electrically from the latter. Furthermore, (1+m) select word lines SWL0 to SWLm are provided in parallel with the write word lines WWL0 to WWLm (in FIG. 18, only select word lines SWL0 to SWL2 are shown). The other ends of the magneto-resistive elements 20 are connected to the select word lines SWL0 to SWLm via withdrawing wiring layer 22 and contact plugs 40. The shape of the magneto-resistive element 20 is the same as that in the first and second embodiments.

Figure 19:
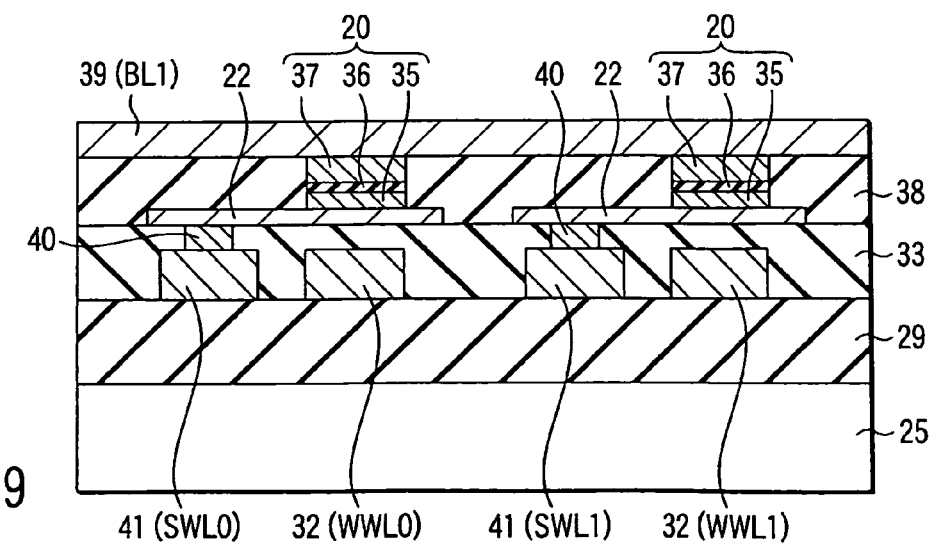
FIG. 19 is a sectional view taken along line 19-19 of FIG. 18.

Next, a sectional view of the memory cell array 11 will be explained by reference to FIG. 19. FIG. 19 is a sectional view taken along line 19-19 of FIG. 18.

As shown in FIG. 19, on an interlayer insulating film 29, metal wiring layers 32, 41 functioning as the write word lines WWL0 to WWLm and the select word lines SWL0 to SWLm are formed into stripe-shaped lines extending in the hard-axis direction (perpendicular to the drawing sheet).

An interlayer insulating film 33 is further formed on the interlayer insulating film 29. Contact plugs 40 are formed in the interlayer insulating film 33. The contact plugs 40 are connected to metal wiring layers 41. Metal wiring layers 22 connected to the contact plugs 40 are formed on the interlayer insulating film 33. The metal wiring layer 22 functions as withdrawing wiring layer 22 for the magneto-resistive elements 20.

Since the remaining configuration is the same as that of the first embodiment, explanation will be omitted.

Figure 20:
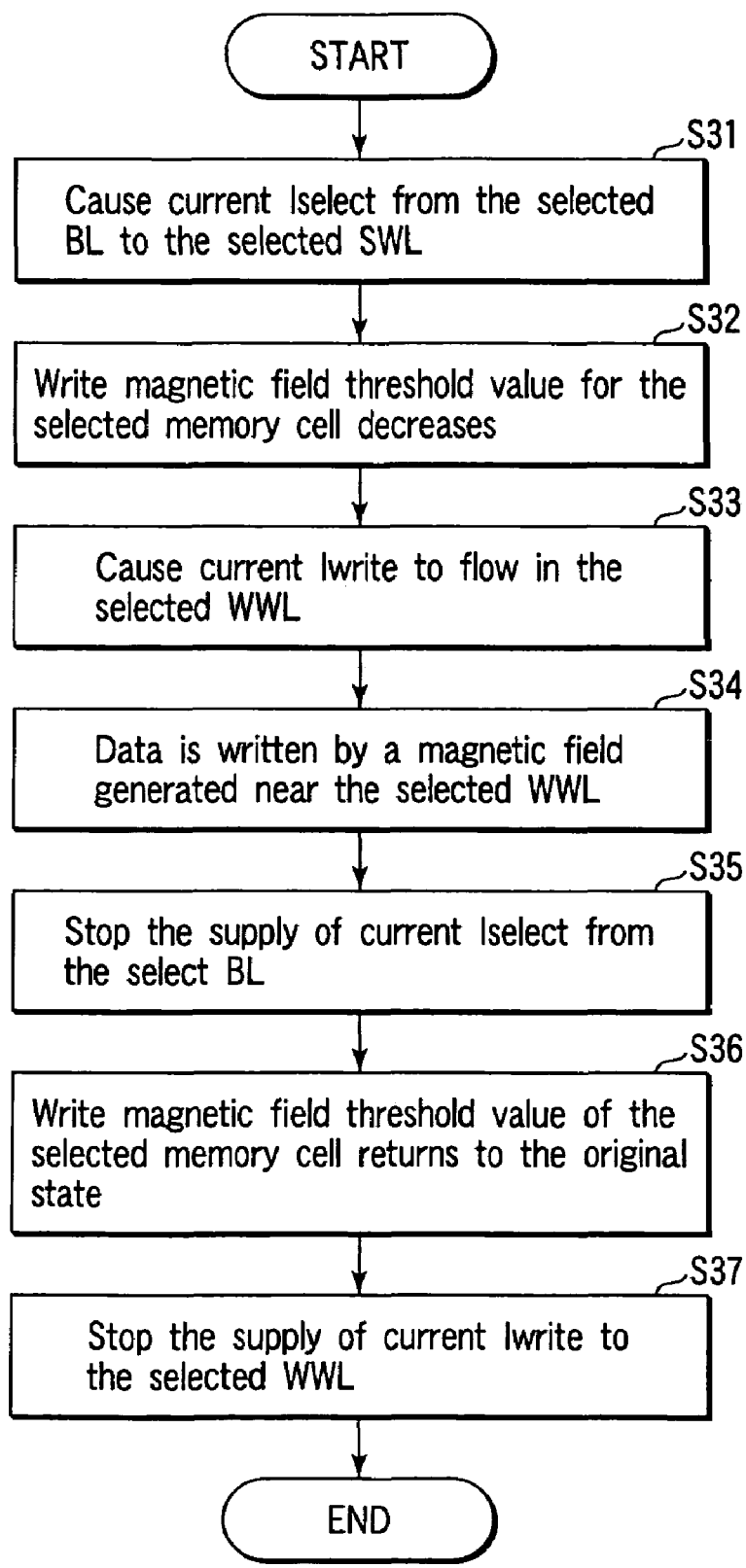
FIG. 20 is a flowchart for a method of writing data into the MRAM according to the third embodiment.

Next, the operation of the MRAM configured as described above will be explained by reference to FIGS. 17 and 20. A write operation will be explained using a case where data is written into memory cell MC11 provided at the intersection of bit line BL1 and select word line SWL1 (write word line WWL1). FIG. 20 is a flowchart for a write operation in the MRAM of the third embodiment.

Figure 21:
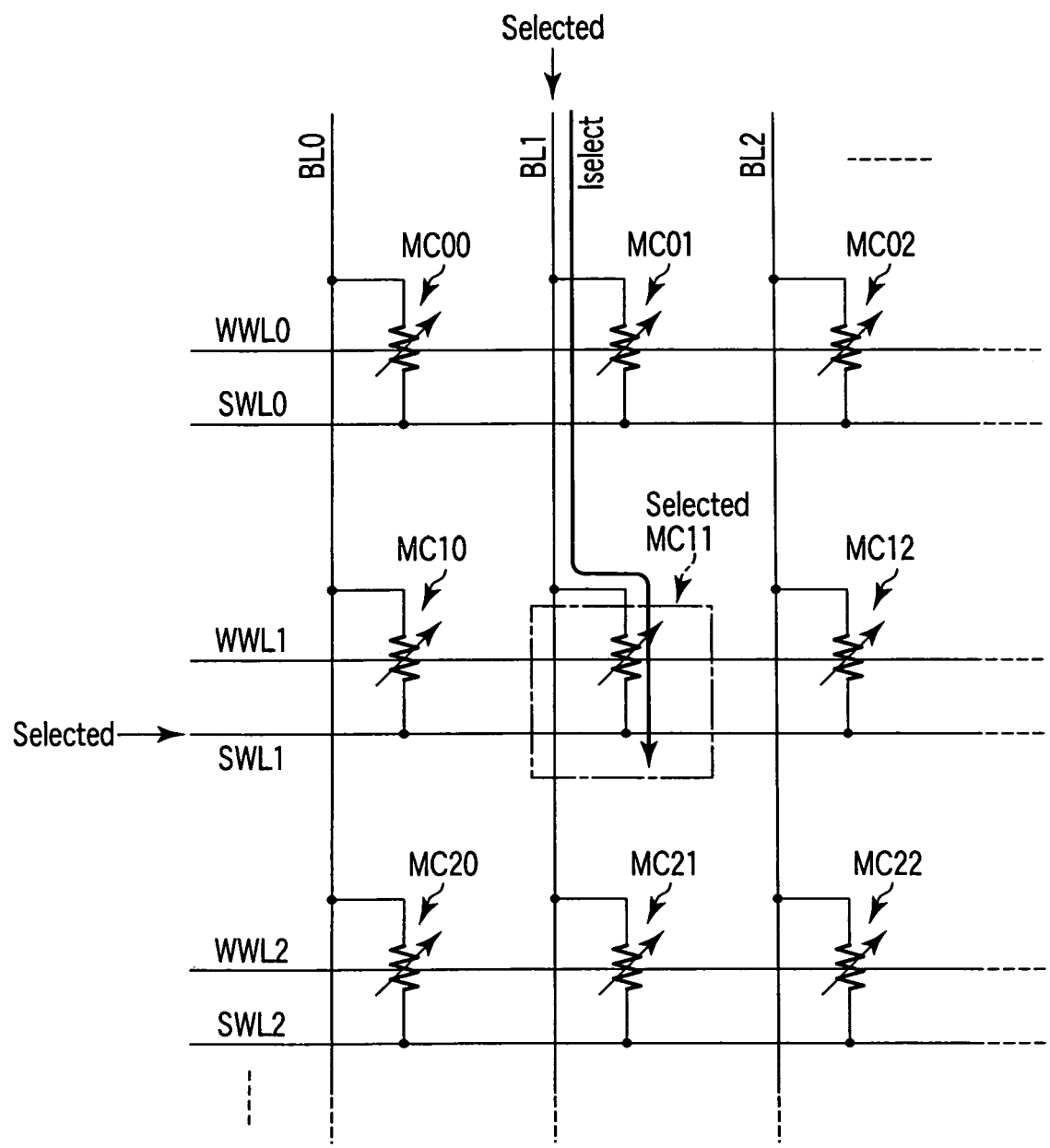
FIG. 21 is a circuit diagram of a memory cell array in a write operation in the MRAM according to the third embodiment.

First, in step S31 of FIG. 20, current Iselect is caused to flow from bit line BL1 connected to select memory cell MC11 to select word line SWL1 via the tunnel junction of the magneto-resistive element 20. Specifically, the select word line driver 17 selects select word line SWL1 on the basis of a row address decode signal. At this time, the select word line driver 17 functions as a current sink. Next, the bit line driver 14 selects bit line BL1 on the basis of a column address decode signal. Then, the bit line driver 14 supplies a current Iselect of about 100 μA to bit line BL1. This is shown in FIG. 21. FIG. 21 is a circuit diagram of a part of the memory cell array 11.

As shown in FIG. 21, with select word line SWL1 being selected, current Iselect is supplied to bit line BL1. As described above, although one end of each of the bit lines BL0 to BLn is connected to the bit line driver 14, the other ends are connected to the magneto-resistive elements 20 of the memory cells MCm0 to MCmn or brought into the floating state. As a result, current Iselect flows from the bit line driver 14, passes through the tunnel junction of the magneto-resistive element 20 of memory cell MC11, and flows into the select word line driver 17.

Then, as explained in the first embodiment, Joule heat is generated at the magneto-resistive element of memory cell MC11, leading to a decrease in the write magnetic field (current) threshold value (step S32).

Figure 22:
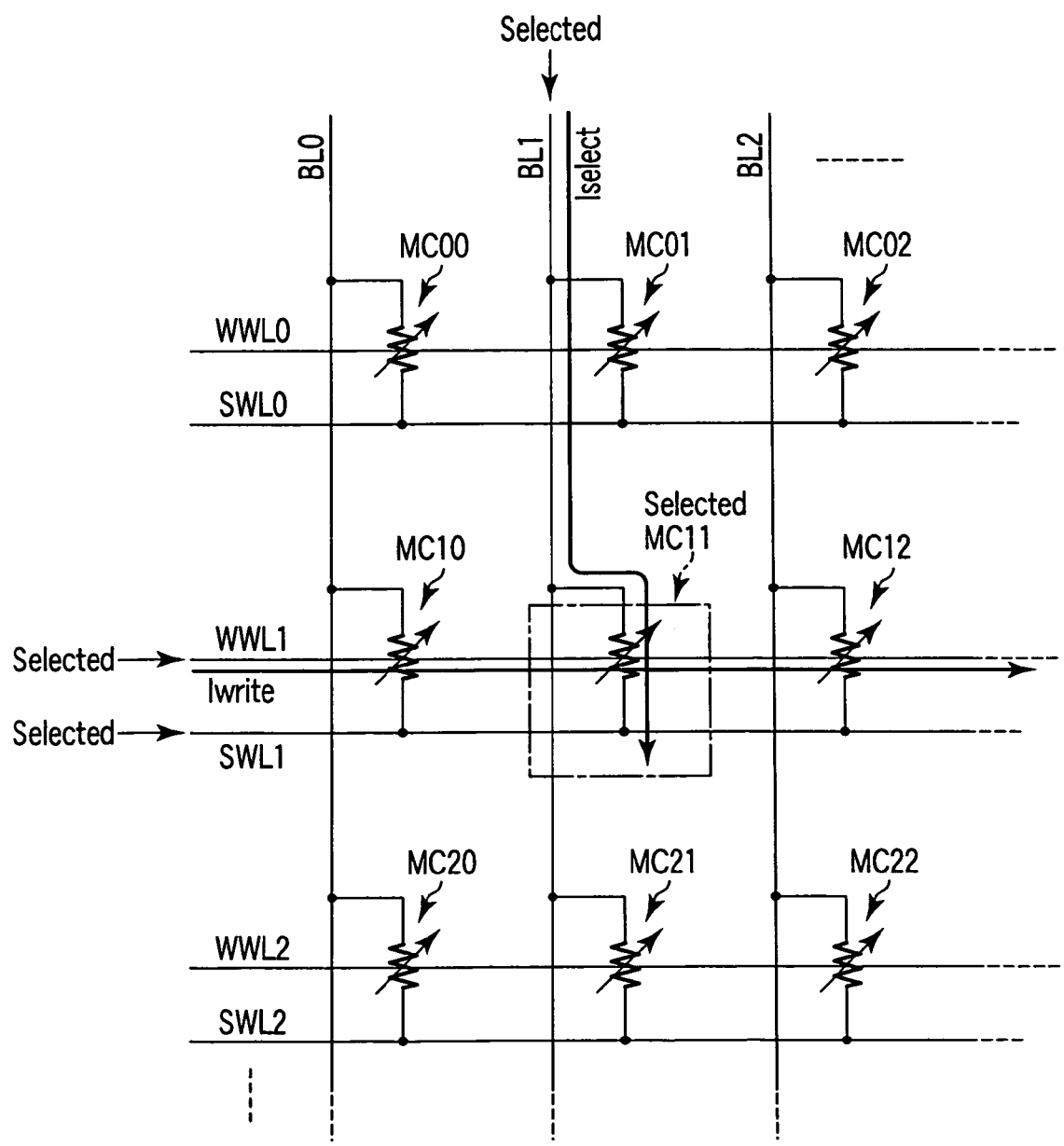
FIG. 22 is a circuit diagram of the memory cell array in a write operation in the MRAM according to the third embodiment.

Next, the operations in steps S4 and S5 explained in the first embodiment are carried out. Specifically, the write word line drivers 18, 19 select word line WWL1. Then, the write word line drivers 18, 19 supply a current Iwrite of about 500 μA to write word line WWL1 (step S33). This is shown in FIG. 22. FIG. 22 is a circuit diagram of a part of the memory cell array 11.

As shown in FIG. 22, with current Iselect flowing in the magneto-resistive element 20 of memory cell MC11, current Iwrite is caused to flow through write word line WWL1. Then, because of the magnetic field produced by current Iwrite, data is written into the magneto-resistive element 20 of memory cell MC11 (step S34).

Thereafter, select word line SWL1 and bit line BL1 are made unselected and the supply of current Iselect is stopped (step S35). As a result, the write magnetic field threshold value of the magneto-resistive element 20 of memory cell MC11 returns to the original value (step S36) Then, write word line WWL1 is made unselected and the supply of current Iwrite is stopped (step S37).

In this way, the data has been written.

Next, a read operation will be explained using a case where the data is read from memory cell MC11. Since the data reading method is almost the same as a conventional one, it will be explained briefly. FIG. 23 is a circuit diagram of a part of the memory cell array 11 in a read operation.

As shown in FIG. 23, the select word line driver 17 selects select word line SWL1. At this time, the select word line driver 17 functions as a current sink. The bit line driver 14 selects bit line BL1. As a result, current Iread is supplied to bit line BL1. Then, the sense amplifier 13 amplifies a change in the potential on bit line BL1 and outputs the amplified potential as a read-out voltage.

The MRAM with cross-point memory cells of the third embodiment produces the effects explained in items (1) to (5) in the first embodiment. In addition, the writing method and the reading method explained in the second embodiment can be applied to the third embodiment. That is, selecting a plurality of bit lines enables a plurality of data items to be written or read at the same time. This method produces the effect in item (6) explained in the second embodiment.

In the third embodiment, the bit line driver 14 supplies current Iselect. Since current Iselect has only to be caused to flow through the tunnel junction of the magneto-resistive element, for example, the select word line driver 17 may supply current Iselect.

Figure 24:
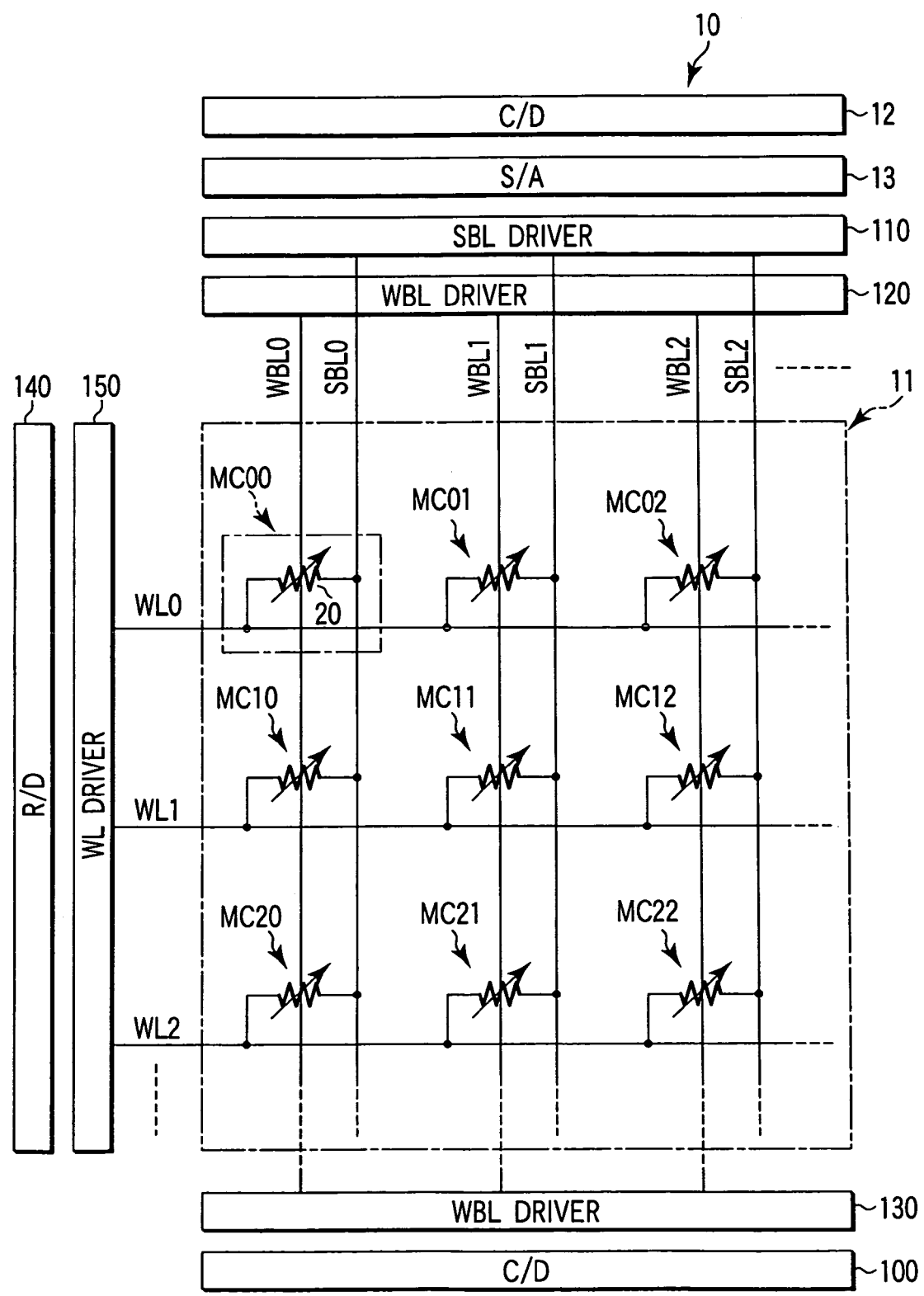
FIG. 24 is a block diagram of an MRAM according to a fourth embodiment of the present invention.

Next, a semiconductor memory device according to a fourth embodiment of the present invention will be explained by reference to FIG. 24. FIG. 24 is a block diagram of an MRAM according to the fourth embodiment. The fourth embodiment is such that the first embodiment is applied to an MRAM with cross-point memory cells and that data writing is done by write bit lines.

As shown in FIG. 24, an MRAM 10 comprises a memory cell array 11, column decoders 12, 100, a sense amplifier 13, a select bit line driver 110, write bit line drivers 120, 130, a row decoder 140, a word line driver 150.

The memory cell array 11 has a plurality of ((m+1)×(n+1)) memory cells MCs arranged in a matrix (m and n are natural numbers). In FIG. 24, only (3×3) memory cells MCs are shown. Each of the memory cells MCs includes a magneto-resistive element 20. One end of the magneto-resistive element 20 is connected to any one of select bit lines SBL0 to SBLn. The other end of the magneto-resistive element 20 is connected to any one of word lines WL0 to WLm. Any one of write bit lines WBL0 to WBLn is provided in close proximity to the magneto-resistive element 20. The other ends of the magneto-resistive elements 20 arranged in a same row are connected to any one of the word lines WL0 to WLm in common. One end of each of the magneto-resistive elements 20 arranged in a same column is connected to any one of the select bit lines SBL0 to SBLn in common. In the vicinity of the magneto-resistive elements 20 arranged in a same column, any one of the write bit lines WBL0 to WBLn is laid. The word lines WL0 to WLm and the select bit line SBL0 to SBLn are arranged so as to cross at right angles.

The column decoders 12, 100 decode a column address signal, thereby producing a column address decode signal.

The select bit line driver 110 selects any of the select bit lines SBL0 to SBLn on the basis of the column address decode signal in a write operation and in a read operation.

The write bit line drivers 120, 130 select any of the write bit lines WBL0 to WBLn on the basis of the column address decode signal in a write operation. Then, one of the write bit line drivers 120, 130 functions as a current source and supplies current to the selected write bit line. At this time, the-other write bit line driver functions as a current sink. Either the write bit line drivers 120 or 130 supplies current, thereby controlling the data to be written into the memory cell.

The row decoder 140 decodes a row address signal, thereby producing a row address signal.

The word line driver 150 selects any one of the word lines WL0 to WLn on the basis of the row address decode signal in a write operation and in a read operation.

The sense amplifier 13 amplifies the data read from the memory cell selected by the row decoder 140 and column decoders 12, 100.

Figure 25:
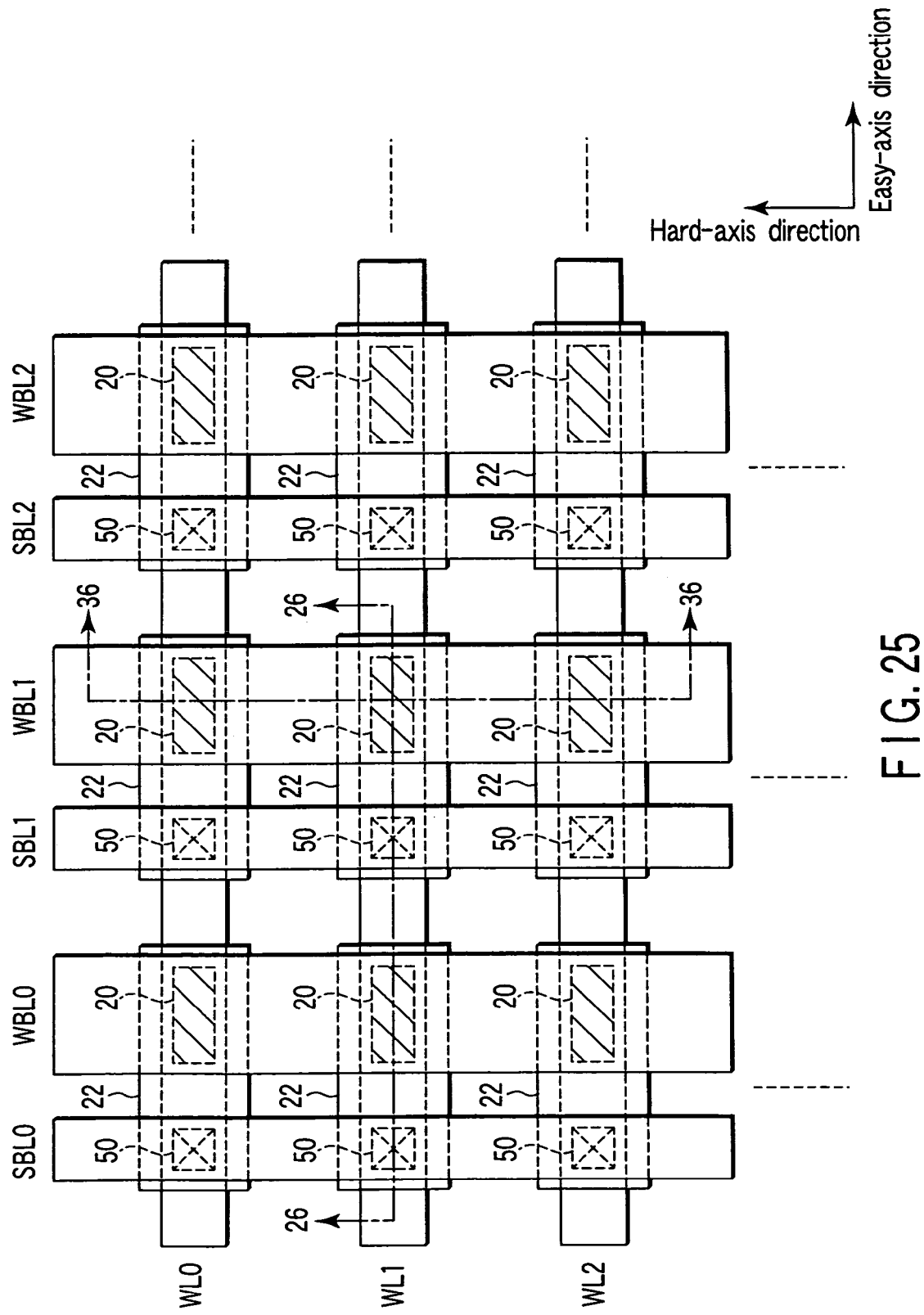
FIG. 25 is a plan view of the MRAM according to the fourth embodiment.

Next, a plane pattern of the memory cell array 11 will be explained by reference to FIG. 25. FIG. 25 is a plan view of the memory cell array 11. The directions shown in the figure are defined as a hard-axis direction and an easy-axis direction.

As shown in the figure, (1+m) word lines WL0 to WLm are formed in the hard-axis direction into stripe-shaped lines extending in the easy-axis direction (in FIG. 25, only word lines WL0 to WL2 are shown). In the easy-axis direction, (1+n) write bit lines WBL0 to WBLn are formed into stripe-shaped lines extending in the hard-axis direction (in FIG. 25, only write bit lines WBL0 to WBL2 are shown). Then, magneto-resistive elements 20 are provided at the intersections of the word lines WL0 to WLm and the write bit lines WBL0 to WBLn. The word lines WL0 to WLm are connected to the other ends of the magneto-resistive elements 20. On the other hand, the write bit lines WBL0 to WBLn are provided in close proximity to the magneto-resistive elements 20, while being isolated electrically from the latter. In parallel with the write bit lines WBL0 to WBLn, (1+n) select bit lines SBL0 to SBLn are provided (in FIG. 25, only select bit lines SBL0 to SBL2 are shown). Then, one end of each of the magneto-resistive elements 20 is connected to the corresponding one of the select bit lines SBL0 to SBLn via a withdrawing wiring layer 22 and a contact plug 50. The shape of the magneto-resistive element 20 is the same as that in the first and second embodiments.

Figure 26:
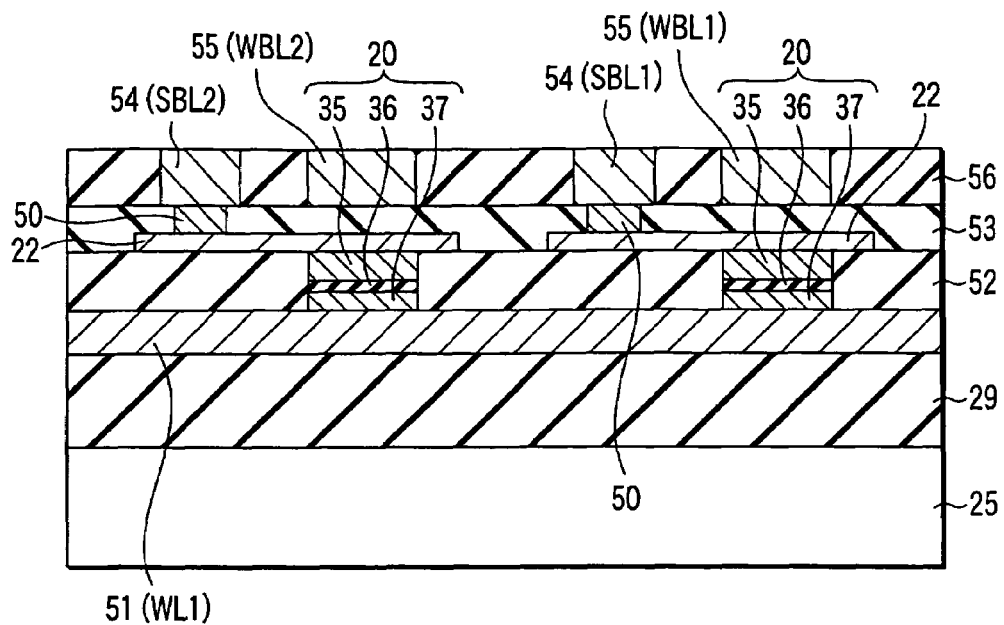
FIG. 26 is a sectional view taken along line 26-26 of FIG. 25.

Next, a sectional structure of the memory cell array 11 will be explained by reference to FIG. 26. FIG. 26 is a sectional view taken along line 26-26 of FIG. 25.

As shown in FIG. 26, on an interlayer insulating film 29, metal wiring layers 51 functioning as the word lines WL0 to WLm are formed into stripe-shaped liens extending in the easy-axis direction. A plurality of magneto-resistive elements 20 are formed on the metal wiring layers 51. The shape of the magneto-resistive element 20 is as explained in the first embodiment. An interlayer insulating film 52 covering the metal wiring layers 51 and magneto-resistive elements 20 is formed on the interlayer insulating film 29.

Metal wiring layers 22 connected to the ferromagnetic layers 35 of the magneto-resistive elements 20 are formed on the interlayer insulating film 52. The metal wiring layer 22 functions as withdrawing wiring layer for the magneto-resistive element 20. Further on the interlayer insulating film 52, an interlayer insulating film 53 is formed so as to cover the metal wiring layers 22.

In the interlayer insulating film 53, contact plugs 50 connected to the metal wiring layers 22 are formed. Then, on the interlayer insulating film 53, metal wiring layers 54 connected to the contact plugs 50 and metal wiring layers 55 isolated from the metal wiring layers 54 are formed into stripe-shaped lines extending in the hard-axis direction (perpendicular to the drawing sheet). The metal wiring layers 54 function as the select bit lines SBL0 to SBLn. The metal wiring layers 55 function as the write bit lines WBL0 to WBLn. The metal wiring layers 55 are provided so as to be located nearly right above the magneto-resistive elements 20. Further an interlayer insulating film 56 is formed on the interlayer insulating film 53.

Figure 27:
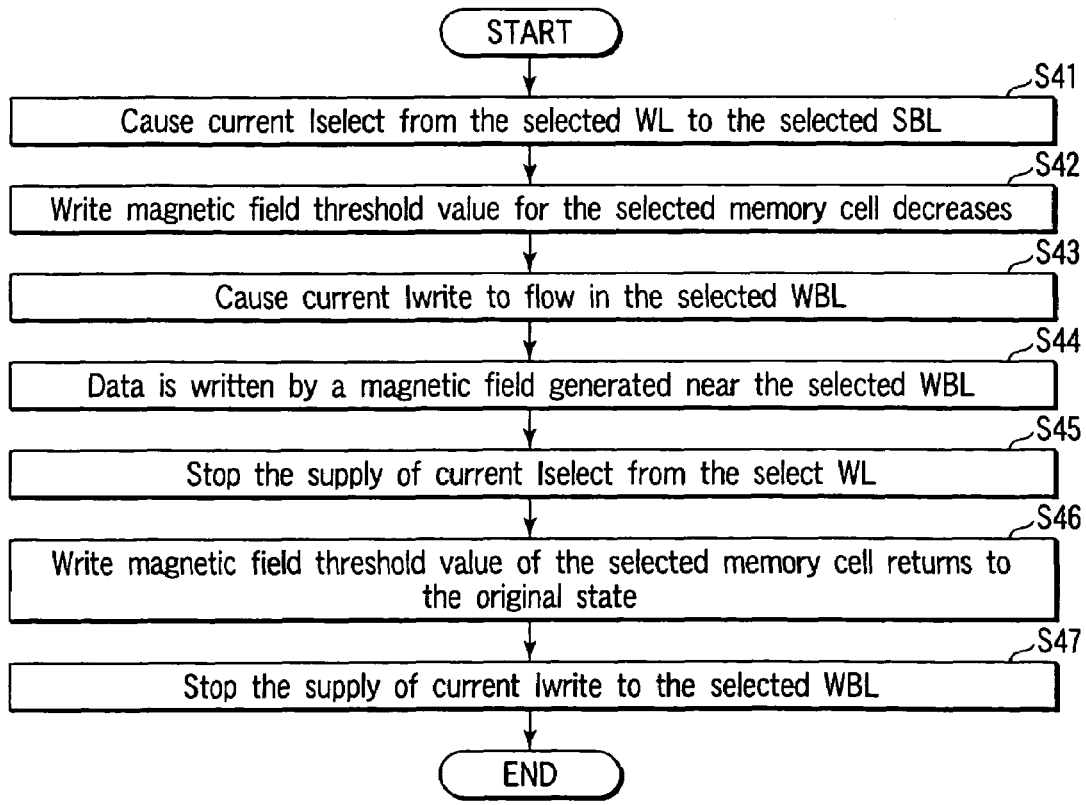
FIG. 27 is a flowchart for a method of writing data into the MRAM according to the fourth embodiment.

Next, the operation of the MRAM configured as described above will be explained by reference to FIGS. 24 and 27. A write operation will be explained using a case where data is written into memory cell MC11 provided at the intersection of word line WL1 and select bit line SBL1 (write bit line WBL1). FIG. 27 is a flowchart for a write operation in the MRAM of the fourth embodiment.

Figure 28:
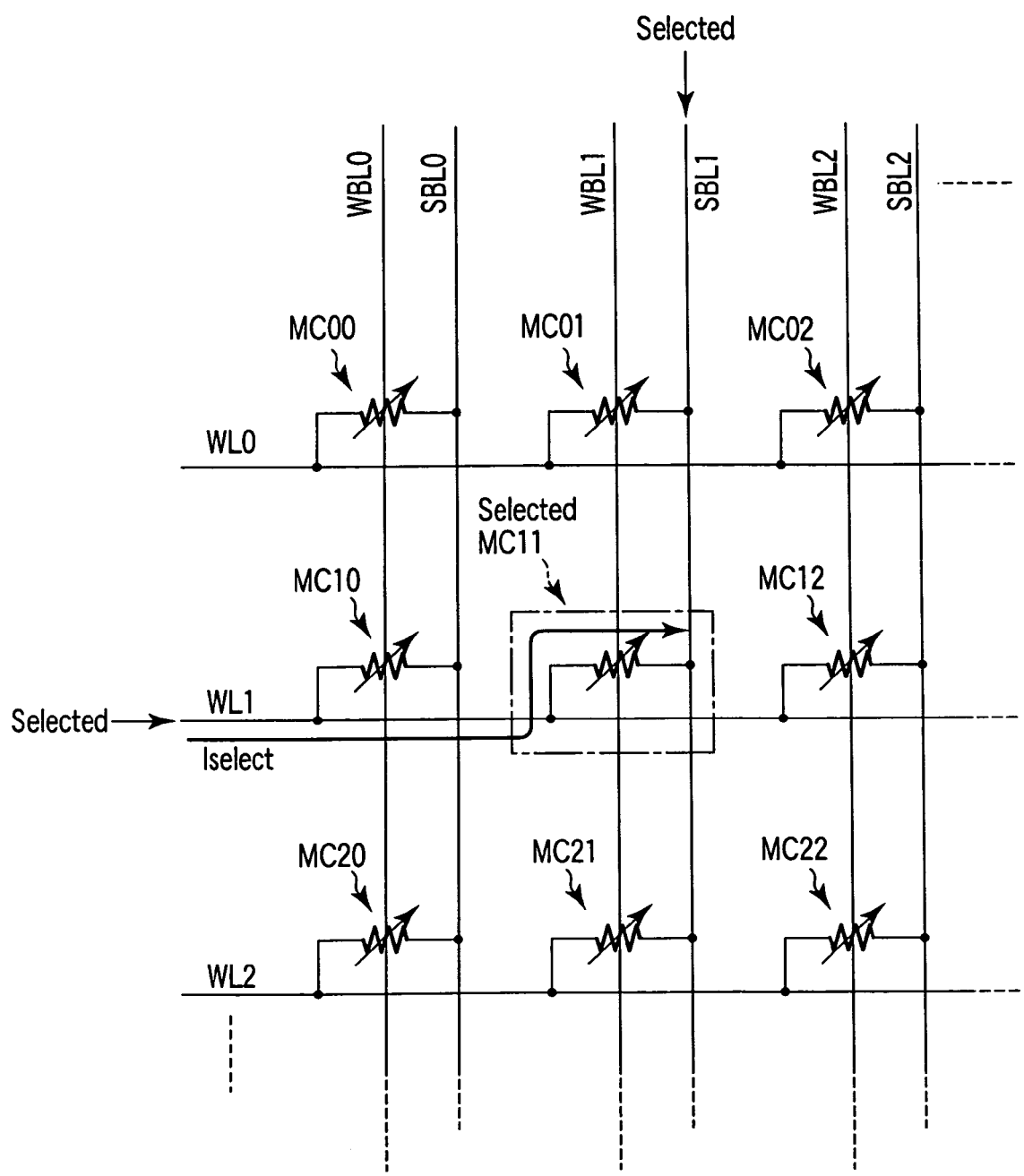
FIG. 28 is a circuit diagram of a memory cell array in a write operation in the MRAM according to the fourth embodiment.

In step S41 of FIG. 27, current Iselect is caused to flow from word line WL1 connected to the selected memory cell MC11 to select bit line SBL1 via the tunnel junction of the magneto-resistive element 20. Specifically, the select bit line driver 110 selects select bit line SBL1 on the basis of a column address decode signal. At this time, the select bit line driver 110 functions as a current sink. Next, the word line driver 150 selects word line WL1 on the basis of a row address decode signal. Then, the word line driver 150 supplies a current Iselect of about 100 μA to word line WL1. This is shown in FIG. 28. FIG. 28 is a circuit diagram of a part of the memory cell array 11.

As shown in FIG. 28, with bit line SBL1 being selected, current Iselect is supplied to word line WL1. Although one end of each of the word lines WL0 to WLm is connected to the word line driver 150, the other ends are connected to, for example, the memory cells MCm0 to MCmn or brought into the floating state. As a result, current Iselect flows from the word line driver 150, passes through the tunnel junction of the magneto-resistive element 20 of memory cell MC11, and flows into the select bit line driver 110.

Then, as explained in the first embodiment, Joule heat is generated at the magneto-resistive element of memory cell MC1, leading to a decrease in the write magnetic field (current) threshold value (step S42).

Figure 29:
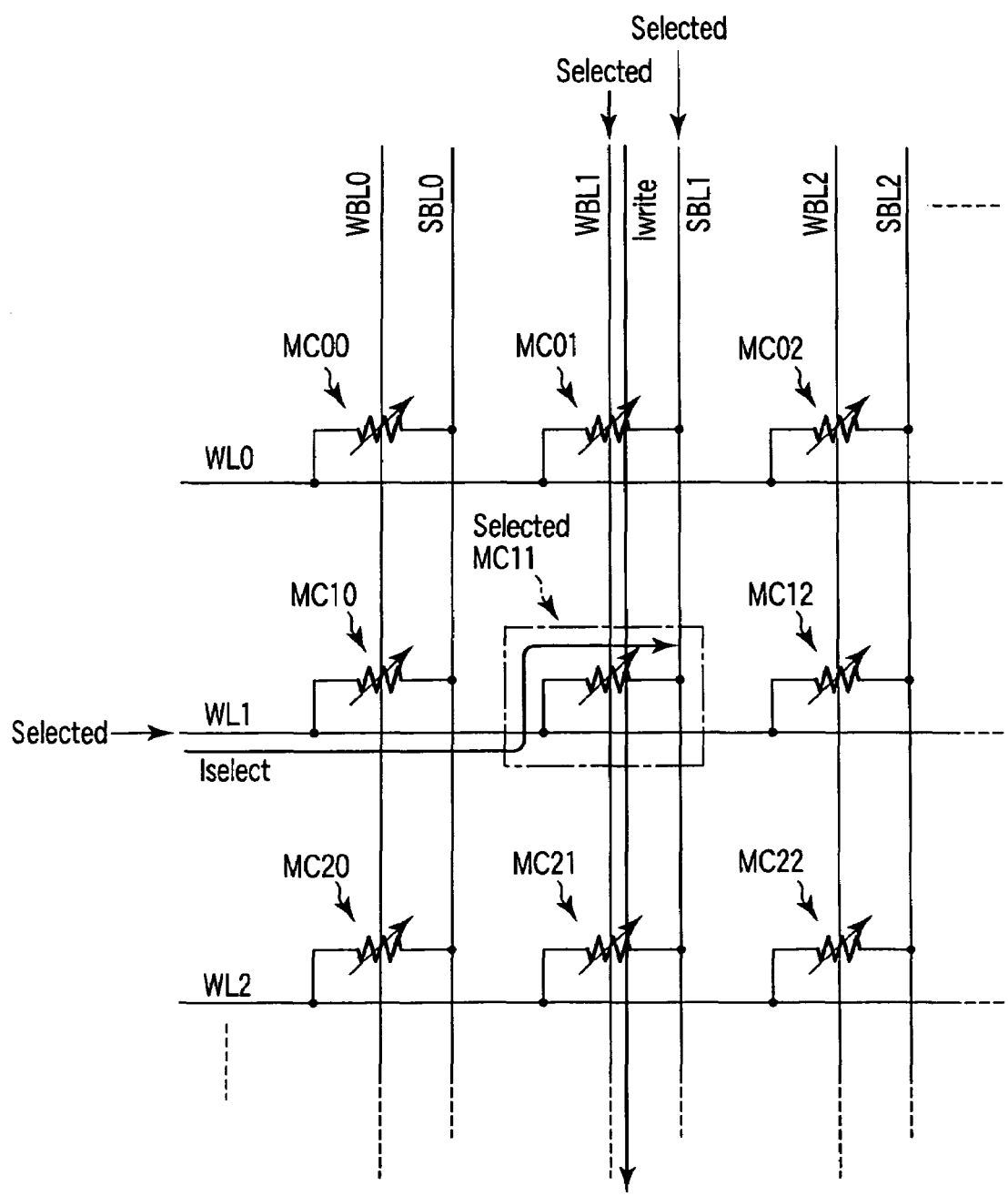
FIG. 29 is a circuit diagram of the memory cell array in a write operation in the MRAM according to the fourth embodiment.

Next, the write bit line drivers 120, 130 select write bit line WBL1. Then, the write bit line driver 120 supplies a current Iwrite of about 500 μA to write bit line WBL1 (step S43). This is shown in FIG. 29. FIG. 29 is a circuit diagram of a part of the memory cell array 11.

As shown in FIG. 29, with current Iselect flowing in the magneto-resistive element 20 of memory cell MC11, current Iwrite is caused to flow through write bit line WBL1. Then, because of the magnetic field produced by current Iwrite, data is written into the magneto-resistive element 20 of memory cell MC11 (step S44).

Thereafter, select bit line SBL1 and word line WL1 are made unselected and the supply of current Iselect is stopped (step S45). As a result, the write magnetic field threshold value of the magneto-resistive element 20 of memory cell MC11 returns to the original value (step S46). Then, write bit line WBL1 is made unselected and the supply of current Iwrite is stopped (step S47).

In this way, the data has been written.

Next, a read operation will be explained using a case where the data is read from memory cell MC11. Since the data reading method is almost the same as a conventional one, it will be explained briefly. FIG. 30 is a circuit diagram of a part of the memory cell array 11 in a read operation.

As shown in FIG. 30, the word line driver 150 selects word line WL1. At this time, the word line driver 150 functions as a current sink. The select bit line driver 110 selects select bit line SBL1. As a result, the select bit line driver 110 supplies current Iread to select bit line SBL1. Then, the sense amplifier 13 amplifies a change in the potential on the select bit line SBL1 and outputs the amplified potential as a read-out voltage.

The MRAM with cross-point memory cells controlling the writing data by current flowing in the bit line in the fourth embodiment produces the effects explained in items (1) to (5) in the first embodiment. In addition, the writing method and the reading method explained in the second embodiment can be applied to the fourth embodiment. That is, selecting a plurality of bit lines enables a plurality of data items to be written or read at the same time. This method produces the effect in item (6) explained in the second-embodiment.

In the fourth embodiment, the word line driver 150 supplies current Iselect. Since current Iselect has only to be caused to flow through the tunnel junction of the magneto-resistive element, for example, the select bit line driver 110 may supply current Iselect.

Figure 31:
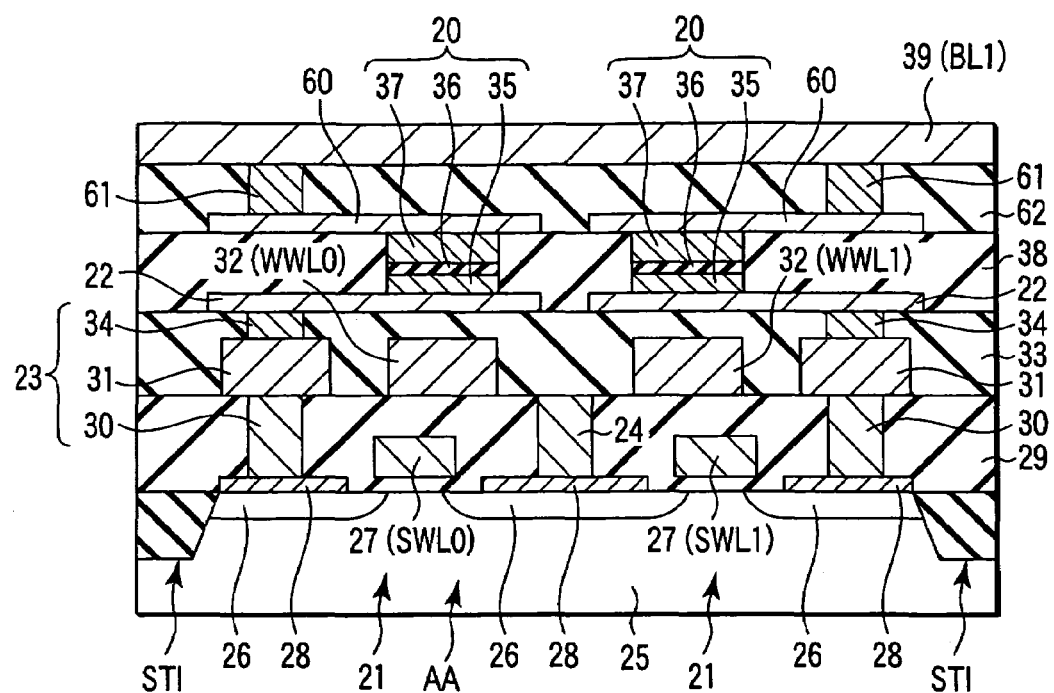
FIG. 31 is a sectional view of an MRAM according to a fifth embodiment of the present invention, which is taken along line 3-3 of FIG. 2.

Next, a semiconductor memory device according to a fifth embodiment of the present invention will be explained by reference to FIG. 31. The configuration of the fifth embodiment is such that contact plugs are not formed right above or under the magneto-resistive elements in the first to fourth embodiments. FIG. 31 is a sectional view of an MRAM according to the fifth embodiment, which is taken along line 3-3 of FIG. 2 in the first and second embodiments.

As shown in FIG. 31, the configuration of the fifth embodiment is such that the ferromagnetic layers (free layers) 37 of the magneto-resistive elements 20 are connected to the bit lines 39 with withdrawing wiring layers 60 in the configuration of FIG. 2. Specifically, in the configuration of FIG. 2, the metal wiring layers 60 are formed on the interlayer insulating film 38. The metal wiring layers 60, which are connected to the ferromagnetic layers 37 of the magneto-resistive elements 20, are formed to regions right above the contact plugs 34, 30. An interlayer insulating film 62 is formed on the interlayer insulating film 38. Metal wiring layers 39 functioning as bit lines are formed on the interlayer insulating film 62. Contact plugs 61 are formed in the interlayer insulating film 62. The withdrawing wiring layers 60 and the bit line 39 are connected via the contact plugs 61. The contact plugs 61 do not exist right above the magneto-resistive elements 20. For example, they are formed right above the contract plugs 30, 34.

Figure 32:
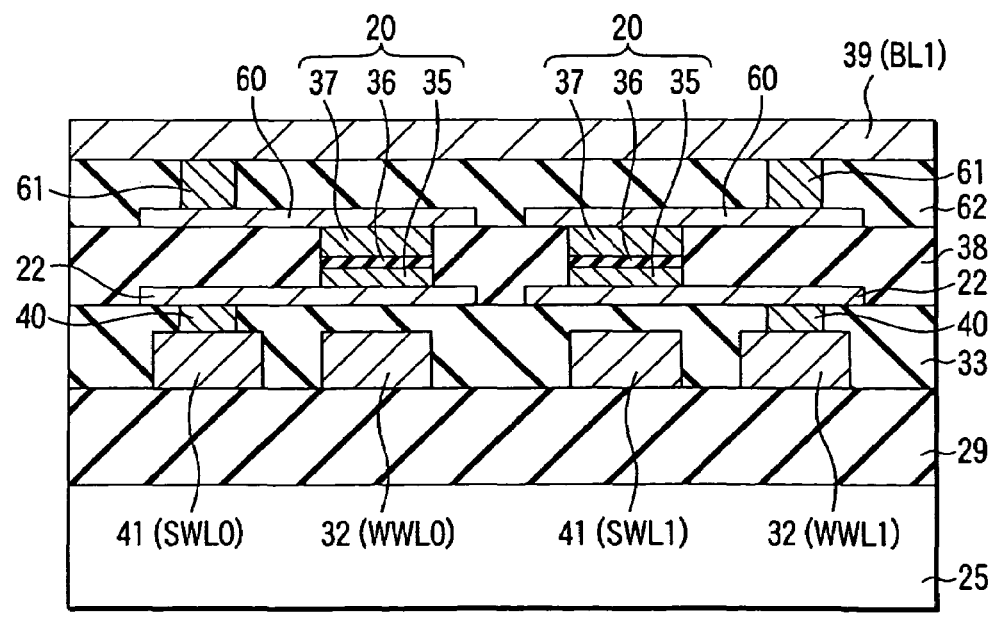
FIG. 32 is a sectional view of the MRAM according to the fifth embodiment, which is taken along line 19-19 of FIG. 18.

FIG. 32 is a sectional view of the MRAM according to the fifth embodiment, which is taken along line 19-19 of FIG. 18 explained in the third embodiment.

As shown in FIG. 32, the configuration is such that the ferromagnetic layers (free layers) 37 of the magneto-resistive elements 20 are connected to the bit lines 39 with the withdrawing wiring layers 60 in the configuration of FIG. 18.

Figure 33:
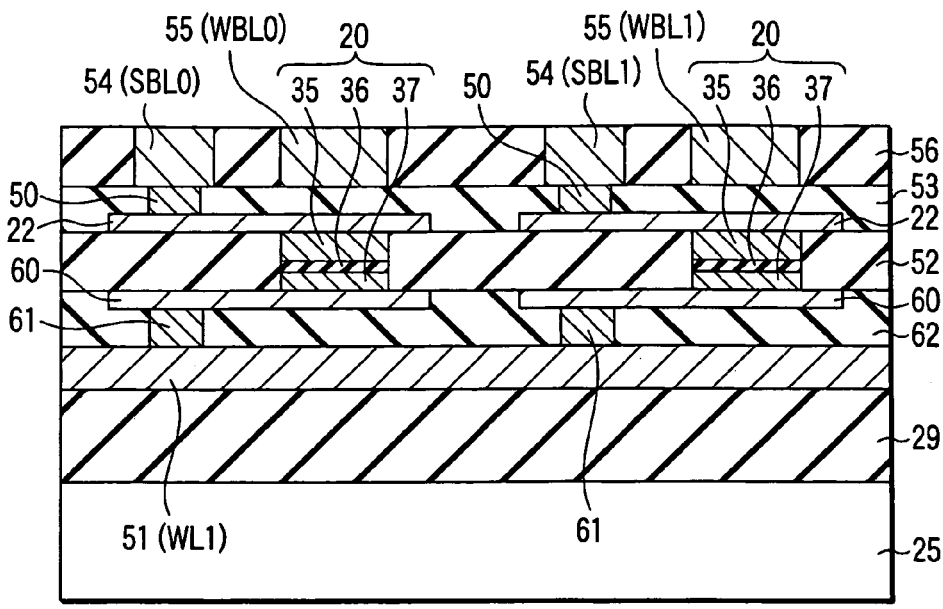
FIG. 33 is a sectional view of the MRAM according to the fifth embodiment, which is taken along line 26-26 of FIG. 25.

FIG. 33 is a sectional view of the MRAM according to the fifth embodiment, which is taken along line 26-26 of FIG. 25.

As shown in FIG. 33, the configuration of the fifth embodiment is such that the ferromagnetic layers (free layers) 37 of the magneto-resistive elements 20 are connected to the word lines 51 with the withdrawing wiring layer 60 in the configuration of FIG. 18. Specifically, in the configuration of FIG. 18, an interlayer insulating film 62 is formed on the word lines 51. Contact plugs 61 are formed in the interlayer insulating film 62. The contact plugs 61 are connected to the word lines 51 and located right under, for example, the contact plugs 50. Metal wiring layers 60 are formed on the interlayer insulating film 62. Then, magneto-resistive elements 20 are formed on the metal wiring layers 60. That is, the contact plugs do no exist right under the magneto-resistive elements 20.

The configuration of the fifth embodiment produces not only the effects in items (1) to (7) explained in the first to fourth embodiments but also the effect in item (8) below.

(8) The magneto-resistive elements are caused to generate heat effectively.

In a case where current is caused to flow in the magneto-resistive elements, generating Joule heat and therefore raising the temperature of the magneto-resistive elements, the heat escapes from the part whose thermal conductivity is high. Therefore, if the magneto-resistive elements are brought into contact with the metal wiring layers (word lines or bit lines) right above or under the magneto-resistive elements, heat is liable to escape easily. As a result, most of the heat dissipates, which makes it difficult to raise the temperature of the magneto-resistive elements effectively. Accordingly, the value of current Iselect may have to be increased.

With the configuration of the fifth embodiment, however, the magneto-resistive elements are brought into contact with the word lines or bit lines in regions other than the regions right above or under the magneto-resistive elements. That is, in the regions right above or under the magneto-resistive elements, there is no contact plug or no contact part with any word line or bit line. Therefore, the heat generated at the tunnel barriers of the magneto-resistive-elements is less liable to escape, which enables the magneto-resistive elements to be heated effectively. As a result, current Iselect can be decreased, which further reduces the power consumption of the MRAM.

Next, a semiconductor memory device according to a sixth embodiment of the present invention will be explained. The sixth embodiment is such that cavities are made in the interlayer insulating films around the magneto-resistive elements in the first to fifth embodiments.

Figure 34:
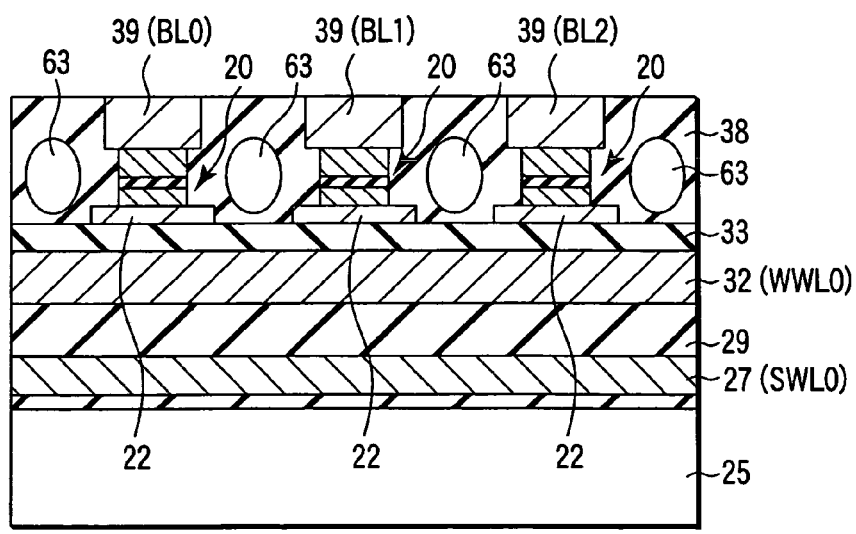
FIG. 34 is a sectional view of an MRAM according to a sixth embodiment of the present invention, which is taken along line 34-34 of FIG. 2.
Figure 35:
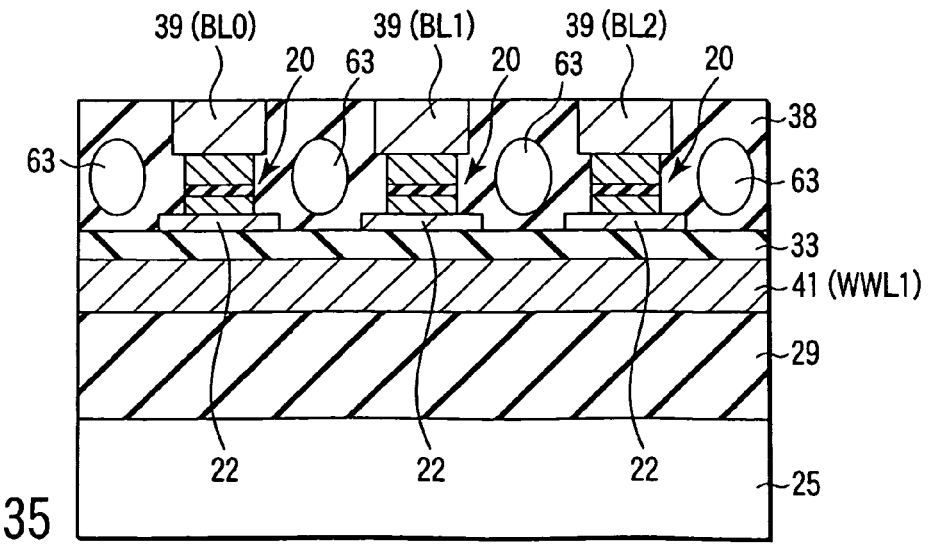
FIG. 35 is a sectional view of the MRAM according to the sixth embodiment, which is taken along line 35-35 of FIG. 18.
Figure 36:
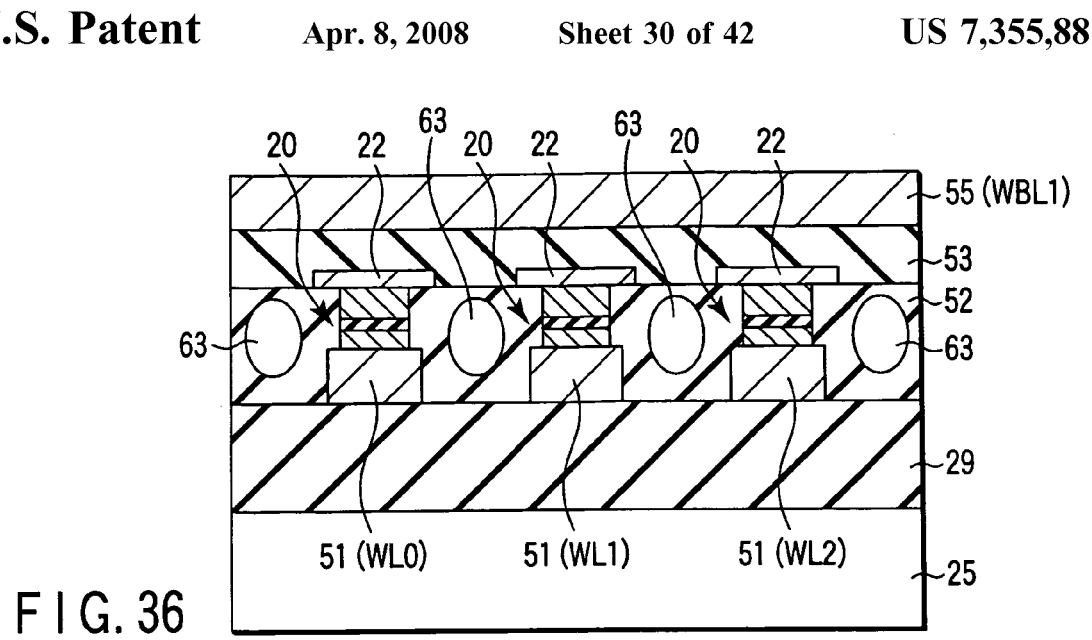
FIG. 36 is a sectional view of the MRAM according to the sixth embodiment, which is taken along line 36-36 of FIG. 25.
Figure 37:
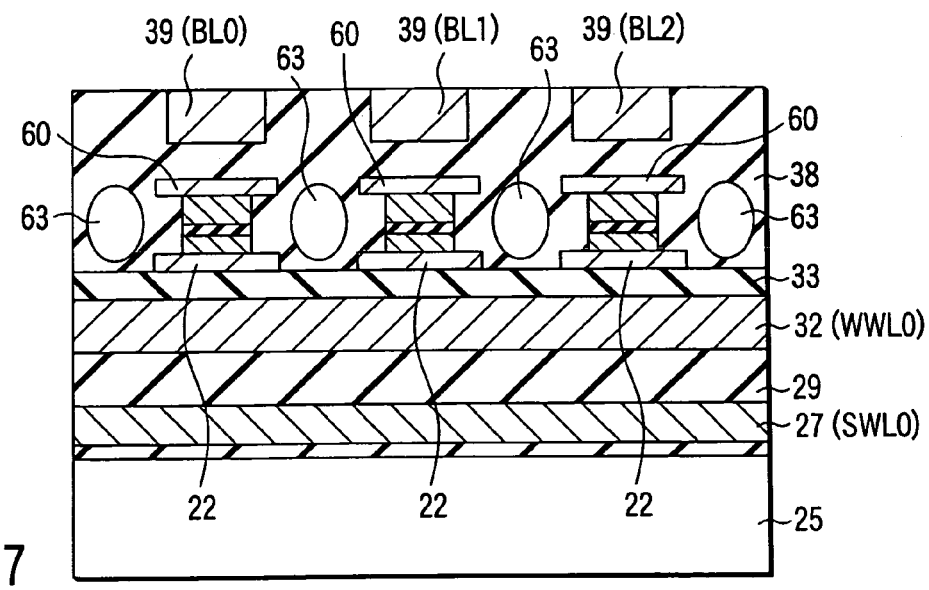
FIG. 37 is a sectional view of an MRAM according to the sixth embodiment, which is taken along line 34-34 of FIG. 2.
Figure 38:
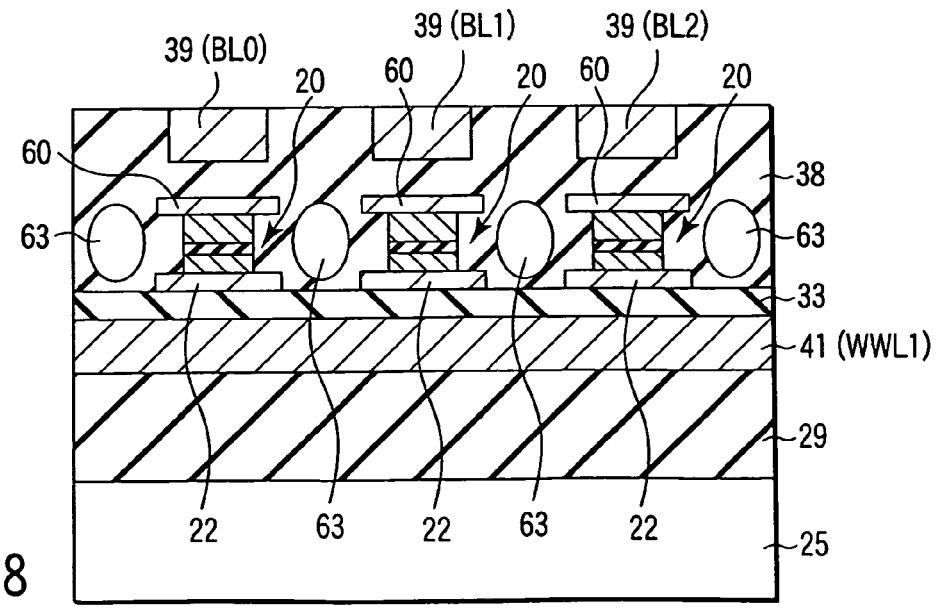
FIG. 38 is a sectional view of the MRAM according to the sixth embodiment, which is taken along line 35-35 of FIG. 18.
Figure 39:
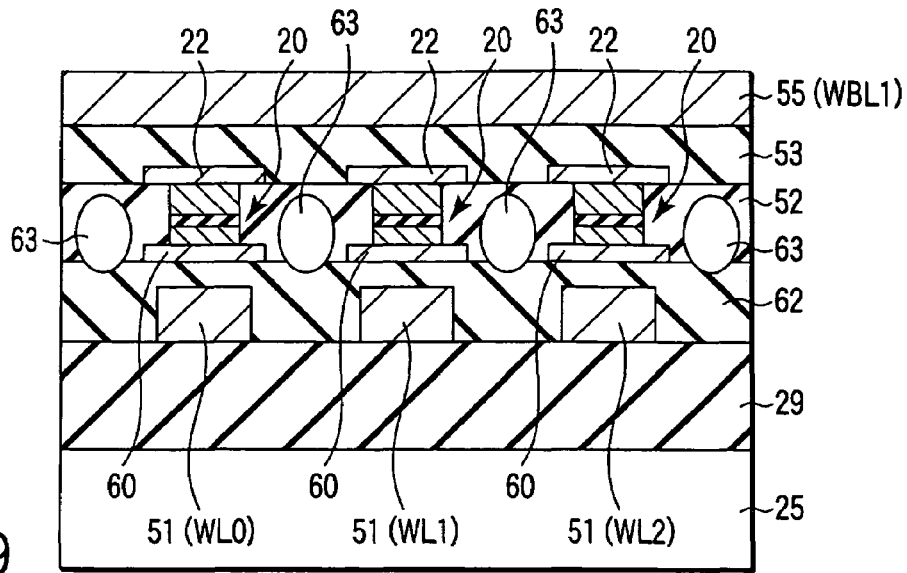
FIG. 39 is a sectional view of the MRAM according to the sixth embodiment, which is taken along line 36-36 of FIG. 25.

FIGS. 34 to 39 are sectional views of the memory cell array in an MRAM according to the sixth embodiment. FIG. 34 is a sectional view of the memory cell array corresponding to the configuration explained in the first and second embodiments, which is taken along line 34-34 of FIG. 2. FIG. 35 is a sectional view of the memory cell array corresponding to the configuration explained in the third embodiment, which is taken along line 35-35 of FIG. 18. FIG. 36 is a sectional view of the memory cell array corresponding to the configuration explained in the fourth embodiment, which is taken along line 36-36 of FIG. 25. FIGS. 37 to 39 are sectional views of the memory cell array corresponding to the configuration explained in the fifth embodiment, which are taken along line 34-34 of FIG. 2, along line 35-35 of FIG. 18, and along line 36-36 of FIG. 25.

As shown in the figures, in the configurations explained in the first to fifth embodiments, cavities 63 is made in the interlayer insulating film between adjacent magneto-resistive elements 20, 20.

The MRAM of the sixth embodiment produces not only the effects in items (1) to (8) explained in the first to fifth embodiments but also the following effects in items (9) and (10).

(9) The magneto-resistive elements can be caused to generate heat more effectively.

As described above, the heat generated at the magneto-resistive elements escape through the metal wiring layers. In addition to this, the heat dissipates through the surrounding interlayer insulating films. In the configuration of the sixth embodiment, cavities 63 are made around the magneto-resistive elements. Cavities have generally very low thermal conductivity. Therefore, it is possible to prevent heat from dissipate through the interlayer insulating films. As a result, the magneto-resistive elements can be heated to high temperature effectively, which reduces the power consumption of the MRAM more.

(10) The reliability of write operations can be increased.

In the case of heavily miniaturized MRAMs, unselected memory cells are affected by the heat generated at the adjacent selected memory cell, resulting in a decrease in their write threshold value, which can lead to the occurrence of erroneous writing. With the configuration of the sixth embodiment, the cavities 63 can suppress the conduction of heat to the adjacent unselected memory cells effectively. Consequently, the occurrence of erroneous writing is suppressed, which improves the reliability of write operations.

As described above, the cavities 63 are, so to speak, thermal conduction preventing regions to hinder the conduction of heat. Accordingly, the thermal conduction preventing regions are not necessarily limited to cavities, as long as they can hinder the conduction of heat. For instance, in place of the cavities, the regions may be made of a material whose thermal conductivity is lower than that of the interlayer insulating film.

Figure 40:
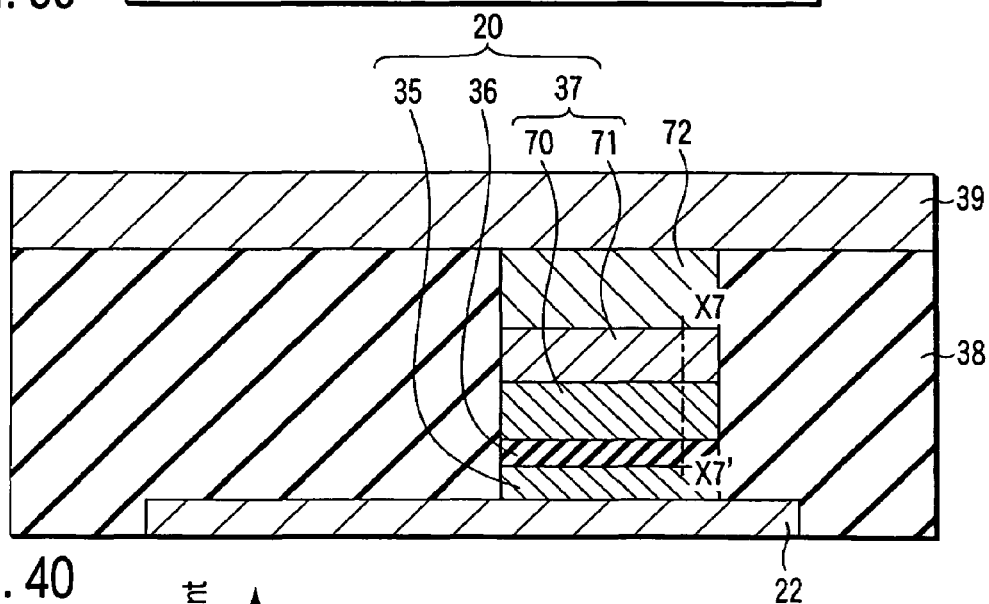
FIG. 40 is a sectional view of a part of a memory cell provided in an MRAM according to a seventh embodiment of the present invention.

Next, a seventh embodiment of the present invention will be explained. The seventh embodiment is such that the write threshold value of the magneto-resistive elements is lowered by contriving materials for free layers in the first to sixth embodiments. FIG. 40 is a sectional view of the configuration of an MRAM according to the seventh embodiment, particularly a magneto-resistive element and its vicinity. FIG. 40 shows only a on the withdrawing wiring layer 22 and the regions above the on the withdrawing wiring layer 22 in the sectional views explained in the first to sixth embodiments.

As shown in FIG. 40, a magneto-resistive element 20 is formed on the withdrawing wiring layer 22. The withdrawing wiring layer 22 is composed of a stacked layer obtained by forming, for example, a 3-nm-thick Ta layer, a 30-nm-thick Al layer, and a 30-nm-thick Ta layer sequentially. The magneto-resistive element 20 includes a pinning layer 35, a tunnel barrier layer 36, and a free layer 37. The pinning layer 35 is formed of a stacked layer obtained by forming, for example, a 3-nm-thick permalloy layer (Py: 80% NiFe alloy), a 15-nm-thick IrMn layer, and a 5-nm-thick CoFe layer sequentially on the withdrawing wiring layer 22. The tunnel barrier film 36 is made of, for example, a 1.5-nm-thick $Al_2O_3$ film. The free layer 37 is formed of a stacked layer obtained by forming, for example, a 10-nm-thick 45% NiFe layer 70 and a 10-nm-thick 35% NiFe layer 71 sequentially on the tunnel barrier film 36. Of the two. NiFe layers 70, 71, the NiFe layer 70 functions as a practical free layer. Furthermore, a cap layer 72 is formed on the free layer 37. The cap layer 72 is formed of a stacked layer obtained by forming, for example, a 20-nm-thick Ta layer, a 50-nm-thick Al layer, and a 10-nm-thick Ta layer sequentially. The top of the cap layer 72 is connected to a metal wiring layer 39 serving as a bit line.

Figure 41:
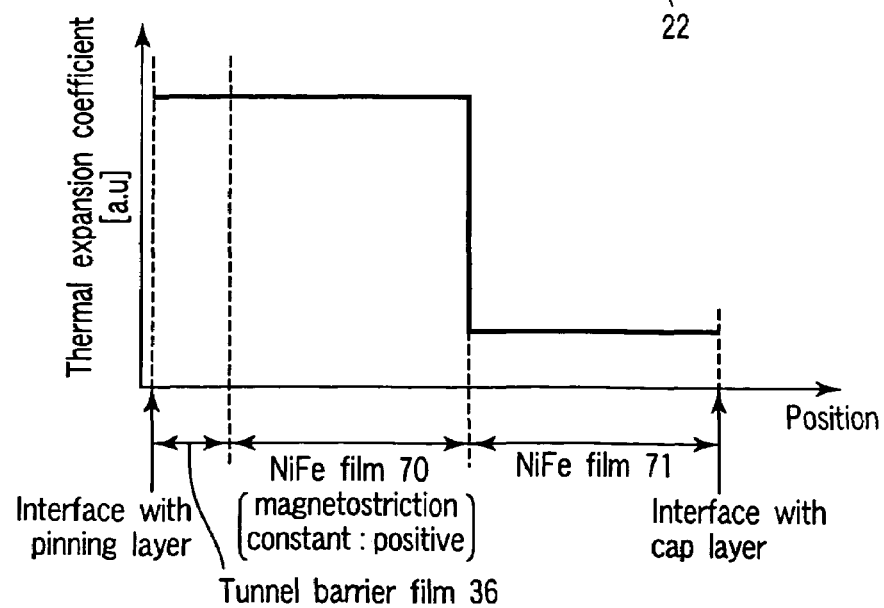
FIG. 41 is a graph showing the thermal expansion coefficients of a tunnel barrier film and a free layer in a magneto-resistive element provided in the MRAM according to the seventh embodiment.

FIG. 41 is a graph showing the thermal expansion coefficients of the individual layers taken along line X7-X7' of FIG. 40.

As shown in FIG. 41, the tunnel barrier film 36 and the 45% NiFe layer 70 in contact with the tunnel barrier film 36 have the same thermal expansion coefficient. The value of the thermal expansion coefficient is, for example, $6.5 \times 10^{-6}$/K. The 45% NiFe layer 70 has a positive magnetostriction constant of, for example, $2 \times 10^{-5}$. On the other hand, the 35% NiFe layer 71, which is formed on the 45% NiFe layer 70 and contacts the cap layer 72, has a lower thermal expansion coefficient than that of the 45% NiFe layer 70. The value of the thermal expansion coefficient is, for example, $1 \times 10^{-7}$/K.

The configuration of the seventh embodiment produces not only the effects in items (1) to (10) explained in the first to sixth embodiments but also the following effect in item (11).

(11) The write threshold value of the magneto-resistive elements can be decreased effectively. This will be explained in detail below.

In the first to sixth embodiments, current is caused to flow in the magneto-resistive element, thereby heating the element to high temperature, which results in a decrease in the write threshold magnetic field of the magneto-resistive element. Then, the following fear may arise. When the magneto-resistive element has low heat resistance, there is a possibility that metal atoms in Ir and others in the antiferromagnetic film will diffuse at a temperature of, for example, 400° C. or higher and therefore the characteristics of the magneto-resistive element will deteriorate. Thus, when the temperature necessary to decrease the write threshold value of the magneto-resistive element is about 400° C. or higher because of the configuration of the MRAM, many hours of use degrade the characteristics of the magneto-resistive element, which may contribute to a decrease in the reliability of the MRAM.

Figure 42:
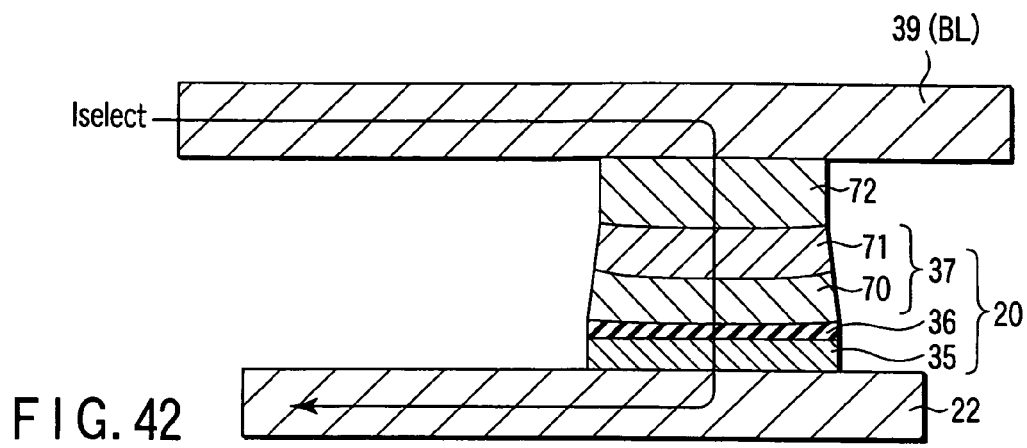
FIG. 42 is a sectional view of a part of a memory cell provided in the MRAM according to the seventh embodiment.

However, with the configuration of the seventh embodiment, the free layer 37 is formed by stacking alloys which each include Ni and Fe elements but differ in Ni content. Then, one of the alloys whose thermal expansion coefficient is higher is formed so as to make contact with the tunnel barrier film and the other alloy whose thermal expansion coefficient is lower is formed so as to make contact with the cap layer. FIG. 42 schematically shows a case where current Iselect is supplied to a magneto-resistive element. When current Iselect is caused to flow in the magneto-resistive element in a write operation, the individual layers forming the magneto-resistive element expand according to the respective thermal expansion coefficients of the corresponding materials. In the free layer 37, since the NiFe layer 70 has almost the same thermal expansion coefficient as that of the tunnel barrier film 36, it has almost the same degree of expansion as that of the tunnel barrier film. However, since the NiFe layer 71 has a lower thermal expansion coefficient, it has a smaller degree of expansion than that of the NiFe layer 70. Accordingly, in the NiFe layer 70 in contact with the NiFe layer 71, compressive stress develops. Since the NiFe layer 70 has a positive magnetostriction constant, the direction of spin in the NiFe layer 70 rotates in such a manner that it deviates from the easy-axis direction because of the adverse effect of magnetostriction. As a result, the write threshold magnetic field decreases. That is, because of not only Joule heat but also the adverse effect of magnetostriction, the write threshold magnetic field decreases. As a result, a write operation with a much smaller write current Iwrite is possible.

To realize the decrease of the write threshold magnetic field effectively, it is desirable that the absolute value of the magnetostriction constant should be larger than $5 \times 10^{-6}$, more preferably about $2 \times 10^{-5}$ as in the seventh embodiment.

Stopping the supply of current Iselect to the selected memory cell causes the temperature of the selected memory cell to drop, which alleviates the stress developing in the free layer. Therefore, the write threshold magnetic field increases again (or returns to the original), which prevents erroneous writing.

Figure 43:
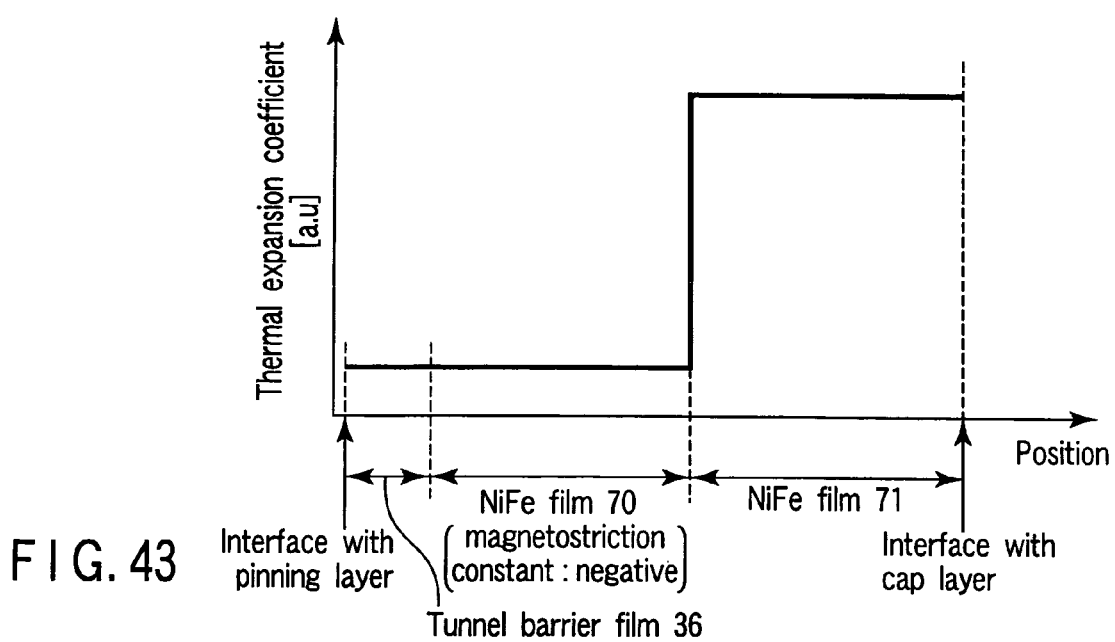
FIG. 43 is a graph showing the thermal expansion coefficients of a tunnel barrier film and a free layer in a magneto-resistive element provided in an MRAM according to a modification of the seventh embodiment.

FIG. 43 is a graph showing the thermal expansion coefficients of a magneto-resistive element in an MRAM according to a modification of the seventh embodiment. More particularly, FIG. 43 is a graph showing the thermal expansion coefficients of the individual layers taken along line X7-X7' of FIG. 40.

As shown in FIG. 43, when the NiFe layer 70 has a negative magnetostriction constant, if the thermal expansion coefficient of the NiFe layer 71 is made larger than that of the NiFe layer 70, the same effects as those in the seventh embodiment will be obtained.

To realize a sufficient change in the write threshold value, that is, a change in the direction of spin, it is desirable that the magnetostriction constant of the NiFe layer 70 functioning as a practical free layer should have an absolute value of about $1 \times 10^{-5}$ or more.

In the seventh embodiment, the NiFe layer 71 has been a part of the free layer. However, as described above, it is the NiFe layer 70 that functions as a practical free layer. In contrast, the NiFe layer 71 is, so to speak, a stress applying layer to apply stress to the NiFe layer 70. Therefore, when the magnetostriction constant of the free layer 37 is positive, a layer whose thermal expansion coefficient is lower than that of the free layer 37 may be formed additionally on the free layer 37. Of course, when the magnetostriction constant of the free layer 37 is negative, a layer to be formed additionally on the free layer 37 is made of a material whose thermal expansion coefficient is larger than that of the free layer 37. In this case, the stress applying layer on the free layer 37 is not limited to a magnetic material and may be made of a nonmagnetic material or the like.

Furthermore, it is desirable that the thermal expansion coefficient of the layer (in the seventh embodiment, the NiFe layer 70) in contact with the tunnel barrier film 36 should be almost the same as that of the tunnel barrier film 36. This enables the stress applied to the tunnel barrier film 36 to be decreased, which improves the reliability of the MRAM for long-term use.

Figure 44:
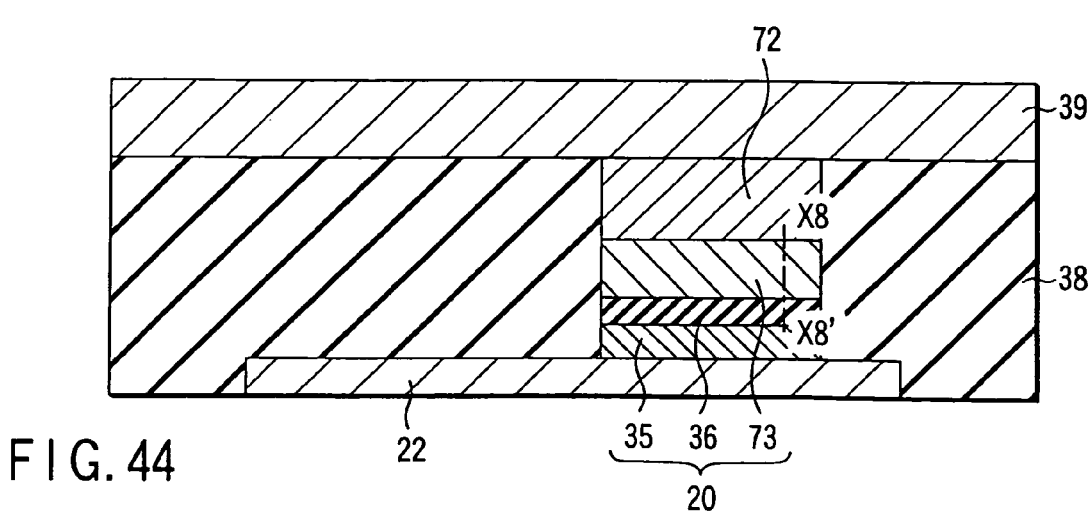
FIG. 44 is a sectional view of a part of a memory cell provided in an MRAM according to an eighth embodiment of the present invention.

Next, a semiconductor memory device according to an eighth embodiment of the present invention will be explained. The eighth embodiment is such that the write threshold value is decreased through the influence of magnetostriction by contriving materials for free layers as in the seventh embodiment. FIG. 44 is a sectional view of the configuration of an MRAM according to the eighth embodiment, particularly a magneto-resistive element and its vicinity. FIG. 44 shows only a withdrawing wiring layer 22 and the regions above the withdrawing wiring layer 22.

As shown in FIG. 44, a magneto-resistive element 20 is formed on a withdrawing wiring layer 22. The magneto-resistive element 20 includes a pinning layer 35, a tunnel barrier film 36, and a free layer 73. As described in the seventh embodiment, the pinning layer 35 is formed of, for example, a CoFe/IrMn/Py stacked layer. The tunnel barrier layer 36 is formed of, for example, an $Al_2O_3$ film. The free layer 73 is formed of, for example, an NiFe alloy. A cap layer 71 is formed on the free layer 73. A metal wiring layer 39 is formed on the cap layer 71. The free layer 73 has a positive magnetostriction constant. In the NiFe alloy out of which the free layer 73 is formed, its Ni content changes and decreases continuously from the tunnel barrier film 36 toward the cap layer 71.

Figure 45A:
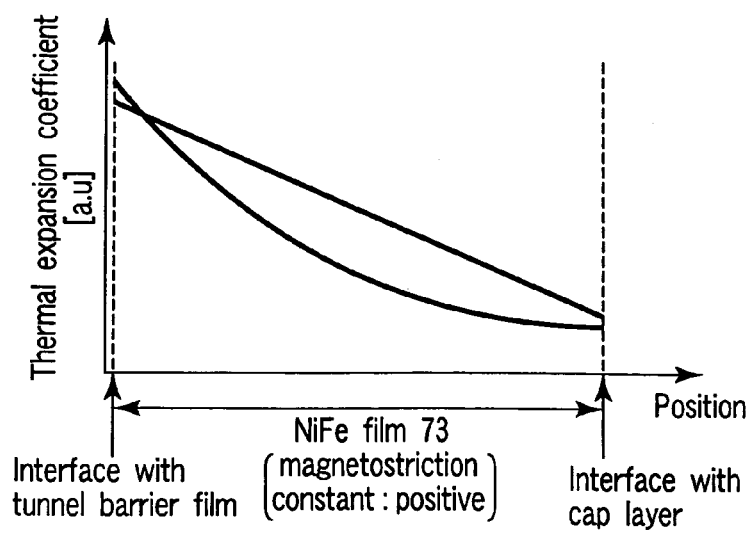
FIG. 45A is a graph showing the thermal expansion coefficient of a free layer of a magneto-resistive element provided in the MRAM according to the eighth embodiment in a case where the magnetostriction constant is positive.

FIG. 45A is a graph showing the thermal expansion coefficient of the free layer 73 along line X8-X8' of FIG. 44.

As shown in FIG. 45A, the thermal expansion coefficient of the free layer 73 changes continuously from the interface with the tunnel barrier film 36 toward the interface with the cap layer 71 in such a manner that it decreases according to a linear function or an n-th-degree function. This is because the Ni content in the NiFe alloy decreases.

The configuration of the eighth embodiment produces the same effect as described in item (11) in the seventh embodiment. The thermal expansion coefficient is changed in the free layer 73 without stacking two layers different in thermal expansion coefficient as in the seventh embodiment, which produces the same effect as that of the seventh embodiment.

Figure 45B:
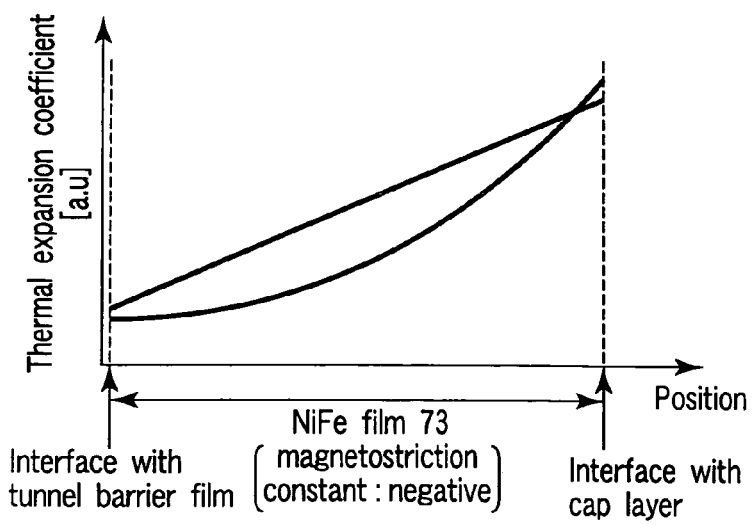
FIG. 45B is a graph showing the thermal expansion coefficient of a free layer of a magneto-resistive element provided in the MRAM according to the eighth embodiment in a case where the magnetostriction constant is negative.

FIG. 45B is a graph showing the thermal expansion coefficients of a magneto-resistive element in an MRAM according to a modification of the eighth embodiment. More particularly, FIG. 45B is a graph showing the thermal expansion coefficients of the individual layers taken along line X8-X8' of FIG. 44.

As shown in FIG. 44, when the free layer 73 has a negative magnetostriction constant, if the Ni content is increased from the interface with the tunnel barrier film 36 toward the interface with the cap layer 71, the same effects as those in the eighth embodiment will be obtained.

As described above, it is desirable that the thermal expansion coefficient of the free layer 73 at the interface with the tunnel barrier film 36 should be almost the same as that of the tunnel barrier film 36.

Figure 46:
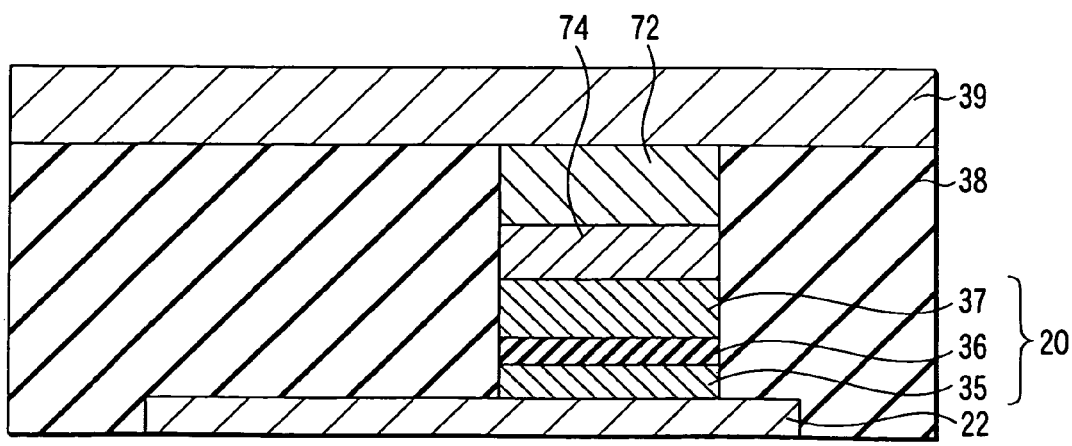
FIG. 46 is a sectional view of a part of a memory cell provided in an MRAM according to a ninth embodiment of the present invention.

Next, a semiconductor memory device according to a ninth embodiment of the present invention will be explained. The ninth embodiment is such that a piezoelectric effect film is formed on the free layer in the first to sixth embodiments. FIG. 46 is a sectional view of the configuration of an MRAM according to the ninth embodiment, particularly a magneto-resistive element and its vicinity. FIG. 46 shows a withdrawing wiring layer 22 and the regions above the withdrawing wiring layer 22.

As shown in FIG. 46, a magneto-resistive element 20 is formed on a withdrawing wiring layer 22. The magneto-resistive element 20 includes a pinning layer 35, a tunnel barrier film 36, and a free layer 37. As described in the seventh embodiment, the pinning layer 35 is formed of, for example, a CoFe/IrMn/Py stacked layer. The tunnel barrier layer 36 is formed of, for example, an $Al_2O_3$ film. The free layer 37 is composed of, for example, an NiFe alloy. A piezoelectric effect element 74 is formed on the free layer 37. A cap layer 71 is formed on the piezoelectric effect film 74. The piezoelectric effect film may be made of, for example, $Pb(Zr, Ti)O_3$ or PZT. Any material may be used as the piezoelectric effect film, as long as it produces a piezoelectric effect.

The configuration of the ninth embodiment produces not only the effects in items (1) to (10) explained in the first to sixth embodiments but also the effect in item (12) explained below.

(12) The write threshold value of the magneto-resistive elements can be decreased effectively.

This effect is obtained in almost the same manner as in item (11). With the configuration of the ninth embodiment, the piezoelectric effect film 74 is formed on the free layer 37. The piezoelectric effect film is distorted by the application of an electric field. Therefore, when current Iselect is caused to flow in the magneto-resistive element 20 in a write operation, the piezoelectric effect film 74 is distorted. Under the influence of the distortion, the direction of spin in the free layer 37 rotates in such a manner that it deviates from the easy-axis direction because of the adverse effect of magnetostriction. As a result, the write threshold magnetic field decreases. That is, because of not only Joule heat but also the adverse effect of magnetostriction, the write threshold magnetic field decreases. As a result, a write operation with a much smaller write current Iwrite is possible.

Stopping the supply of current Iselect to the selected memory cell causes the temperature of the selected memory cell to drop, which alleviates the distortion developing in the free layer. Therefore, the write threshold magnetic field increases again (or returns to the original), which prevents erroneous writing.

The ninth embodiment may be combined with the seventh or eighth embodiment. That is, the thermal expansion coefficient of the free layer may be distributed as explained in the seventh or eighth embodiment and further a piezoelectric effect film may be formed on the free layer.

Next, a semiconductor memory device according to a tenth embodiment of the present invention will be explained by reference to FIG. 47. The tenth embodiment is such that the connection between the bit line driver and the bit lines is contrived in the MRAM explained in the first or second embodiment. FIG. 47 is a block diagram of an MRAM according to the tenth embodiment.

As shown in FIG. 47, the configuration of the MRAM according to the tenth embodiment is such that the column decoder 12 is divided into two column decoders 160, 170, the sense amplifier 13 is divided into two sense amplifiers 180, 190, and the bit line driver 14 is divided into two bit line drivers 200, 210 in FIG. 1. One set of the column decoder 160, sense amplifier 180, and bit line driver 200 is provided so as to face another set of the column decoder 170, sense amplifier 190, and bit line driver 210, with the memory cell array 11 between these two sets.

The bit line driver 200 supplies current to bit lines BL0, BL2, BL4, ..., BL(n−1) in even-numbered columns on the basis of a column address decode signal obtained at the column decoder 160. The sense amplifier 180 amplifies the data read onto the bit lines BL0, BL2, BL4, ..., BL(n−1) in the even-numbered columns.

The bit line driver 210 supplies current to bit lines BL1, BL3, BL5, ..., BLn in odd-numbered columns on the basis of a column address decode signal obtained at the column decoder 170. The sense amplifier 190 amplifies the data read onto the bit lines BL1, BL3, BL5, ..., BLn in the odd-numbered columns.

The MRAM with the above configuration further produces the effect in item (13) below.

(13) The cell area of the MRAM can be made smaller. Specifically, with the configuration of the tenth embodiment, one set of a bit line driver and a sense amplifier and the other set of a bit line driver and a sense amplifier are provided to the top and the bottom of the memory cell array in such a manner that one set is for the bit lines in the even-numbered columns and the other set is for the bit lines in the odd-numbered columns. When the memory cell array cannot be made smaller because the width of the bit line driver and that of the sense amplifier are great, bit line drivers and sense amplifiers are provided in a distributed manner as in the tenth embodiment, which makes the memory cell array smaller. As a result, the area occupied by the MRAM can be reduced and therefore a high-density MRAM is realized.

FIG. 48 is a block diagram of an MRAM according to a first modification of the tenth embodiment. This modification is such that the tenth embodiment is applied-to the MRAM explained in the third embodiment. As shown in FIG. 48, the first modification is applicable to a case where the MRAM has cross-point memory cells.

Figure 49:
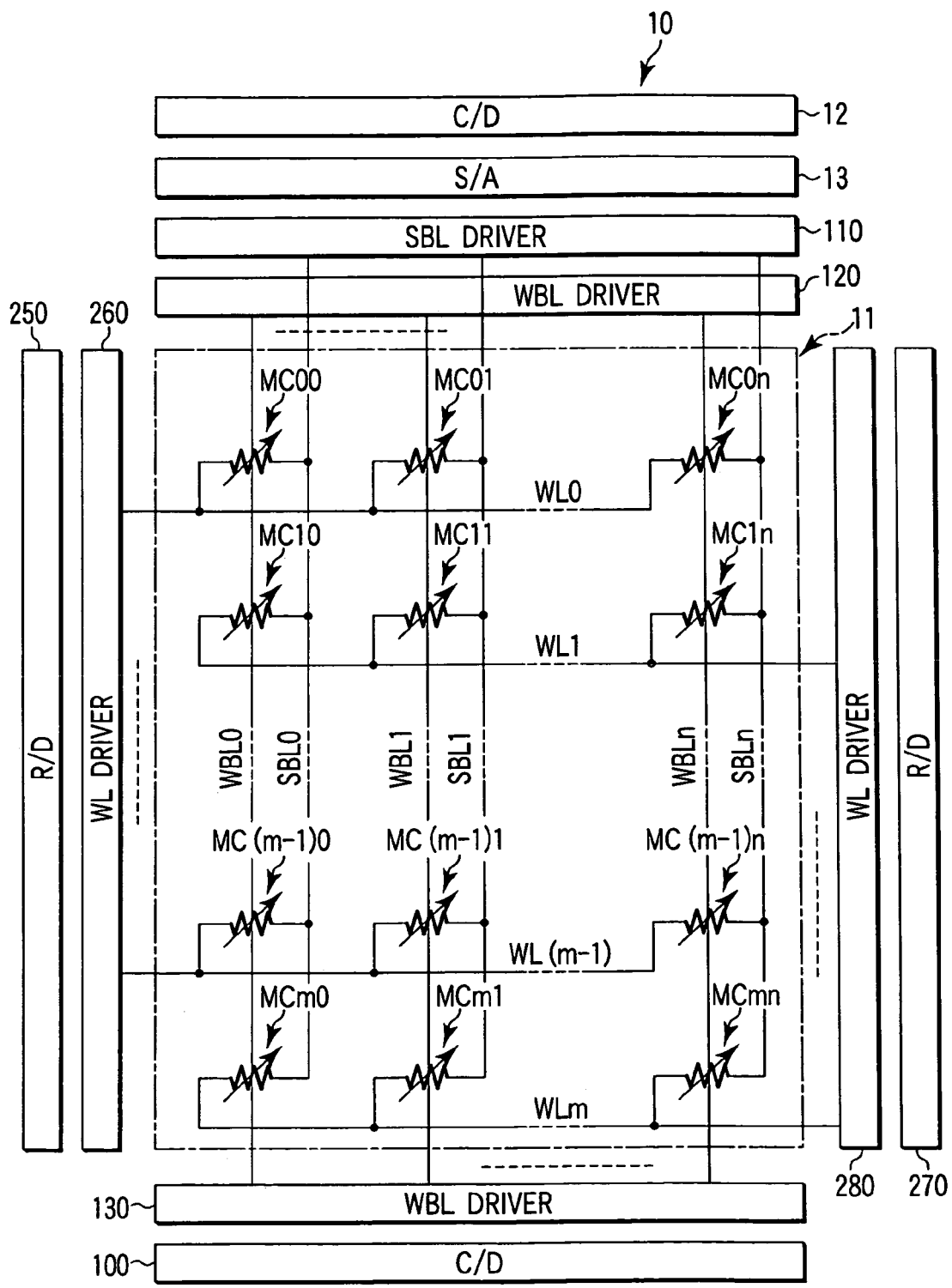
FIG. 49 is a block diagram of an MRAM according to a second modification of the tenth embodiment.

FIG. 49 is a block diagram of an MRAM according to a second modification of the tenth embodiment. This modification is such that the tenth embodiment is applied to the MRAM explained in the fourth embodiment. As shown in FIG. 49, the configuration of the MRAM according to the second modification is such that the row decoder 140 is divided into two row decoders 250, 270 and the word line driver 150 is divided into two word line drivers 260, 280 in FIG. 24. One set of the row decoder 250 and word line driver 260 is provided so as to face another set of the row decoder 270 and word line driver 280, with the memory cell array 11 between these two sets.

The word line driver 260 supplies current to word lines WL0, WL2, WL4, . . . , WL(m−1) in even-numbered rows on the basis of a row address decode signal obtained at the row decoder 250. The word line driver 280 supplies current to word lines WL1, WL3, WL5, . . . , WLm in odd-numbered rows on the basis of a row address decode signal obtained at the row decoder 270.

The second modification also produces the effect in item (13). Specifically, with the configuration of the second modification, one word line driver and the other word line driver are provided to the top and the bottom of the memory cell array in such a manner that one word line driver is for the word lines in the even-numbered rows and the other word line driver is for the word lines in the odd-numbered rows. When the memory cell array cannot be made smaller because the width of the word line driver is great, word line drivers are provided in a distributed manner as in this configuration, which makes the memory cell array smaller. As a result, the area occupied by the MRAM can be reduced and therefore a high-density MRAM is realized.

While the tenth embodiment and its modifications have been explained using the first to fourth embodiment as examples, they are, of course, applicable to the configurations explained in the fifth to ninth embodiments.

Figure 50:
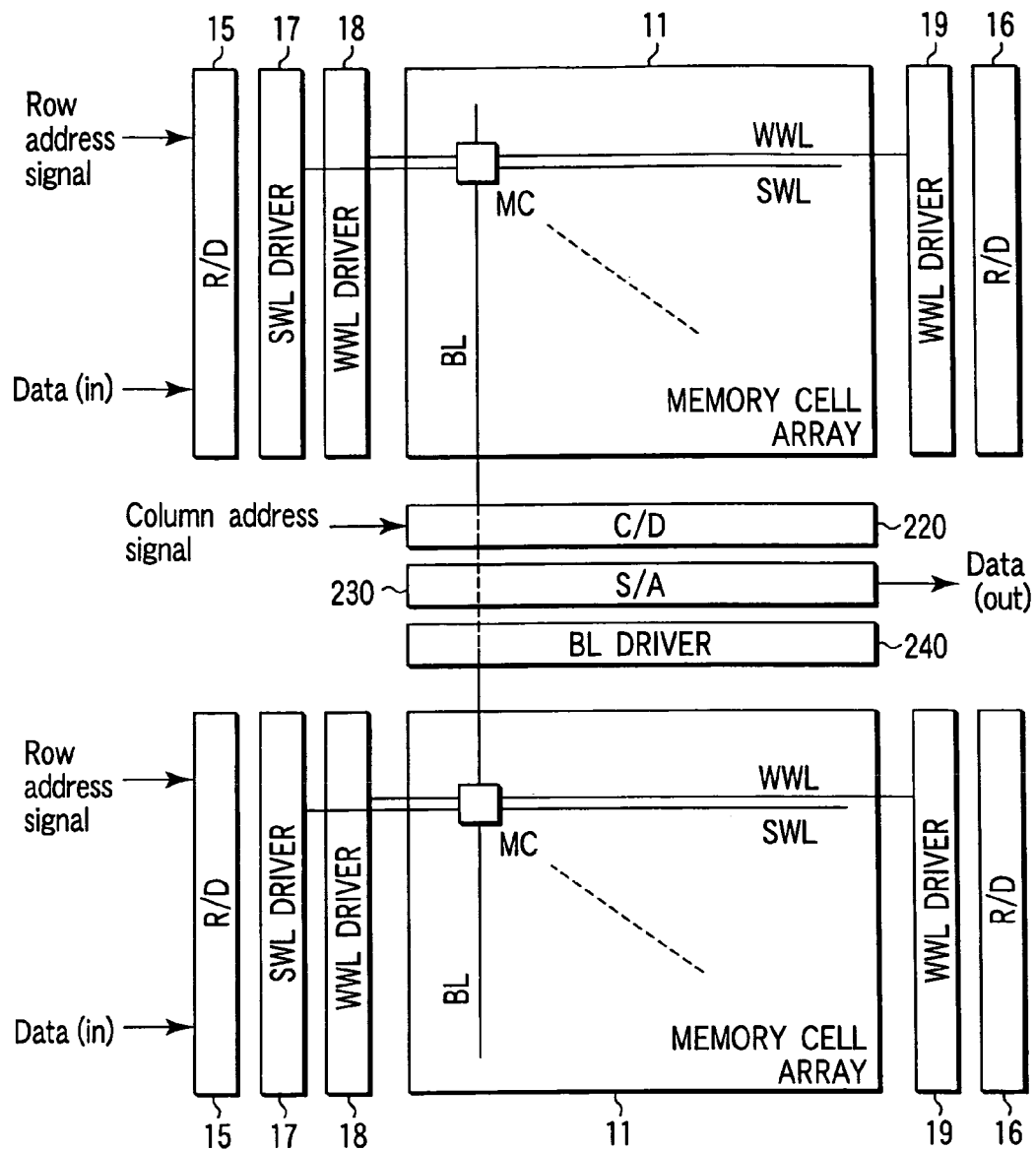
FIG. 50 is a block diagram of an MRAM according to an eleventh embodiment of the present invention.

Next, a semiconductor memory device according to an eleventh embodiment of the present invention will be explained by reference to FIG. 50. The eleventh embodiment is such that the column decoder, sense amplifier, bit line driver, and others are shared by a plurality of memory cell arrays in the MRAM explained in each of the first to third embodiments. FIG. 50 is a block diagram of an MRAM according to the eleventh embodiment.

As shown in FIG. 50, there are provided two memory cell arrays 11, 11 adjacent to each other along the bit line. A column decoder 220, a sense amplifier 230, and a bit line driver 240 are provided between the two adjacent memory cell arrays 11, 11. The bit line driver 240 supplies current to the bit lines of one of (or both of) the memory cell arrays on the basis of a column address decode signal obtained at the column decoder 220. The sense amplifier 230 amplifies the data read onto the bit lines of one of the two memory cell arrays 11 on the basis of a column address decode signal obtained at the column decoder 220.

The MRAM with the above configuration:produces the effect in item (14) below.

(14) The reading accuracy can be improved. Specifically, with the configuration of the eleventh embodiment, the column decoder, sense amplifier, and bit line driver are provided between the adjacent memory cell arrays and are shared by the two memory cell arrays. As compared with the configurations of FIG. 1 and FIG. 17 explained in the first to third embodiments, the distances from the bit line driver and sense amplifier to the memory cells are shorter than in a case where the size of the memory cell array 11 is simply doubled in the bit-line direction in the first to third embodiments. Thus, since the influence of a drop in the potential due to the bit line wiring resistance becomes smaller, the data reading accuracy can be improved. The two memory cell arrays share the sense amplifier and bit line driver, which reduces the area occupied by the sense amplifier and bit line driver. As a result, it is possible to realize a highly reliable, inexpensive MRAM.

Figure 51:
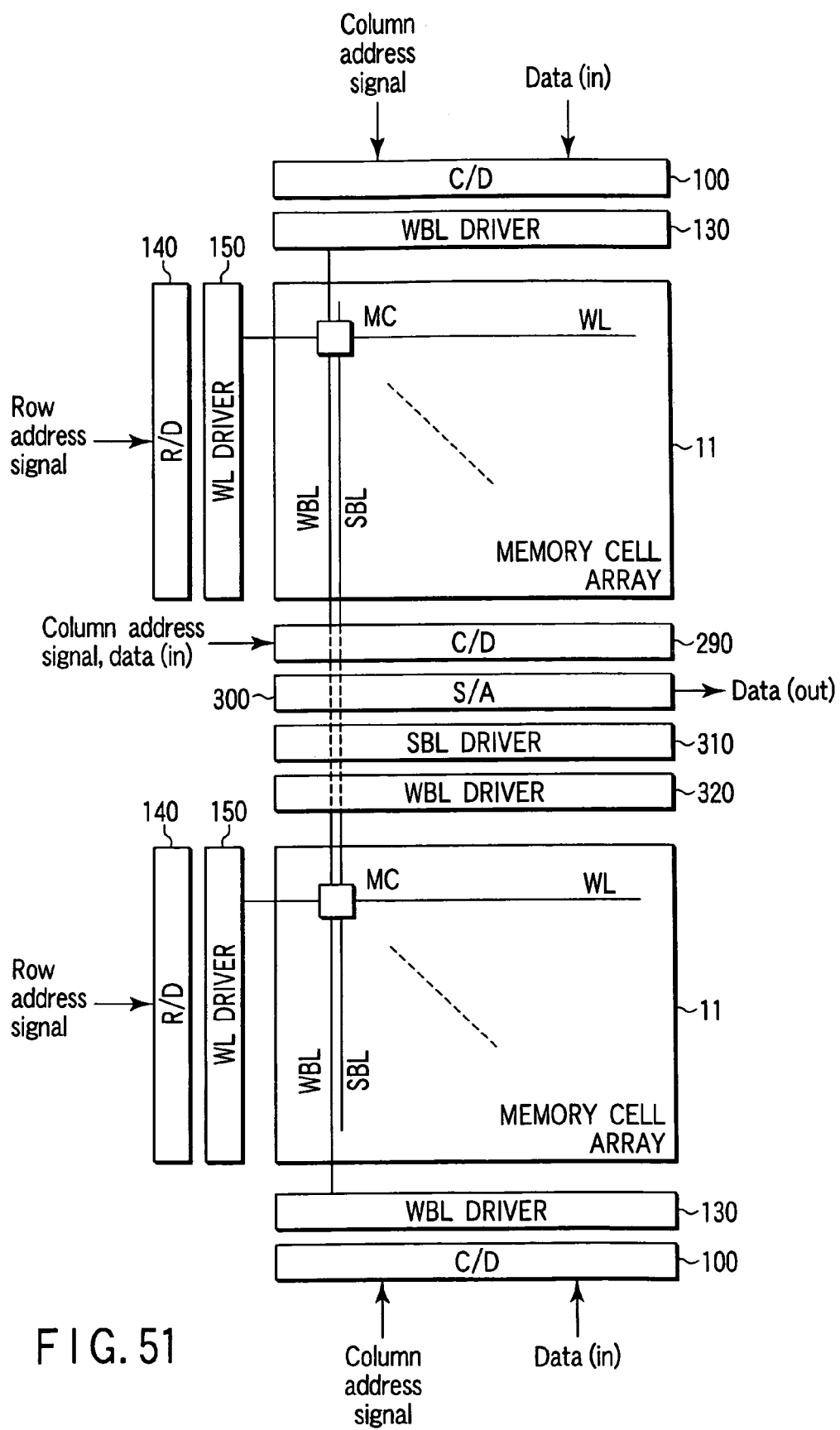
FIG. 51 is a block diagram of an MRAM according to a modification of the eleventh embodiment.

FIG. 51 is a block diagram of an MRAM according to a modification of the eleventh embodiment. This modification is such that the eleventh embodiment is applied to the configuration of FIG. 24 explained in the fourth embodiment. As shown in FIG. 51, a column decoder 290, a sense amplifier 300, a select bit line driver 310, and a write bit line driver 320 are provided between two memory cell arrays 11, 11 adjacent to each other in the bit-line direction. They are shared by the two memory cell arrays 11, 11. Specifically, the select bit line driver 310 supplies current to the select bit lines SBL of one of (or both of) the memory cell arrays 11 on the basis of a column address decode signal obtained at the column decoder 290. The write bit line driver(320 supplies current to the write bit lines WBL of one of (or both of) the memory cell arrays 11 on the basis of the column address decode signal. The sense amplifier 300 amplifies the data read onto the bit lines SBL of one of the two memory cell arrays 11 on the basis of the column address decode signal.

The above configuration also produces the effect in item (13). Although the eleventh embodiment and its modification have been explained using the first to fourth embodiments as examples, it goes without saying that they are applicable to the configurations explained in the fifth to ninth embodiments. Furthermore, the eleventh embodiment may be combined with the tenth embodiment.

As described above, with the MRAMs according to the first to eleventh embodiments, current Iselect is supplied from one ferromagnetic film to the other ferromagnetic film in a write operation in such a manner that it passes through a tunnel barrier film, in a magneto-resistive element having the tunnel barrier film sandwiched between the two ferromagnetic films. As a result, the magneto-resistive element included in the selected memory cell is heated to high temperature, leading to a decrease in the write threshold value. Accordingly, a magnetic field produced by a single wiring line enables data to be written. At that time, since the write threshold value of the magneto-resistive element has decreased as a result of the magneto-resistive element being heated to high temperature, the necessary write current has only to be much lower than in the prior art. As a result, the current driver circuit can be made smaller in size. Furthermore, in a write operation, only the magneto-resistive element of the selected memory cell is heated to high temperature, whereas the magneto-resistive elements of the unselected memory cells are not heated to high temperature. That is, only the selected memory cell has its write threshold value decreased. Accordingly, the occurrence of erroneous writing can be prevented effectively and the reliability of the writing operation in the MRAM can be improved.

Furthermore, with the MRAMs according to the first to eleventh embodiments, the following effect is obtained as compared with GMR elements using FeMn as free layers explained in the prior art. In GMR elements explained in the prior art, FeNm, an antiferromagnetic film, is heated to the Neel temperature or higher, which causes an antiferromagnetic-ferromagnetic transition. In addition, the direction of spin in FeMn is reversed by the magnetic field produced by the two axes of the sense line and word line. In the document described in the prior art, the current flowing in the sense line is about 5 mA, and the current flowing in the word line is about 200 mA. The current values are very large. When MRAMs are miniaturized further, it become difficult to control the shape of the free layer of an MTJ element. Therefore, from the viewpoint of the management of manufacturing processes, it is practical to manage, for example, only the length in the minor axis direction. It is necessary to allow to some extent variations in the length in the major axis direction. In this case, the magnetic field in the easy-axis direction is controlled well, whereas the characteristics in the hard-axis direction are very difficult to control. Specifically, it is difficult to secure a margin for operation in carrying out a write operation by the magnetic field produced by the two axes of the word line and bit line. However, in the first to eleventh embodiments, MTJ elements are used in memory cells and tunnel current is caused to flow in the direction perpendicular to the tunnel barrier film, thereby heating the MTJ elements. The current does not produce an effective magnetic field for the free layer. Specifically, writing is done with the magnetic field produced by a single wiring line, which realizes a write operation with a completely single-axis magnetic field. Then, the MTJ element is heated by tunnel current much smaller in amount than the current flowing in the sense line when the GMR element is used. Accordingly, when further miniaturization has been realized, a margin for operation in a write operation can be secured sufficiently, which improves the operating reliability of MRAMs.

To prevent the unselected memory cells from being brought into the half-selected state due to the magnetic field produced by current Iselect, it is desirable that current Iselect should be about ⅓ of write current Iwrite.

Furthermore, when an MTJ element is used as a magneto-resistive element, its resistance value is about 10 KΩ, a higher resistance than in a case where a GMR (Giant Magneto-resistive) element or the like is used. The heat release value is expressed as (resistance value)×(current value)$^2$. Thus, using an MTJ element as magneto-resistive element causes the magneto-resistive element to generate heat efficiently, thereby reducing current Iseltct remarkably.

Figure 52:
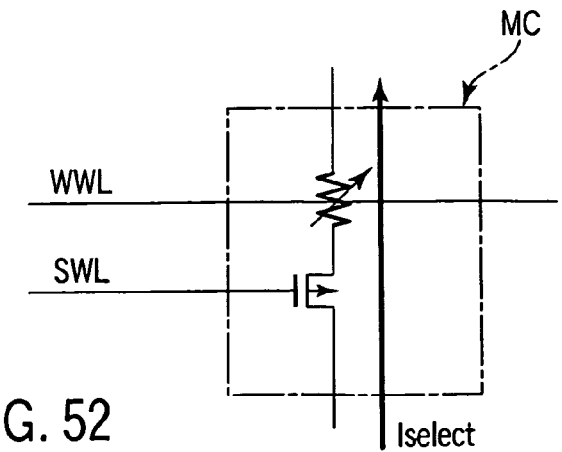
FIG. 52 is a circuit diagram of a memory cell in an MRAM according to a modification of the first to eleventh embodiments.

Furthermore, because of circuit architecture, the circuit area may be made smaller by reversing the direction of current Iselect and the direction of read current Iread in the above embodiment. In this case, the select transistors included in the memory cells are replaced with p-channel MOS transistors as shown in FIG. 52. With this configuration, even when current Iselect and read current Iread are reversed, the substrate bias effect is suppressed, which provides an MRAM which assures stable read and write operations.

When current Iselect becomes almost equal to write current Iwrite because of materials or architecture, it is effective that the distance between the wiring line supplying Iselect and the free layer is made larger than the distance between the wiring line supplying Iwrite to produce a magnetic field and the free layer. Since the magnitude of the magnetic field produced from the wiring line is approximately in inverse proportion to the distance, it is desirable that the former should be made three times or more as large as the latter.

Furthermore, in the first to fourth embodiments, after the supply of current Iselect, write current Iwrite has been supplied. However, with write current Iwrite being supplied, current Iselect may be supplied. In this case, with a magnetic field lower than the write threshold value at room temperature being applied, the selected memory cell is heated to high temperature, which enables writing to be done with a lower write threshold value. In this case, too, it is desirable that the temperature of the magneto-resistive element should be lowered before the application of the magnetic field is stopped.

As for the direction of current Iselect, when electrons passing through the tunnel barrier film flow from the pinning layer toward the free layer, the write threshold value reverse effectively. In other words, it is desirable that, of the two ferromagnetic films provided with a tunnel barrier film between these films, the free layer should be set at a higher potential and current Iselect be supplied. Specifically, the electrons tunneled through the tunnel barrier film collide with the free layer, losing their energy. As a result, the free layer is considered to be heated. When the withdrawing wiring layer is formed so as to contact either the free layer or the pinning layer as in the embodiments excluding the sixth embodiment, it is desirable that the side in contact with the withdrawing wiring layer should be set to a higher potential.

While in the first to eleventh embodiments and the modifications, the memory cells have used MTJ elements as magneto-resistive elements, they may use, for example, GMR elements or CMR (Colossal Magneto-resistive) elements.

In the magnetic random access memories (semiconductor memory devices) related to the first to eleventh embodiments, various applications are possible. Some of the applications are shown in FIGS. 53 to 59.

(Application 1)

As an example, FIG. 53 shows the DSL data path part of a digital subscriber's line (DSL) modem. The modem includes a programmable digital signal processor (DSP) 400, an analog-digital converter 410, a digital-analog converter 420, filters 430, 440, a transmitting driver 450, and a receiver amplifier 460. In FIG. 53, a band-pass filter is omitted. Instead, a magnetic random access memory 470 according to the first to eleventh embodiments and an EEPROM 480 are shown as various types of optional memories capable of holding channel code programs.

In the first application, two types of memories, a magnetic random access memory and an EEPROM, are used as memories for holding channel code programs. The EEPROM may be replaced with a magnetic random access memory. Moreover, only a magnetic random access memory may be used instead of using two types of memories.

(Application 2)

Figure 54:
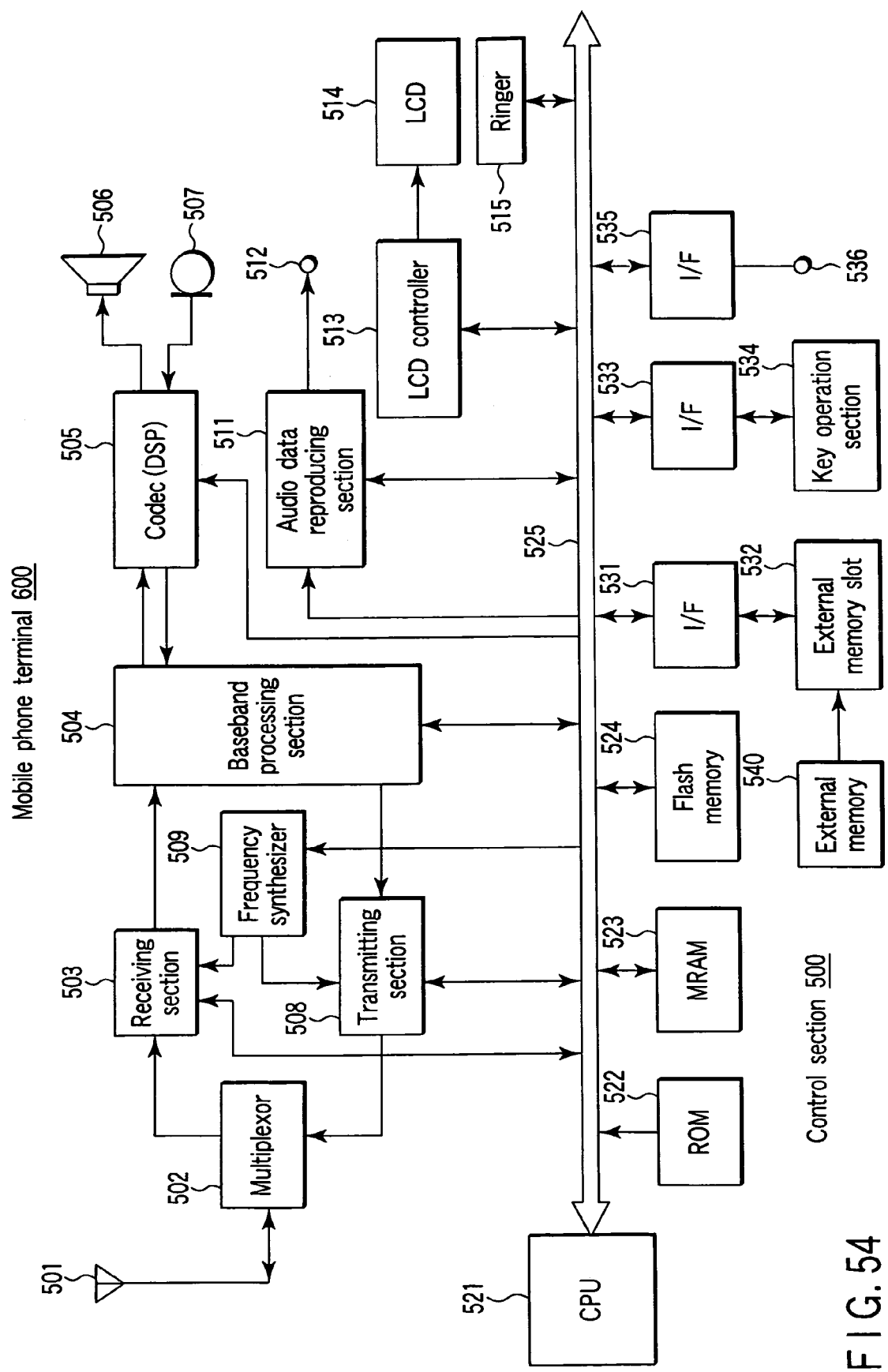
FIG. 54 is a block diagram of a mobile phone terminal provided with an MRAM according to the first to eleventh embodiments.

As another example, FIG. 54 shows the part realizing a communication function in a mobile phone terminal. As shown in FIG. 54, the part realizing the communication function includes a transmission/reception antenna 501, an antenna multiplexor 502, a receiving section 503, a baseband processing section 504, a DSP (Digital Signal Processor) 505 used as an audio codec, a speaker (receiver) 506, a microphone (speaker) 507, a transmitting section 508, a frequency synthesizer 509.

As shown in FIG. 54, a mobile phone terminal 600 is provided with a control section 500 for controlling each section in the mobile phone terminal. The control section 500 is a microcomputer constructed by connecting a CPU 521, a ROM 522, a magnetic random access memory (MRAM) 523 according to the first to eleventh embodiments, and a flash memory 524 via a CPU bus 525.

The ROM 522 stores beforehand the programs executed on the CPU 521 and the necessary data, including display fonts. The MRAM 523 is used mainly as a working area. When the CPU 521 executes a program, the MRAM 523 stores the data during calculations as needed. In addition, the MRAM 523 temporarily stores the data to be exchanged between the control section 500 and each section. In a method of storing, for example, the setting conditions immediately before the power supply of the mobile phone terminal 600 is turned off and using the stored setting conditions when the power supply is turned on again, the flash memory 524 stores the setting parameters. That is, the flash memory 524 is a nonvolatile memory capable of preventing the stored data from being lost even when the power supply of the mobile phone terminal is turned off.

While in the second application, the ROM 522, MRAM 523, and flash memory 524 have been used, the flash memory 524 may be replaced with a magnetic random access memory according to the first to eleventh embodiments. Moreover, the ROM 522 may also be replaced with a magnetic random access memory according to the first to eleventh embodiments.

(Application 3)

FIGS. 55 to 59 show an example of applying a magnetic random access memory according to the first to eleventh embodiments to a card (MRAM card) for holding a media content, such as a smart media.

In FIG. 55, an MRAM card 700 includes an MRAM chip 701, an opening section 702, a shutter 703, and an external terminal 704. The MRAM chip 701 is housed in the card body 700 and exposed to the outside at the opening section 702. When the user is carrying the MRAM card with him or her, the MRAM chip 701 is covered with the shutter 703. The shutter 703 is made of a material capable of shielding the chip from an external magnetic field, such as ceramic. To transfer the data, the shutter 703 is released and then the MRAM chip 701 is exposed. The external terminal 704 is for reading the content data stored in the MRAM into an external circuit.

FIGS. 56 and 57 show a transfer unit for transferring the data to the MRAM card. FIGS. 56 and 57 are a top view and a sectional view of a card-insert transfer unit, respectively. A second MRAM card 750 to be used by the end user is inserted into an insert section 810 of the transfer unit 300 until it is stopped at a stopper 820. The stopper 820 is also used as a member for aligning the positions of the first MRAM 850 and the second RAM card. At the same time when the second MRAM card 750 is placed in a specific position, the data stored in the first MRAM is transferred to the second MRAM card.

Figure 58:
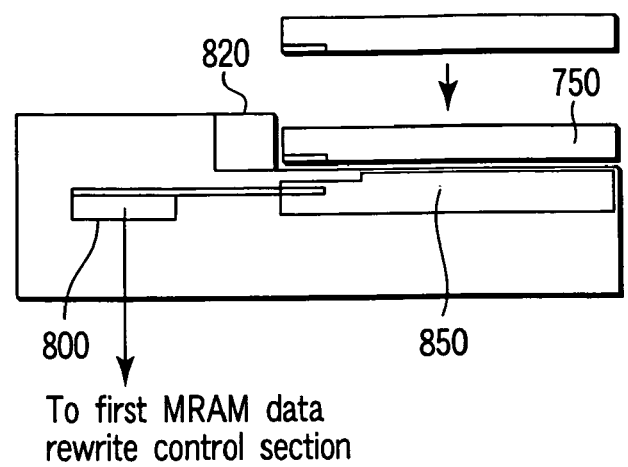
FIG. 58 is a sectional view of a transfer unit for transferring the data in a card provided with an MRAM according to the first to eleventh embodiments.

FIG. 58 shows a fitting transfer unit. In this unit, the second MRAM card is fitted on the first MRAM as shown by the arrow, using the stopper 820 as a target. Since the transferring method is the same as that of the card-insert type, explanation will be omitted.

Figure 59:
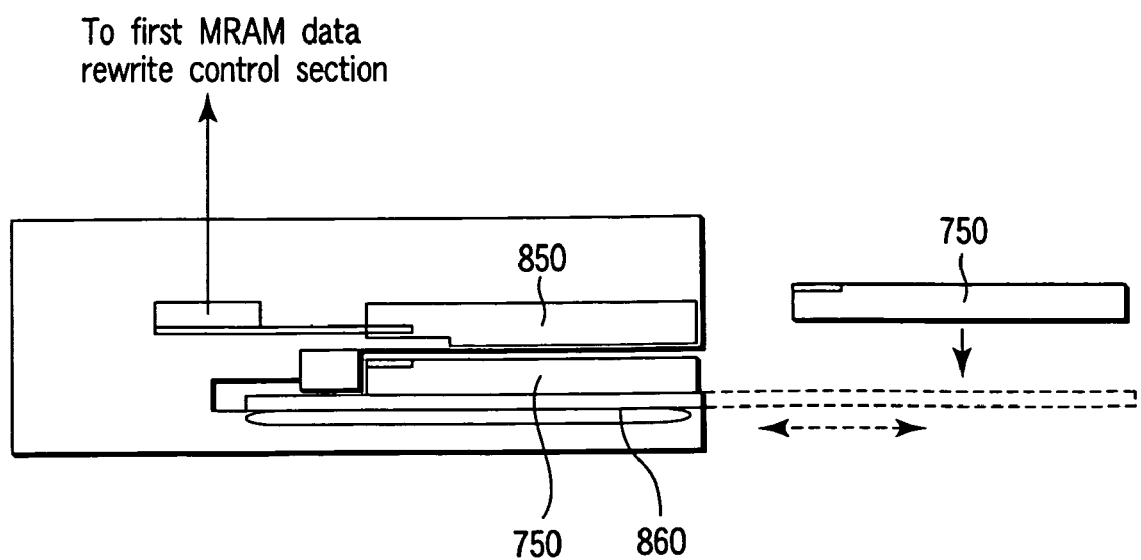
FIG. 59 is a sectional view of a transfer unit for transferring the data in a card provided with an MRAM according to the first to eleventh embodiments.

FIG. 59 is a sliding transfer unit. The transfer unit 800 is provided with a tray slide 860 as in a CD-ROM drive or a DVD drive. The tray slide 860 moves as shown by the arrow. When the tray slide 860 moves into the state shown by the dotted lines, the second MRAM card 750 is placed on the tray slide 860. Then, the second MRAM card is conveyed to the inside of the transfer unit 800. Since the leading edge of the second MRAM card is conveyed so as to press against the stopper 820 and transferring is done in the same manner as in the card-insert type, explanation will be omitted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising: memory cells each of which includes a magneto-resistive element having a first ferromagnetic film, an insulating film formed on the first ferromagnetic film, and a second ferromagnetic film formed on the insulating film; first wirings each of which is provided in close proximity to and insulated from the magneto-resistive element; a first current driver circuit which supplies a first current to the first wiring in a write operation to produce a magnetic field around the magneto-resistive elements; and a second current driver circuit which supplies a second current between the first and second ferro-magnetic films via the insulating film in a write and a read operation:

wherein one of the first and second ferro-magnetic films which functions as a free layer has its thermal expansion coefficient varied so as to decrease from the interface with the insulating film along the film thickness.

2. The semiconductor memory device according to claim 1, wherein the free layer is formed of an alloy which includes Ni and Fe and has its Ni content varied so as to decrease from the interface with the insulating film along the film thickness.

3. The semiconductor memory device according to claim 1, further comprising a piezoelectric effect film formed so as to face the insulating film, with one of the first and second ferromagnetic films which functions as a free layer between the piezoelectric effect film and the insulating film.

* * * * *